(12) United States Patent
Kuromitsu et al.

(10) Patent No.: US 8,921,996 B2
(45) Date of Patent: Dec. 30, 2014

(54) POWER MODULE SUBSTRATE, POWER MODULE, AND METHOD FOR MANUFACTURING POWER MODULE SUBSTRATE

(71) Applicant: Mitsubishi Materials Corporation, Tokyo (JP)

(72) Inventors: Yoshirou Kuromitsu, Saitama (JP); Yoshiyuki Nagatomo, Saitama (JP); Takeshi Kitahara, Gotenba (JP); Hiroshi Tonomura, Naka-gun (JP); Kazuhiro Akiyama, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 14/027,601

(22) Filed: Sep. 16, 2013

(65) Prior Publication Data

US 2014/0015140 A1  Jan. 16, 2014

Related U.S. Application Data

(62) Division of application No. 12/737,042, filed as application No. PCT/JP2009/060392 on Jun. 5, 2009, now Pat. No. 8,564,118.

(30) Foreign Application Priority Data

Jun. 6, 2008 (JP) ................... 2008-149902
Mar. 17, 2009 (JP) ................... 2009-065033
Mar. 26, 2009 (JP) ................... 2009-075315
Mar. 31, 2009 (JP) ................... 2009-086247
Mar. 31, 2009 (JP) ................... 2009-086248

(51) Int. Cl.
  *H01L 23/00* (2006.01)
  *H01L 23/498* (2006.01)
  *H01L 21/768* (2006.01)
  *H01L 23/373* (2006.01)

(52) U.S. Cl.
  CPC . *H01L 21/76838* (2013.01); *H01L 2924/01322* (2013.01); *H01L 23/498* (2013.01); *H01L 24/32* (2013.01); *H01L 2224/32225* (2013.01); *H01L 23/3735* (2013.01); *H01L 24/29* (2013.01); *H01L 2224/29111* (2013.01)
  USPC .................. 257/703; 257/E23.109; 257/762; 438/125

(58) Field of Classification Search
  CPC .......... H01L 2924/01079; H01L 2224/48091; H01L 2924/01078
  USPC .......... 257/E23.109, 703, 700, 713, 723, 779, 257/781, 789, 762; 156/151, 280; 438/118, 438/125, 622, 650, 652, 686; 428/210, 620, 428/627; 174/137 B, 255, 260; 29/825
  See application file for complete search history.

(56) References Cited

U.S. PATENT DOCUMENTS 5,672,848 A    9/1997  Komorita et al.
6,086,990 A *  7/2000  Sumino et al. ................ 428/336

(Continued)

FOREIGN PATENT DOCUMENTS

EP    1737034 A1    12/2006
JP    59-174581 A   10/1984

(Continued)

OTHER PUBLICATIONS

International Search Report for PCT/JP 2009/060392 issued Sep. 8, 2009.

(Continued)

*Primary Examiner* — Chris Chu
(74) *Attorney, Agent, or Firm* — Edwards Wildman Palmer LLP

(57) ABSTRACT

A power module substrate includes: a ceramics substrate having a surface; and a metal plate connected to the surface of the ceramics substrate, composed of aluminum, and including Cu at a joint interface between the ceramics substrate and the metal plate, wherein a Cu concentration at the joint interface is in the range of 0.05 to 5 wt %.

20 Claims, 33 Drawing Sheets

(56) References Cited

U.S. PATENT DOCUMENTS

| | | | |
|---|---|---|---|
| 6,159,772 | A | 12/2000 | Vinciarelli et al. |
| 6,232,657 | B1 | 5/2001 | Komorita et al. |
| 6,261,703 | B1 * | 7/2001 | Sasaki et al. ............... 428/627 |
| 6,309,737 | B1 * | 10/2001 | Hirashima et al. ............ 428/210 |
| 6,434,008 | B1 | 8/2002 | Yamada et al. |
| 6,569,514 | B2 * | 5/2003 | Naba et al. ................... 428/210 |
| 6,583,505 | B2 | 6/2003 | Choi |
| 6,846,765 | B2 * | 1/2005 | Imamura et al. ............. 501/97.2 |
| 7,031,166 | B2 * | 4/2006 | Imamura et al. ............. 361/750 |
| 7,141,741 | B2 | 11/2006 | Yamada et al. |
| 7,879,455 | B2 | 2/2011 | Kajiwara et al. |
| 7,915,533 | B2 | 3/2011 | Kaga et al. |
| 8,004,075 | B2 * | 8/2011 | Soga et al. ................... 257/687 |
| 8,125,090 | B2 | 2/2012 | Soga et al. |
| 8,273,993 | B2 * | 9/2012 | Kato et al. ................... 174/260 |
| 2005/0214518 | A1 * | 9/2005 | Nagase et al. ................ 428/210 |
| 2011/0074010 | A1 * | 3/2011 | Kuromitsu et al. .......... 257/703 |

FOREIGN PATENT DOCUMENTS

| | | |
|---|---|---|
| JP | 03-234045 A | 10/1991 |
| JP | 8-255973 A | 10/1996 |
| JP | 09-036277 A | 2/1997 |
| JP | 2001-010874 A | 1/2001 |
| JP | 2001-085808 A | 3/2001 |
| JP | 2001-160676 A | 6/2001 |
| JP | 2004-356502 A | 12/2004 |
| JP | 2008-135511 A | 6/2008 |
| JP | 2008-147309 A | 6/2008 |

OTHER PUBLICATIONS

Office Action dated Mar. 13, 2013, issued for the Chinese Patent Application No. 200980120627.8 and English translation thereof.
Office Action dated May 7, 2013, issued in Japanese Application No. 2010-055963 and English translation.
Notice of Allowance mailed Aug. 6, 2013, issued for the Japanese patent application No. 2010-055962 and English translation thereof.
Notice of Allowance mailed Aug. 6, 2013, issued for the Japanese patent application No. 2010-055963 and English translation thereof.
Office Action mailed Aug. 20, 2013, issued for the Japanese patent application No. 2009-065033 and English translation thereof.
Office Action dated Apr. 9, 2012, issued for U.S. Appl. No. 12/737,042.
Supplementary European Search Report dated Oct. 28, 2014, issued for the European patent application No. 09758435.3.

* cited by examiner

Cu WAS ADHERED TO CERAMICS SUBSTRATE BY EVAPORATION METHOD

Cu WAS ADHERED TO METAL PLATE BY EVAPORATION METHOD

Cu WAS ADHERED TO CERAMICS SUBSTRATE BY EVAPORATION METHOD

Cu WAS ADHERED TO METAL PLATE BY EVAPORATION METHOD

Cu WAS ADHERED TO CERAMICS SUBSTRATE BY EVAPORATION METHOD

Cu WAS ADHERED TO METAL PLATE BY EVAPORATION METHOD

Cu WAS ADHERED TO CERAMICS SUBSTRATE BY EVAPORATION METHOD

Cu WAS ADHERED TO METAL PLATE BY EVAPORATION METHOD

POWER MODULE SUBSTRATE, POWER MODULE, AND METHOD FOR MANUFACTURING POWER MODULE SUBSTRATE

This application is a divisional application of U.S. application Ser. No. 12/737,042 filed Dec. 10, 2010 which claims the right of priority under 35 U.S.C. §119 based on Japanese Patent Application No. 2008-149902, 2009-065033, 2009-075315, 2009-086247 and 2009-086248 filed Jun. 6, 2008, Mar. 17, 2009, Mar. 26, 2009, Mar. 31, 2009 and Mar. 31, 2009.

BACKGROUND OF THE INVENTION

1. Field of the Invention

The present invention relates to a power module substrate, which is employed in a semiconductor device controlling a large amount of high voltage electrical current, a power module including the power module substrate, and a method for manufacturing the power module substrate.

This application is based on and claims priority from Japanese Patent Application No. 2008-149902, filed on Jun. 6, 2008, Japanese Patent Application No. 2009-065033, filed on Mar. 17, 2009, Japanese Patent Application No. 2009-075315, filed on Mar. 26, 2009, Japanese Patent Application No. 2009-086247, filed on Mar. 31, 2009, and Japanese Patent Application No. 2009-086248, filed on Mar. 31, 2009, the contents of which are incorporated herein by reference.

2. Background Art

Conventionally, in all of semiconductor elements, a power module is used for the power supply.

The amount of heat generated by the power module is relatively high.

Consequently, as a substrate on which the power module is mounted, a power module substrate is used in which a metal plate made of Al (aluminum) is joined to a ceramics substrate composed of, for example, AlN (aluminum nitride), $Si_3N_4$ (silicon nitride), or $Al_2O_3$ (aluminum oxide), with an Al—Si system brazing filler metal interposed therebetween.

In addition, the metal plate is formed as a circuit layer, and a semiconductor chip that is a power element is mounted on the metal plate with a solder material interposed therebetween.

In addition, in order to improve the heat radiation efficiency, a structure in which a metal layer is formed by connecting a metal plate composed of Al or the like with a lower face of a ceramics substrate, and the entire power module substrate is joined to a heat radiation plate with the metal layer interposed therebetween has been proposed.

Conventionally, in order to reliably obtain the joint strength between metal plates which serve as the circuit layer and the metal layer, and a ceramics substrate, for example, technique of having the surface roughness of the ceramics substrate being less than 0.5 µm has been known, as disclosed in Japanese Unexamined Patent Application, First Publication No. H3-234045.

However, when the metal plate is joined to the ceramics substrate, even if the roughness surface of the ceramics substrate is simply reduced, sufficient high joint strength is not obtained and there is a disadvantage in that the reliability thereof cannot be improved.

Even if, for example, a honing treatment is performed on the surface of the ceramics substrate by use of $Al_2O_3$ particles in a dry method and the roughness surface Ra thereof is made 0.2 µm, peeling may occur at an interface thereof in a peeling test.

In addition, even if a ceramics substrate is polished by use of a polishing method so that the roughness surface Ra is made less than or equal to 0.1 µm, there is a case where peeling occurs at the interface in the same manner as described above.

In addition, in a case where a power module substrate is subjected to a heat-load cycle, not only peeling at an interface but also cracks being generated in the ceramics substrate is known.

Specifically, recently, in power modules, downsizing and reducing of thickness has been required, and the usage environment has become severe.

The power module is used under a usage environment in which, for example, heat stress is repeatedly generated.

In addition, recently, the amount of heat generated in an electronic component has tended to increase, so it is necessary to dispose a power module substrate on a heat radiation plate as described above.

In this case, since the power module substrate is rigidly fixed to the heat radiation plate, a large shear force is generated at a joint interface between the metal plate and the ceramics substrate when the substrate is subjected to a heat-load cycle.

As a result, improvement of the joint strength and reliability are further required.

SUMMARY OF THE INVENTION

The present invention was conceived in view of the above-described circumstances and it is an object thereof to provide a power module substrate, a power module including the power module substrate, and a method for manufacturing the power module substrate, in which a metal plate is reliably connected to a ceramics substrate and the heat-load cycle reliability thereof is high.

In order to solve the foregoing problem and achieve the object, a power module substrate of a first aspect of the present invention includes: a ceramics substrate having a surface; and a metal plate connected to the surface of the ceramics substrate, composed of aluminum, and including Cu at a joint interface between the ceramics substrate and the metal plate, wherein a Cu concentration at the joint interface is in the range of 0.05 to 5 wt %.

In the power module substrate having the above-described structure, since Cu is diffused in the metal plate and Cu concentration in the joint interface is in the range of 0.05 to 5 wt %, the joint interface of the metal plate is solid-solution strengthened.

Therefore, when a heat-load cycle or the like is performed, cracks are prevented from being generated and propagated in the metal plate, it is possible to improve the junction reliability.

In the power module substrate of the first aspect of the present invention, it is preferable that an aluminum phase in which Cu is included in aluminum, and an eutectic phase composed of a binary eutectic structure including Al and Cu be formed at an end portion in a width direction of the metal plate.

In this case, since the eutectic phase composed of a binary eutectic structure including Al and Cu is formed at the end portion in the width direction of the metal plate, it is possible to further strengthen the end portion in the width direction of the metal plate.

Consequently, it is possible to prevent cracks from being generated and propagated at the end portion in the width direction of the metal plate, and it is possible to improve the junction reliability.

In the power module substrate of the first aspect of the present invention, it is preferable that precipitate particles composed of a compound including Cu precipitate in the eutectic phase.

In this case, since the precipitate particles composed of a compound including Cu precipitate in the eutectic phase formed at the end portion in the width direction of the metal plate, it is possible to further realize precipitation strengthening of the end portion in the width direction of the metal plate.

Consequently, it is possible to prevent cracks from being generated and propagated at the end portion in the width direction of the metal plate, and it is possible to reliably improve the junction reliability.

In the power module substrate of the first aspect of the present invention, it is preferable that the metal plate include: a concentration-gradient section in which the Cu concentration gradually decreases in a manner so as to separate from the joint interface in a direction in which the metal plate and the ceramics substrate are stacked in layers; and a soft layer formed at an opposite side of the ceramics substrate relative to the concentration-gradient section, having a degree of hardness lower than that of a near joint interface.

In this case, Cu concentration is high in the metal plate adjacent to the joint interface, and is hardened due to solid solution strengthening.

On the other hand, in the soft layer, Cu concentration is low, the degree of hardness is low, and the deformation resistance is low.

Therefore, due to the soft layer, it is possible to absorb heat strain (heat stress) which is caused by the difference of the coefficient of thermal expansion between the metal plate and the ceramics substrate, and it is possible to considerably improve the heat-load cycle reliability.

A power module of a second aspect of the present invention is provided with: the power module substrate of the above-described first aspect; and an electronic component mounted on the power module substrate.

According to the power module having the above-described structure, since the joint strength between the ceramics substrate and the metal plate is high, even if the power module is used under a severe usage environment in which, for example, heat stress is repeatedly generated, it is possible to significantly improve the reliability thereof.

A method for manufacturing a power module substrate of a third aspect of the present invention includes: preparing a ceramics substrate, a metal plate composed of aluminum, and a Cu-layer having a thickness of 0.15 μm to 3 μm; stacking the ceramics substrate and the metal plate in layers with the Cu-layer interposed therebetween (stacking step); pressing the ceramics substrate, the Cu-layer, and the metal plate which were stacked in layers in a stacked direction, and heating the ceramics substrate, the Cu-layer, and the metal plate; forming a fusion metal layer at a boundary face between the ceramics substrate and the metal plate (melting step); solidifying the fusion metal layer by cooling the fusion metal layer (solidifying step); and making Cu to be included into the metal plate adjacent to the joint interface between the ceramics substrate and the metal plate in the melting step and the solidifying step so that a Cu concentration is in the range of 0.05 to 5 wt %.

In the method for manufacturing a power module substrate, the ceramics substrate and the metal plate stacked in layers with the Cu-layer interposed therebetween, and the ceramics substrate and the metal plate which were stacked in layers is pressed in the stacked direction and heated.

Because of this, due to the eutectic reaction of Cu of the Cu-layer and Al of the metal plate, the melting point of the near joint interface is lowered, even under relatively low-temperature, it is possible to form the fusion metal layer at the boundary face between the ceramics substrate and the metal plate, and it is possible to connect the ceramics substrate to the metal plate.

Namely, without using a brazing filler metal composed of Al—Si alloy or the like, it is possible to connect the ceramics substrate to the metal plate.

As described above, since the ceramics substrate is bonded to the metal plate without using a brazing filler metal, a brazing filler metal does not penetrate to a surface of the circuit layer, and it is possible to reliably form a Ni-plated layer on the surface of the circuit layer.

Here, when the thickness of the Cu-layer is less than 0.15 μm, there is a concern that a fusion metal layer cannot be sufficiently formed at the boundary face between the ceramics substrate and the metal plate.

In addition, when the thickness of the Cu-layer exceeds 3 μm, reactant of Cu and Al is excessively generated at the joint interface, the near joint interface of the metal plate is strengthened more than necessary, and there is a concern that cracks are generated at the ceramics substrate when the ceramics substrate is subjected to a heat-load cycle.

Consequently, it is preferable that the thickness of the Cu-layer be 0.15 μm to 3 μm.

In addition, in order to reliably obtain the above-described action and effect, it is preferable that the thickness of the Cu-layer be 0.5 μm to 2.5 μm.

In the method for manufacturing a power module substrate of the third aspect of the present invention, it is preferable that the Cu-layer be adhered to at least one of the ceramics substrate and the metal plate before stacking the ceramics substrate, the Cu-layer, and the metal plate in layers.

In this case, since Cu is adhered to a face of the metal plate (connection face) facing the ceramics substrate or a face of the ceramics substrate (connection face) facing the metal plate, it is possible to stack the ceramics substrate and the metal plate in layers with the Cu-layer reliably interposed therebetween, and it is possible to reliably connect the ceramics substrate to the metal plate.

In the method for manufacturing a power module substrate of the third aspect of the present invention, it is preferable that, when the Cu is adhered to at least one of the ceramics substrate and the metal plate, Cu be adhered to at least one of the ceramics substrate and the metal plate, by a method selected from an evaporation method, a sputtering method, a plating method, and a method of applying a Cu-paste.

In this case, it is possible to form reliably the Cu-layer by a method selected from the evaporation method, the sputtering method, the plating method, and the method of applying a Cu-paste, and it is possible to connect the ceramics substrate to the metal plate.

In the method for manufacturing a power module substrate of the third aspect of the present invention, it is preferable that, when stacking the ceramics substrate and the metal plate in layers with the Cu-layer interposed therebetween, the Cu-layer be disposed by inserting a copper foil between the ceramics substrate and the metal plate.

In this case, due to inserting of Cu-foil, it is possible to form the Cu-layer on the face of the metal plate (connection face) facing the ceramics substrate or the face of the ceramics substrate (connection face) facing the metal plate.

Therefore, it is possible to tightly connect the ceramics substrate to the metal plate.

A power module substrate of a fourth aspect of the present invention includes: a ceramics substrate composed of AlN or $Si_3N_4$, having a surface; a metal plate connected to the surface of the ceramics substrate, composed of pure aluminum; and a high-Cu concentration section formed at a joint interface between the metal plate and the ceramics substrate, having a Cu concentration that is more than twice the Cu concentration in the metal plate.

In the power module substrate having the above-described structure, since the high-Cu concentration section having a Cu concentration that is more than twice the Cu concentration in the metal plate is formed at the joint interface between the ceramics substrate composed of AlN or $Si_3N_4$ and the metal plate composed of pure aluminum, it is possible to improve the joint strength between the ceramics substrate and the metal plate due to a Cu atom existing at the near boundary face.

In addition, Cu concentration in the metal plate means a Cu concentration in the portion that is positioned separately from the joint interface in the metal plate by a predetermined distance (for example, 50 nm or more).

In the power module substrate of the fourth aspect of the present invention, it is preferable that an oxygen concentration in the high-Cu concentration section be greater than oxygen concentrations in the metal plate and the ceramics substrate.

In this case, due to oxygen intervening the joint interface, it is possible to further improve the joint strength between the ceramics substrate composed of AlN or $Si_3N_4$ and the metal plate composed of pure aluminum.

In addition, it is thought that the oxygen existing at the joint interface with a high degree of concentration is oxygen existing at a surface of the ceramics substrate and oxygen taken from an oxide film formed on a surface of a metal plate.

Here, the oxygen existing at the joint interface with a high degree of concentration, this means the oxide film or the like being sufficiently heated so as to be reliably removed.

Therefore, it is possible to tightly connect the ceramics substrate to the metal plate.

In the power module substrate of the fourth aspect of the present invention, it is preferable that the ceramics substrate be composed of AlN; and the mass ratio of Al, Cu, O, and N be Al:Cu:O:N=50 to 90 wt %:1 to 10 wt %:2 to 20 wt %:25 wt % or less when the joint interface including the high-Cu concentration section is analyzed by an energy dispersive X-ray spectroscopy.

In the power module substrate of the fourth aspect of the present invention, it is preferable that the ceramics substrate be composed of $Si_3N_4$; and the mass ratio of Al, Si, Cu, O, and N be Al:Si:Cu:O:N=15 to 45 wt %:15 to 45 wt %:1 to 10 wt %:2 to 20 wt %:25 wt % or less when the joint interface including the high-Cu concentration section is analyzed by an energy dispersive X-ray spectroscopy.

When the mass ratio of Cu atom existing at the joint interface exceeds 10 wt %, the reactant of Cu and Al is excessively generated, there is a concern that the reactant interferes the junction.

In addition, the near joint interface of the metal plate is strengthened more than necessary due to the reactant, a stress operates in the ceramics substrate when the ceramics substrate is subjected to a heat-load cycle, and there is a concern that the ceramics substrate is cracked.

On the other hand, when the mass ratio of Cu atom is less than 1 wt %, there is a concern that it is impossible to sufficiently improve the joint strength due to a Cu atom.

Therefore, it is preferable that the mass ratio of Cu atom be in the range of 1 to 10 wt % at the joint interface.

In addition, when the mass ratio of oxygen atom including the high-Cu concentration section and existing at the joint interface exceeds 20 wt %, the thickness of portion in which the oxygen concentration is high increases, and cracks are generated at the high-concentration section when a heat-load cycle is performed.

Because of this, there is a concern that, junction reliability is degraded.

Therefore, it is preferable that the oxygen concentration be 2 to 20 wt %.

Here, when analyzation is performed by an energy dispersive X-ray spectroscopy, since the diameter of the spot therefor is extremely small, a plurality of points are measured on the joint interface (for example, 10 to 100 points), and the average of the points is calculated.

In addition, when the measuring is performed, the joint interface between the crystalline grain and the ceramics substrate is only measured, and the joint interface between the crystalline grain boundary of the metal plate and the ceramics substrate is not measured.

In addition, in this specification, analytical values are obtained by use of an energy dispersive X-ray spectroscopy under the condition where an acceleration voltage is set to 200 kV by use of an energy-dispersive X-ray fluorescence spectrometer, NORAN System 7 produced by Thermo Fisher Scientific Inc., the spectrometer being mounted on an electron microscope, JEM-2010F produced by JEOL Ltd.

A power module of a fifth aspect of the present invention is provided with: the power module substrate of the above-described fourth aspect; and an electronic component mounted on the power module substrate.

According to the power module having the above-described structure, the joint strength between the ceramics substrate and the metal plate is high, and even if the power module is used under a severe usage environment in which, for example, heat stress is repeatedly generated, it is possible to significantly improve the reliability thereof.

A method for manufacturing a power module substrate of a sixth aspect of the present invention includes: preparing a ceramics substrate composed of AlN, a metal plate composed of pure aluminum, and a Cu-layer having a thickness of 0.15 μm to 3 μm; stacking the ceramics substrate and the metal plate in layers with the Cu-layer interposed therebetween (stacking step); pressing the ceramics substrate, the Cu-layer, and the metal plate which were stacked in layers in a stacked direction, and heating the ceramics substrate, the Cu-layer, and the metal plate; forming a fusion aluminum layer at a boundary face between the ceramics substrate and the metal plate (melting step); solidifying the fusion aluminum layer by cooling the fusion aluminum layer (solidifying step); and forming a high-Cu concentration section at a joint interface between the ceramics substrate and the metal plate in the melting step and the solidifying step, the high-Cu concentration section having a Cu concentration that is more than twice the Cu concentration in the metal plate.

In the method for manufacturing a power module substrate, the ceramics substrate and the metal plate stacked in layers with the Cu-layer interposed therebetween, and the ceramics substrate and the metal plate which were stacked in layers is pressed in the stacked direction and heated.

Because of this, due to the eutectic reaction of Cu of the Cu-layer and Al of the metal plate, the melting point of the near joint interface is lowered, even under relatively low-temperature, it is possible to form the fusion aluminum layer at the boundary face between the ceramics substrate and the metal plate, and it is possible to connect the ceramics substrate to the metal plate.

Namely, without using a brazing filler metal composed of Al—Si alloy or the like, it is possible to connect the ceramics substrate to the metal plate.

In addition, when the thickness of the Cu-layer is less than 0.15 µm, there is a concern that a fusion aluminum layer cannot be sufficiently formed at the boundary face between the ceramics substrate and the metal plate.

In addition, when the thickness of the Cu-layer exceeds 3 µm, reactant of Cu and Al is excessively generated at the joint interface, the near joint interface of the metal plate is strengthened more than necessary, and there is a concern that cracks are generated at the ceramics substrate composed of AlN when the ceramics substrate is subjected to a heat-load cycle.

Consequently, in a case where the ceramics substrate is composed of AlN, it is preferable that the thickness of the Cu-layer be 0.15 µm to 3 µm.

A method for manufacturing a power module substrate of a seventh aspect of the present invention includes: preparing a ceramics substrate composed of $Si_3N_4$, a metal plate composed of pure aluminum, and a Cu-layer having a thickness of 0.15 µm to 3 µm; stacking the ceramics substrate and the metal plate in layers with the Cu-layer interposed therebetween (stacking step); pressing the ceramics substrate, the Cu-layer, and the metal plate which were stacked in layers in a stacked direction, and heating the ceramics substrate, the Cu-layer, and the metal plate; forming a fusion aluminum layer at a boundary face between the ceramics substrate and the metal plate (melting step); solidifying the fusion aluminum layer by cooling the fusion aluminum layer (solidifying step); and forming a high-Cu concentration section at a joint interface between the ceramics substrate and the metal plate in the melting step and the solidifying step, the high-Cu concentration section having a Cu concentration that is more than twice the Cu concentration in the metal plate.

In the method for manufacturing a power module substrate, the ceramics substrate and the metal plate stacked in layers with the Cu-layer interposed therebetween, and the ceramics substrate and the metal plate which were stacked in layers is pressed in the stacked direction and heated.

Because of this, due to the eutectic reaction of Cu of the Cu-layer and Al of the metal plate, the melting point of the near joint interface is lowered, even under relatively low-temperature, it is possible to form the fusion aluminum layer at the boundary face between the ceramics substrate and the metal plate, and it is possible to connect the ceramics substrate to the metal plate.

Namely, without using a brazing filler metal composed of Al—Si alloy or the like, it is possible to connect the ceramics substrate to the metal plate.

In addition, when the thickness of the Cu-layer is less than 0.15 µm, there is a concern that a fusion aluminum layer cannot be sufficiently formed at the boundary face between the ceramics substrate and the metal plate.

In addition, when the thickness of the Cu-layer exceeds 3 µm, the reactant of Cu and Al is excessively generated at the joint interface, there is a concern that the reactant interferes the junction.

Consequently, in a case where the ceramics substrate is composed of $Si_3N_4$, it is preferable that the thickness of the Cu-layer be 0.15 µm to 3 µm.

In the method for manufacturing a power module substrate of the sixth aspect or the seventh aspect of the present invention, it is preferable that, when stacking the ceramics substrate and the metal plate in layers with the Cu-layer interposed therebetween, the Cu-layer be disposed by inserting a copper foil between the ceramics substrate and the metal plate.

In the method for manufacturing a power module substrate of the sixth aspect or the seventh aspect of the present invention, it is preferable that the Cu-layer be adhered to at least one of the ceramics substrate and the metal plate before stacking the ceramics substrate, the Cu-layer, and the metal plate in layers.

In the method for manufacturing a power module substrate of the sixth aspect or the seventh aspect of the present invention, it is preferable that, when the Cu is adhered to at least one of the ceramics substrate and the metal plate, Cu be adhered to at least one of the ceramics substrate and the metal plate, by a method selected from an evaporation method, a sputtering method, a plating method, and a method of applying a Cu-paste.

According to the methods, between the ceramics substrate and the metal plate, it is possible to form a Cu-layer having a desired thickness, and it is possible to reliably connect the ceramics substrate to the metal plate.

A power module substrate of an eighth aspect of the present invention includes: a ceramics substrate composed of $Al_2O_3$, having a surface; a metal plate connected to the surface of the ceramics substrate, composed of pure aluminum; and a high-Cu concentration section formed at a joint interface between the metal plate and the ceramics substrate, having a Cu concentration that is more than twice the Cu concentration in the metal plate.

In the power module substrate having the above-described structure, since the high-Cu concentration section having a Cu concentration that is more than twice the Cu concentration in the metal plate is formed at the joint interface between the ceramics substrate composed of $Al_2O_3$ and the metal plate composed of pure aluminum, it is possible to improve the joint strength between the ceramics substrate and the metal plate due to a Cu atom existing at the near boundary face.

In addition, Cu concentration in the metal plate means a Cu concentration in the portion that is positioned separately from the joint interface in the metal plate by a predetermined distance (for example, 50 nm or more).

In the power module substrate of the eighth aspect of the present invention, it is preferable that the mass ratio of Al, Cu, and O be Al:Cu:O=50 to 90 wt %:1 to 10 wt %:0 to 45 wt % when the joint interface including the high-Cu concentration section is analyzed by an energy dispersive X-ray spectroscopy.

When the mass ratio of Cu atom existing at the joint interface exceeds 10 wt %, the reactant of Cu and Al is excessively generated, there is a concern that the reactant interferes the junction.

On the other hand, when the mass ratio of Cu atom is less than 1 wt %, there is a concern that it is impossible to sufficiently improve the joint strength due to a Cu atom.

Therefore, it is preferable that the mass ratio of Cu atom be in the range of 1 to 10 wt % at the joint interface.

Here, when analyzation is performed by an energy dispersive X-ray spectroscopy, since the diameter of the spot therefor is extremely small, a plurality of points are measured on the joint interface (for example, 10 to 100 points), and the average of the points is calculated.

In addition, when the measuring is performed, the joint interface between the crystalline grain and the ceramics substrate is only measured, and the joint interface between the crystalline grain boundary of the metal plate and the ceramics substrate is not measured.

A power module of a ninth aspect of the present invention is provided with: the power module substrate of the above-described eighth aspect; and an electronic component mounted on the power module substrate.

According to the power module having the above-described structure, the joint strength between the ceramics substrate and the metal plate is high, and even if the power module is used under a severe usage environment in which, for example, heat stress is repeatedly generated, it is possible to significantly improve the reliability thereof.

A method for manufacturing a power module substrate of a tenth aspect of the present invention includes: preparing a ceramics substrate composed of $Al_2O_3$, a metal plate composed of pure aluminum, and a Cu-layer having a thickness of 0.15 μm to 3 μm; stacking the ceramics substrate and the metal plate in layers with the Cu-layer interposed therebetween (stacking step); pressing the ceramics substrate, the Cu-layer, and the metal plate which were stacked in layers in a stacked direction, and heating the ceramics substrate, the Cu-layer, and the metal plate; forming a fusion aluminum layer at a boundary face between the ceramics substrate and the metal plate (melting step); solidifying the fusion aluminum layer by cooling the fusion aluminum layer (solidifying step); and forming a high-Cu concentration section at a joint interface between the ceramics substrate and the metal plate in the melting step and the solidifying step, the high-Cu concentration section having a Cu concentration that is more than twice the Cu concentration in the metal plate.

In the method for manufacturing a power module substrate, the ceramics substrate and the metal plate stacked in layers with the Cu-layer interposed therebetween, and the ceramics substrate and the metal plate which were stacked in layers is pressed in the stacked direction and heated.

Because of this, due to the eutectic reaction of Cu of the Cu-layer and Al of the metal plate, the melting point of the near joint interface is lowered, even under relatively low-temperature, it is possible to form the fusion aluminum layer at the boundary face between the ceramics substrate and the metal plate, and it is possible to connect the ceramics substrate to the metal plate.

Namely, without using a brazing filler metal composed of Al—Si alloy or the like, it is possible to connect the ceramics substrate to the metal plate.

In addition, when the thickness of the Cu-layer is less than 0.15 μm, there is a concern that a fusion aluminum layer cannot be sufficiently formed at the boundary face between the ceramics substrate and the metal plate.

In addition, when the thickness of the Cu-layer exceeds 3 μm, reactant of Cu and Al is excessively generated at the joint interface, the near joint interface of the metal plate is strengthened more than necessary, and there is a concern that cracks are generated at the ceramics substrate composed of $Al_2O_3$ when the ceramics substrate is subjected to a heat-load cycle.

Consequently, in a case where the ceramics substrate is composed of $Al_2O_3$, it is preferable that the thickness of the Cu-layer be 0.15 μm to 3 μm.

In the method for manufacturing a power module substrate of the tenth aspect of the present invention, it is preferable that, when stacking the ceramics substrate and the metal plate in layers with the Cu-layer interposed therebetween, the Cu-layer be disposed by inserting a copper foil between the ceramics substrate and the metal plate.

In the method for manufacturing a power module substrate of the tenth aspect of the present invention, it is preferable that the Cu-layer be adhered to at least one of the ceramics substrate and the metal plate before stacking the ceramics substrate, the Cu-layer, and the metal plate in layers.

In the method for manufacturing a power module substrate of the tenth aspect of the present invention, it is preferable that, when the Cu is adhered to at least one of the ceramics substrate and the metal plate, Cu be adhered to at least one of the ceramics substrate and the metal plate, by a method selected from an evaporation method, a sputtering method, a plating method, and a method of applying a Cu-paste.

According to the methods, between the ceramics substrate and the metal plate, it is possible to form a Cu-layer having a desired thickness, and it is possible to reliably connect the ceramics substrate to the metal plate.

A power module substrate of an eleventh aspect of the present invention includes: a ceramics substrate having a surface; a metal plate connected to the surface of the ceramics substrate via a brazing filler metal including Si, composed of aluminum; Cu introduced into the joint interface between the ceramics substrate and the metal plate, wherein the metal plate includes Si and Cu; and a Si concentration is in the range of 0.05 to 0.5 wt % and a Cu concentration is in the range of 0.05 to 1.0 wt %, in a portion which is close to the joint interface of the metal plate.

In the power module substrate having the above-described structure, the ceramics substrate is bonded to the metal plate composed of aluminum by use of the brazing filler metal including Si, and Cu is introduced into the joint interface between the metal plate and the ceramics substrate.

Here, since Cu is chemical element having the reactivity that is greater than that of Al, due to Cu existing at the joint interface, a surface of the metal plate composed of aluminum is activated.

Therefore, even if the connecting is performed under the junction condition where a temperature is relatively low in a short time by use of a commonly-used Al—Si system brazing filler metal, it is possible to tightly connect the ceramics substrate to the metal plate.

In addition, in a method for introducing Cu into the joint interface, Cu may be adhered to a surface of the ceramics substrate and the brazing filler metal by an evaporation method, a sputtering method, a plating method, or the like, or Cu may be included in a Al—Si system brazing filler metal.

In addition, since Cu is diffused in the metal plate and the Cu concentration in the portion which is close to the joint interface is in the range of 0.05 to 1.0 wt %, the portion which is close to the joint interface of the metal plate is solid-solution strengthened.

Consequently, it is possible to prevent fractures from being generated in the metal plate part, and it is possible to improve the junction reliability.

Furthermore, the ceramics substrate is bonded to the metal plate composed of aluminum by use of the brazing filler metal including Si, Si is diffused in the metal plate, the Si concentration in portion which is close to the joint interface is in the range of 0.05 to 0.5 wt %.

For this reason, the brazing filler metal is reliably molten and in a solid-solution state, Si is sufficiently diffused in the metal plate, and the ceramics substrate is tightly connected to the metal plate.

In the power module substrate of the eleventh aspect of the present invention, it is preferable that a width of the ceramics substrate be greater than a width of the metal plate; an aluminum phase in which Si and Cu are included in aluminum, a Si phase in which a content rate of Si is greater than or equal to 98 wt %, and an eutectic phase composed of a ternary eutectic structure including Al, Cu, and Si be formed at an end portion in a width direction of the metal plate.

In this case, since not only the aluminum phase in which Si and Cu are diffused in aluminum but also the Si phase in which the content rate of Si is greater than or equal to 98 wt %, and the eutectic phase composed of the ternary eutectic structure including Al, Cu, and Si are formed at the end portion in the width direction of the metal plate, it is possible to strengthen the end portion in the width direction of the metal plate.

In the power module substrate of the eleventh aspect of the present invention, it is preferable that precipitate particles composed of a compound including Cu precipitate in the eutectic phase.

In this case, in the eutectic phase formed at the end portion in the width direction of the metal plate, since the precipitate particles composed of a compound including Cu precipitate, it is possible to further realize precipitation strengthening of the end portion in the width direction of the metal plate.

Consequently, it is possible to prevent fractures from being generated at the end portion in the width direction of the metal plate, and it is possible to improve the junction reliability.

The power module substrate of the eleventh aspect of the present invention may include a high-Si concentration section formed at the joint interface between the metal plate and the ceramics substrate, having a Si concentration that is more than five times the Si concentration in the metal plate, and the ceramics substrate may be composed of AlN or $Al_2O_3$.

In this case, since the high-Si concentration section having the Si concentration that is more than five times the Si concentration in the metal plate is formed at the joint interface between the metal plate and the ceramics substrate, due to a Si atom existing the joint interface, the joint strength between the ceramics substrate composed of AlN or $Al_2O_3$ and the metal plate composed of aluminum is improved.

In addition, here, Si concentration in the metal plate means a Si concentration in the portion that is positioned separately from the joint interface in the metal plate by a predetermined distance (for example, 50 nm or more).

it is thought that the Si existing at the joint interface with a high degree of concentration is Si mainly included in a brazing filler metal.

When the connecting is performed, Si is diffused in aluminum (metal plate), the amount thereof decreases at the joint interface, a boundary face portion between the ceramics and aluminum (metal plate) becomes a site of nonuniform nucleation, Si atoms remain at the boundary face portion, and the high-Si concentration section having the Si concentration that is more than five times the Si concentration in the metal plate is formed.

The power module substrate of the eleventh aspect of the present invention may include a high-oxygen concentration section formed at the joint interface between the metal plate and the ceramics substrate, having an oxygen concentration that is greater than oxygen concentrations in the metal plate and in the ceramics substrate, and having a thickness of less than or equal to 4 nm, and the ceramics substrate may be composed of AlN or $Si_3N_4$.

In this case, since the high-oxygen concentration section having the oxygen concentration that is greater than the oxygen concentrations in the metal plate and in the ceramics substrate at the joint interface between the ceramics substrate composed of AlN or $Si_3N_4$ and the metal plate composed of aluminum, the joint strength between the ceramics substrate composed of AlN or $Si_3N_4$ and the metal plate composed of aluminum is improved due to the oxygen existing at the joint interface.

Moreover, since the thickness of the high-oxygen concentration section is less than or equal to 4 nm, generation of crack is suppressed in the high-oxygen concentration section due to the stress when a heat-load cycle is performed.

In addition, here, oxygen concentrations in the metal plate and in the ceramics substrate means an oxygen concentration in the portion that is positioned separately from the joint interface in the metal plate and in the ceramics substrate by a predetermined distance (for example, 50 nm or more).

In addition, it is thought that the oxygen existing at the joint interface with a high degree of concentration is oxygen existing at a surface of the ceramics substrate and oxygen taken from an oxide film formed on a surface of a brazing filler metal.

Here, the oxygen existing at the joint interface with a high degree of concentration, this means that the oxide film or the like is sufficiently heated so as to be reliably removed.

Therefore, it is possible to tightly connect the ceramics substrate to the metal plate.

A power module of a twelfth aspect of the present invention is provided with: the power module substrate of the above-described eleventh aspect; and an electronic component mounted on the power module substrate.

According to the power module having the above-described structure, the joint strength between the ceramics substrate and the metal plate is high, and even if the power module is used under a severe usage environment in which, for example, heat stress is repeatedly generated, it is possible to significantly improve the reliability thereof.

A method for manufacturing a power module substrate of a thirteenth aspect of the present invention includes: preparing a ceramics substrate having a connection face, a metal plate composed of aluminum, and a brazing filler metal including Si; stacking the ceramics substrate and the metal plate in layers with the brazing filler metal interposed therebetween (stacking step); heating the ceramics substrate, the brazing filler metal, and the metal plate which are stacked in layers in a state where a pressure is applied thereon; forming a fusion aluminum layer at a boundary face between the ceramics substrate and the metal plate by melting the brazing filler metal (melting step); and solidifying the fusion aluminum layer (solidifying step), wherein Cu is adhered to at least one of the connection face of the ceramics substrate and a face of the brazing filler metal opposing the ceramics substrate before stacking the ceramics substrate and the metal plate in layers with the brazing filler metal interposed therebetween (adhering step).

The method for manufacturing a power module substrate has a Cu-adhering step in which Cu is adhered to at least one of the connection face of the ceramics substrate and a face of the brazing filler metal opposing the ceramics substrate, before performing the stacking step in which the ceramics substrate and the metal plate are stacked in layers with the brazing filler metal including Si interposed therebetween.

Consequently, Cu is reliably introduced into the joint interface between the ceramics substrate and the metal plate, the surface of the metal plate is activated due to Cu, even if the ceramics substrate is bonded to the metal plate under the junction condition where a temperature is relatively low in a short time by use of a commonly-used Al—Si system brazing filler metal, it is possible to tightly connect the ceramics substrate to the metal plate.

In the method for manufacturing a power module substrate of the thirteenth aspect of the present invention, it is preferable that Cu be adhered to at least one of the connection face of the ceramics substrate and a face of the brazing filler metal opposing the ceramics substrate by an evaporation method or a sputtering method in the adhering of Cu.

In this case, Cu is reliably adhered to at least one of the connection face of the ceramics substrate and the face of the brazing filler metal by the evaporation method or the sputtering method, and Cu can reliably exist at the joint interface between the ceramics substrate and the metal plate.

For this reason, the surface of the metal plate is activated due to Cu, and it is possible to tightly connect the ceramics substrate to the metal plate.

Effects of the Present Invention

According to the present invention, it is possible to provide a power module substrate in which a metal plate is reliably connected to a ceramics substrate and heat-load cycle reliability is high, a power module which is provided with the power module substrate, and a method for manufacturing the power module substrate.

DESCRIPTION OF THE PREFERRED EMBODIMENTS

Hereinafter, embodiments of the present invention will be described with reference to attached drawings.

First Embodiment

Figure 1:
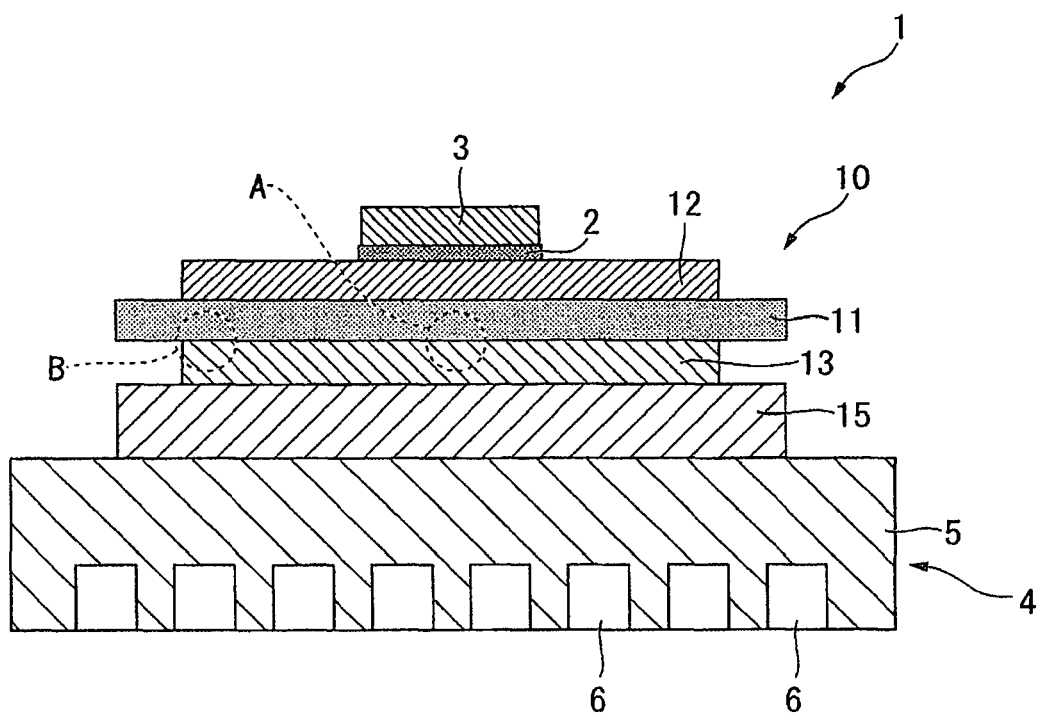
FIG. 1 is a schematic cross-sectional view showing a power module in which a power module substrate of a first embodiment of the present invention is employed.

FIG. 1 shows a power module substrate and a power module of a first embodiment of the present invention.

The power module 1 includes a power module substrate 10 on which a circuit layer 12 is disposed, a semiconductor chip 3 which is bonded to a top face of the circuit layer 12 with a solder layer 2 interposed therebetween, and a heatsink 4.

Here, the solder layer 2 is a solder material, for example, a Sn—Ag system, a Sn—In system, or a Sn—Ag—Cu system.

In addition, in the first embodiment, a Ni plated layer (not shown in the figure) is provided between the circuit layer 12 and the solder layer 2.

The power module substrate 10 includes a ceramics substrate 11, the circuit layer 12 that is disposed on a first face of the ceramics substrate 11 (upper face in FIG. 1) and a metal layer 13 that is disposed on a second face of the ceramics substrate 11 (lower face in FIG. 1).

The ceramics substrate 11 is a substrate used for preventing an electrical connection between the circuit layer 12 and the metal layer 13, and is made of AlN (aluminum nitride) with a high level of insulation.

In addition, the thickness of the ceramics substrate 11 is in a range of 0.2 to 1.5 mm, and is 0.635 mm in the first embodiment.

In addition, as shown in FIG. 1, the width of the ceramics substrate 11 is greater than the widths of the circuit layer 12 and the metal layer 13 in the first embodiment.

By connecting a metal plate 22 having a conductive property to the first face of the ceramics substrate 11, the circuit layer 12 is formed.

In the first embodiment, by connecting the metal plate 22 constituted of a rolled plate composed of aluminum having a purity of 99.99% or more (a so-called 4N aluminum) to the ceramics substrate 11, the circuit layer 12 is formed thereon.

By connecting a metal plate 23 to the second face of the ceramics substrate 11, the metal layer 13 is formed.

In the first embodiment, due to connecting the metal plate 23 constituted of a rolled plate composed of aluminum having a purity of 99.99% or more (a so-called 4N aluminum) to the ceramics substrate 11, the metal layer 13 is formed in a manner similar to the circuit layer 12.

The heatsink 4 is a component for cooling the above-described power module substrate 10, and provided with a top panel section 5 connected to the power module substrate 10, and a flow passage 6 through which a cooling medium (for example, cooling water) flows.

The heatsink 4 (top panel section 5) is desirably composed of a material having excellent thermal conductivity, composed of A6063 (aluminum alloy) in the first embodiment.

In addition, in the first embodiment, a buffer layer 15 composed of aluminum, an aluminum alloy, or a combination of materials including aluminum (for example, AlSiC or the like) is provided between the top panel section 5 of the heatsink 4 and the metal layer 13.

Figure 2:
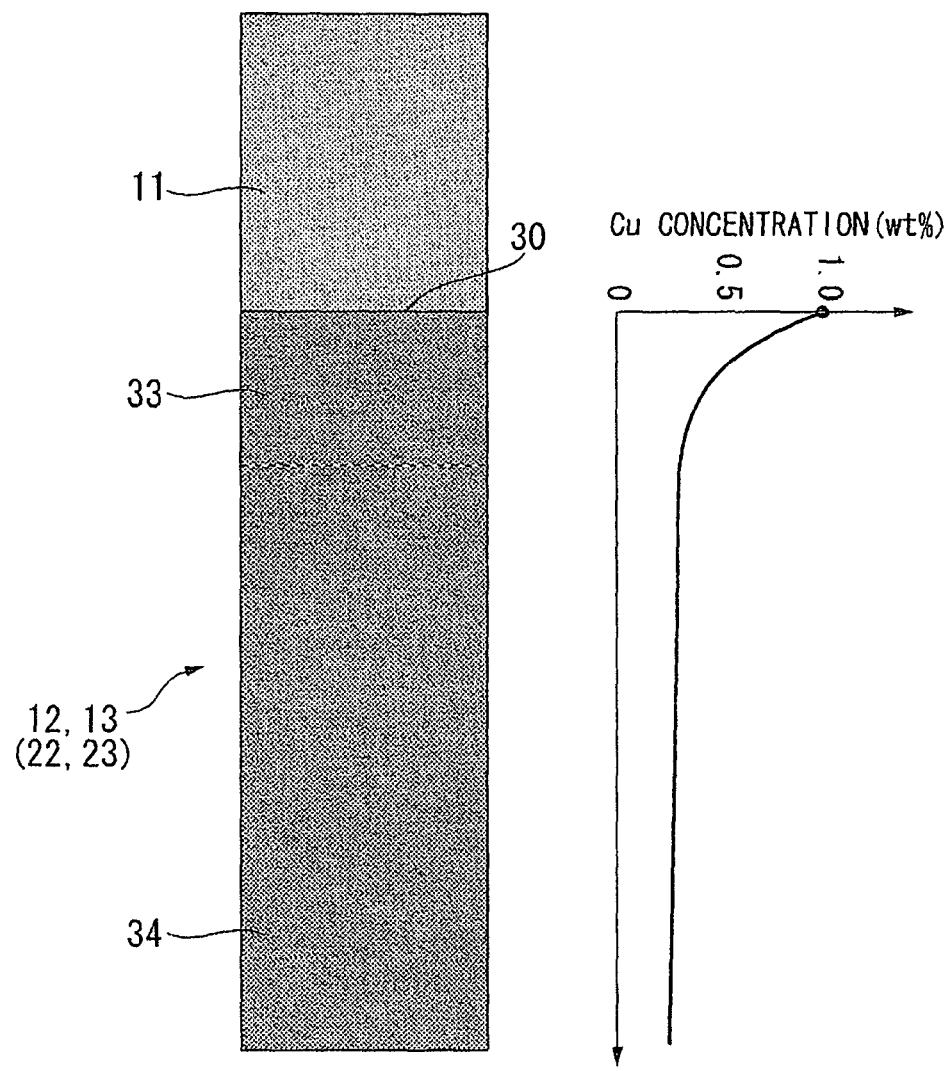
FIG. 2 is an explanatory diagram showing a Cu concentration distribution in a circuit layer and a metal layer of the power module substrate of the first embodiment of the present invention.

Consequently, as shown in FIGS. 1 and 2, in the center portion in the width direction of the joint interface 30 between the ceramics substrate 11 and the circuit layer 12 (metal plate 22), and in the center portion (portion A in FIG. 1) in the width direction of the joint interface 30 between the ceramics substrate 11 and the metal layer 13 (metal plate 23), Cu is diffused in the circuit layer 12 (metal plate 22) and in the metal layer 13 (metal plate 23), and a concentration-gradient layer 33 (concentration-gradient section) is formed in which the Cu concentration gradually decreases with increases in the distance from the joint interface 30 in a stacked direction.

In addition, in this specification, "stacked direction" represents the direction in which the ceramics substrate 11, the circuit layer 12, and the metal layer 13 are stacked in layers.

Here, the Cu concentration in the portion which is close to the joint interface 30 of the concentration-gradient layer 33 is in the range of 0.05 to 5 wt %.

In addition, the Cu concentration in the portion which is close to the joint interface 30 of the concentration-gradient layer 33 is the average value of five points which are measured in the range from the joint interface 30 to 50 μm by use of an EPMA analyzation (diameter of spot is 30 μm).

In addition, a soft layer 34 which has a Cu concentration lower than the Cu concentration in the near joint interface 30 and has a low degree of hardness is formed at the opposite side of the ceramics substrate 11 in the concentration-gradient layer 33 (lower side in FIG. 2).

Figure 3:
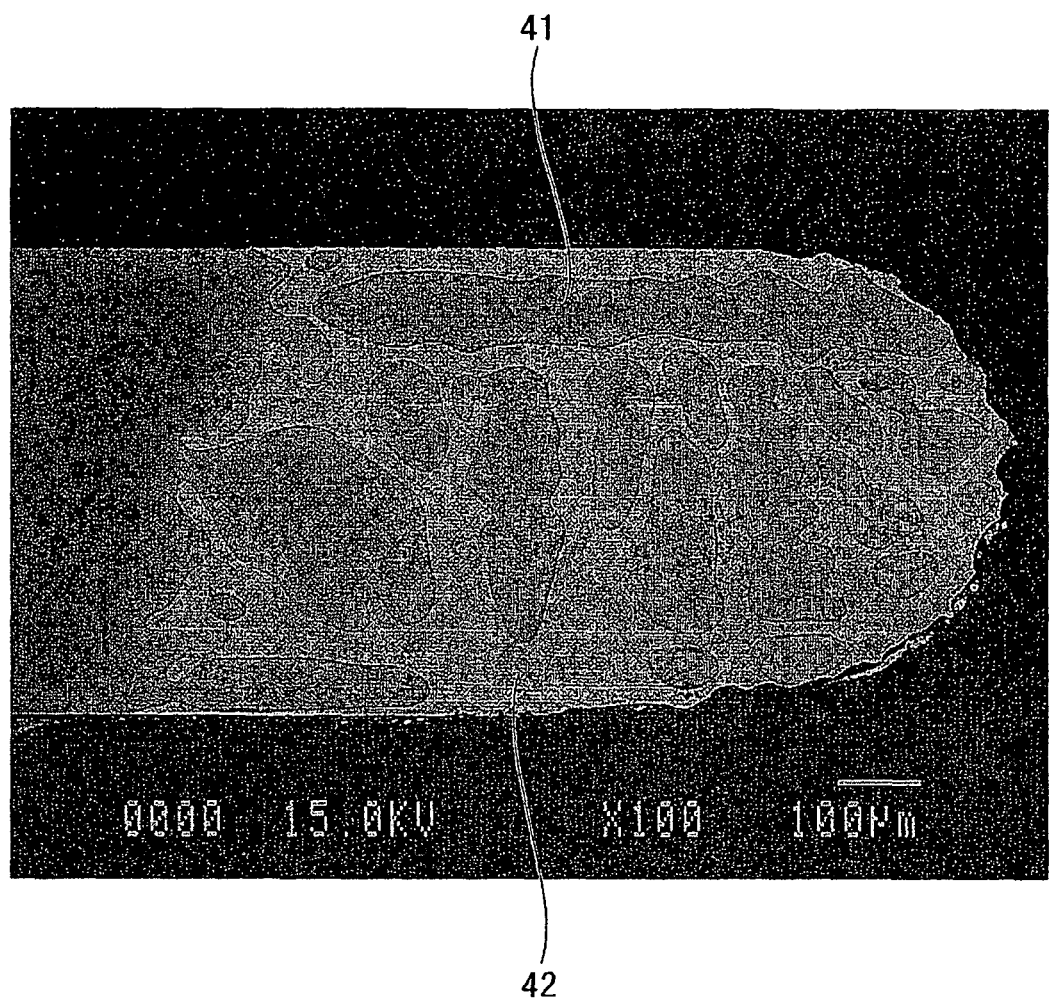
FIG. 3 is an explanatory diagram showing an end portion in a width direction of the circuit layer and the metal layer (metal plate) of the power module substrate of the first embodiment of the present invention.

In addition, in the end portion in the width direction of the joint interface 30 between the ceramics substrate 11 and the circuit layer 12 (metal plate 22), and in the end portion (portion B in FIG. 1) in the width direction of the joint interface 30 between the ceramics substrate 11 and the metal layer 13 (metal plate 23), as shown in FIG. 3, an aluminum phase 41 in which Cu is diffused in aluminum in a solid-solution state, and an eutectic phase 42 composed of a binary eutectic structure including Al and Cu are formed.

In addition, precipitate particles composed of a compound including Cu (for example, $CuAl_2$) precipitate in the eutectic phase 42.

The foregoing power module substrate 10 is manufactured as described below.

Figure 4A:
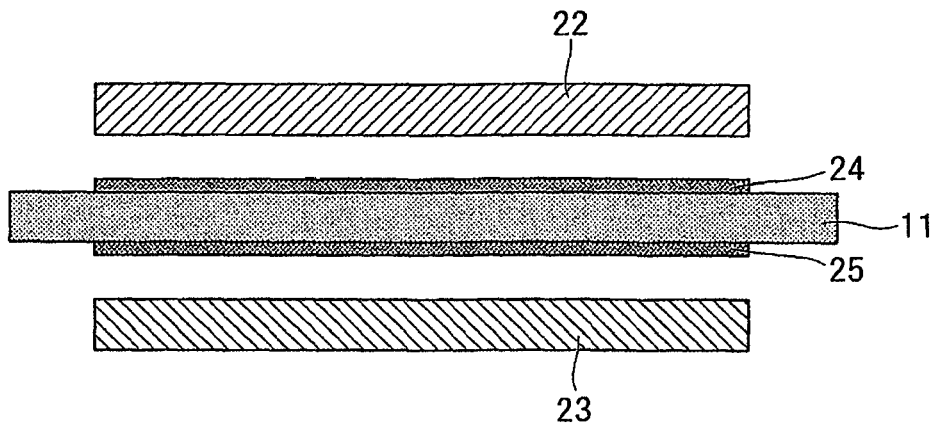
FIGS. 4A to 4C are cross-sectional views showing a method for manufacturing a power module substrate of the first embodiment of the present invention.
Figure 5A:
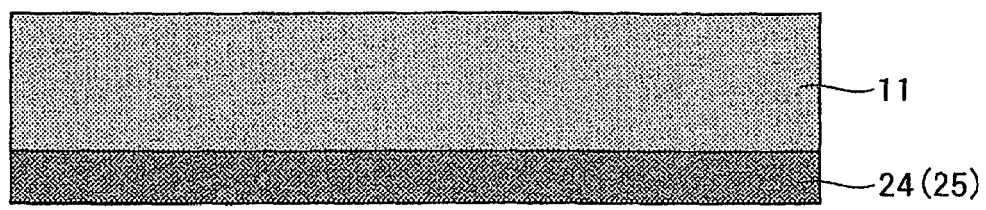
FIGS. 5A to 5C are cross-sectional views showing a near joint interface between the metal plate and the ceramics substrate in FIGS. 4A to 4C.

At first, as shown in FIGS. 4A and 5A, a ceramics substrate 11 composed of AlN, a metal plate 22 (rolled plate made of 4N aluminum) that becomes a circuit layer 12, and a metal plate 23 (rolled plate made of 4N aluminum) that becomes a metal layer 13 are prepared.

Thereafter, Cu is adhered to both faces of the ceramics substrate 11 due to a sputtering, and Cu-layers 24 and 25 having a film thickness of 0.15 μm to 3 μm are thereby formed (Cu-adhering step).

Consequently, the ceramics substrate 11, the metal plates 22 and 23, and the Cu-layers 24 and 25 are prepared.

Figure 4B:
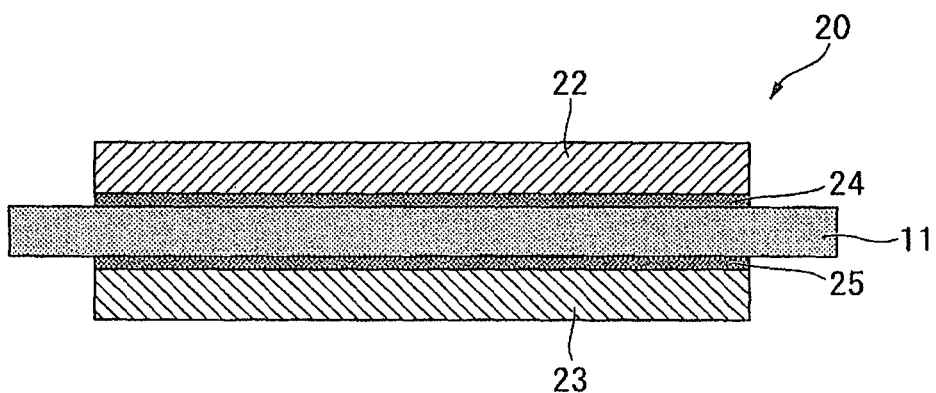

Subsequently, as shown in FIG. 4B, the metal plate 22 is stacked on a first face of the ceramics substrate 11, and the metal plate 23 is stacked on a second face of the ceramics substrate 11 (stacking step).

Therefore, a layered body 20 is formed.

Next, the layered body 20 that was formed in the above-described manner is heated in a state where the layered body 20 is pressed in the stacked direction thereof (pressure is 1 to 5 kgf/cm$^2$) and is set inside a vacuum furnace.

Here, in the vacuum furnace, the degree of vacuum is $10^{-3}$ Pa to $10^{-5}$ Pa, and the heating temperature is 610° C. to 650° C.

Figure 5B:
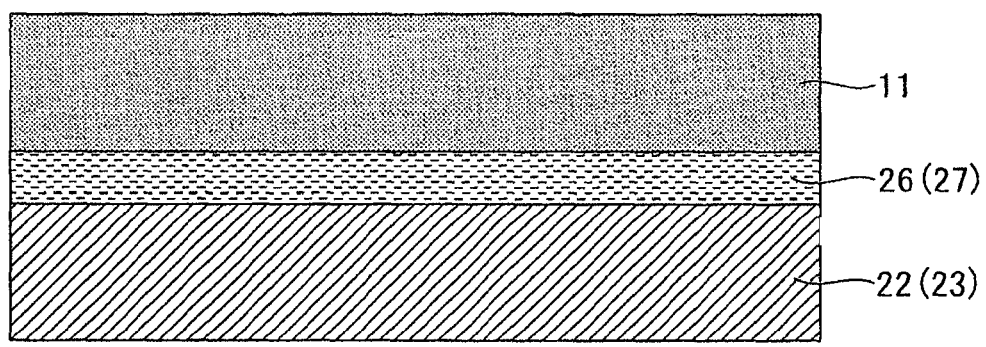

Due to the pressing-heating step, as shown in FIG. 5B, surface layers of the metal plates 22 and 23, which become the circuit layer 12 and the metal layer 13, and the Cu-layers 24 and 25 are melted, and fusion metal layers 26 and 27 are formed on the surface of the ceramics substrate 11 (melting step).

Figure 4C:
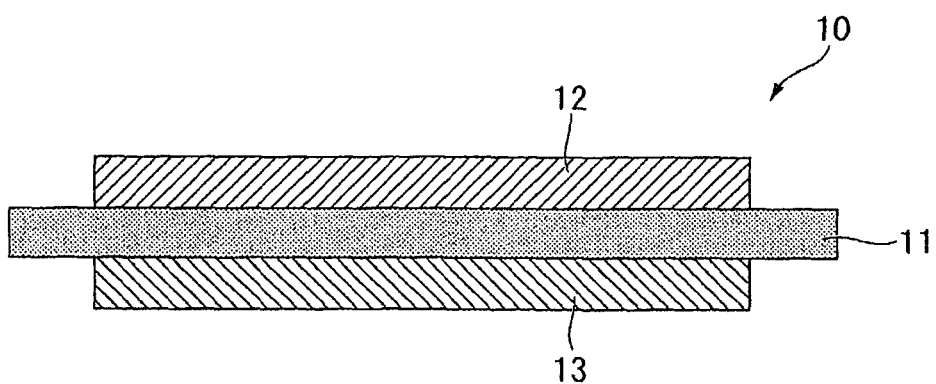
Figure 5C:
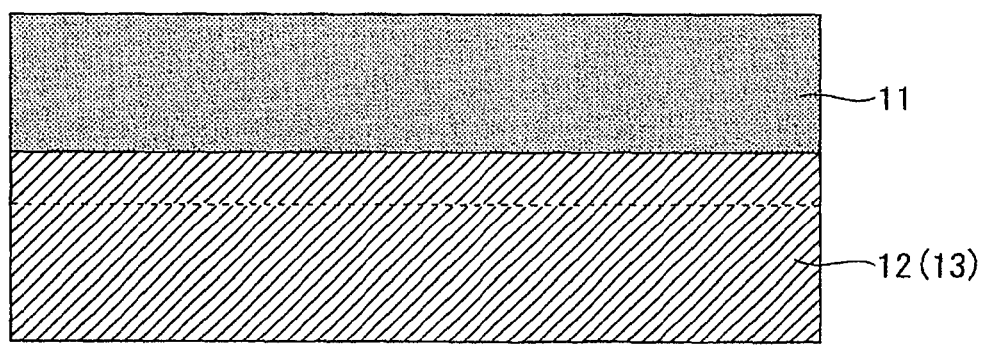

Subsequently, as shown in FIGS. 4C and 5C, by cooling the layered body 20, the fusion metal layers 26 and 27 are solidified (solidifying step).

Due to the melting step and the solidifying step, Cu is diffused in the vicinity of the joint interface between the metal plate 22 that becomes the circuit layer 12 and the ceramics substrate 11, or in the vicinity of the joint interface between the metal plate 23 that becomes the metal layer 13 and the ceramics substrate 11, so that the Cu concentration is in the range of 0.05 to 5 wt %.

In the above-described manner, the metal plates 22 and 23 that become the circuit layer 12 and the metal layer 13 are connected to the ceramics substrate 11, and the power module substrate 10 of the first embodiment is manufactured.

In the power module substrate 10 and the power module 1 of the first embodiment having the above-described structure, Cu is diffused in the circuit layer 12 (metal plate 22) and the metal layer 13 (metal plate 23) in a solid-solution state.

In addition, since the Cu concentration in the joint interface 30 between the circuit layer 12 and the ceramics substrate 11 or in the joint interface 30 between the metal layer 13 and the ceramics substrate 11 is in the range of 0.05 to 5 wt %, the joint interface 30 between the circuit layer 12 (metal plate 22) and the metal layer 13 (metal plate 23) is solid-solution strengthened.

Because of this, when a heat-load cycle or the like is performed, cracks are prevented from being propagated in the portions of the circuit layer 12 (metal plate 22) and the metal layer 13 (metal plate 23), and it is thereby possible to considerably improve the reliability of the power module substrate 10 and the power module 1.

In addition, since the aluminum phase 41 in which Cu is diffused in aluminum, and the eutectic phase 42 composed of the binary eutectic structure including Al and Cu are formed in the end portions in the width direction of the circuit layer 12 (metal plate 22) and the metal layer 13 (metal plate 23), it is possible to further strengthen the end portions in the width direction of the circuit layer 12 (metal plate 22) and the metal layer 13 (metal plate 23).

Consequently, it is possible to prevent fractures from being generated at the end portions in the width direction of the circuit layer 12 (metal plate 22) and the metal layer 13 (metal plate 23), and it is possible to improve the junction reliability of the power module substrate 10.

Furthermore, in the first embodiment, since precipitate particles composed of a compound including Cu (for example, $CuAl_2$) precipitate in the eutectic phase 42, it is possible to realize precipitation strengthening of the end portions in the width direction of the circuit layer 12 (metal plate 22) and the metal layer 13 (metal plate 23), and it is possible to reliably prevent cracks from being propagated in the end portions in the width direction of the circuit layer 12 (metal plate 22) and the metal layer 13 (metal plate 23).

In addition, in the center portion in the width direction of the joint interface 30 between the ceramics substrate 11 and the circuit layer 12 (metal plate 22), and in the center portion (portion A in FIG. 1) in the width direction of the joint interface 30 between the ceramics substrate 11 and the metal layer 13 (metal plate 23), Cu is diffused in the circuit layer 12 (metal plate 22) and in the metal layer 13 (metal plate 23) in a solid-solution state, and a concentration-gradient layer 33 is formed in which the Cu concentration gradually decreases with increases in the distance from the joint interface 30 in a stacked direction; furthermore, the soft layer 34 which has a Cu concentration lower than the Cu concentration in the near joint interface 30, which has a low degree of hardness, and which has a deformation resistance, is formed at the opposite side of the ceramics substrate 11 in the concentration-gradient layer 33 (lower side in FIG. 2).

In this structure, due to the soft layer 34, it is possible to absorb heat strain (heat stress) which is caused by the difference of the coefficient of thermal expansion between the circuit layer 12 (metal plate 22) and the ceramics substrate 11 and by the difference of the coefficient of thermal expansion between the metal layer 13 (metal plate 23) and the ceramics substrate 11, and it is possible to considerably improve the heat-load cycle reliability of the power module substrate 10.

According to the method for manufacturing a power module substrate of the first embodiment, since the ceramics substrate 11, the metal plate 22 that becomes the circuit layer 12, and the metal plate 23 that becomes the metal layer 13 are stacked in layers with the Cu-layers 24 and 25 interposed therebetween, and the ceramics substrate 11 and the metal plates 22 and 23 which were stacked in layers are pressed in the stacked direction and heated, the melting point of the near joint interface 30 is lowered due to the eutectic reaction of Cu included in the Cu-layers 24 and 25 and Al included in the metal plates 22 and 23. Therefore, even under relatively low-temperature, it is possible to form the fusion metal layers 26 and 27 at the boundary face between the ceramics substrate 11 and the metal plates 22 and 23, and it is possible to connect the ceramics substrate 11 to the metal plates 22 and 23.

Since it is possible to connect the ceramics substrate 11 to the metal plates 22 and 23 without using a brazing filler metal composed of Al—Si alloy or the like in the above-described manner, there is not a concern that a brazing filler metal penetrates to a surface of the circuit layer 12, and it is possible to prevent the Ni-plating formed on the surface of the circuit layer 12 from peeling.

Consequently, it is possible to reliably form the solder layer 2 on the circuit layer 12 with the Ni-plating interposed therebetween.

In addition, since the thickness of the Cu-layers 24 and 25 is 0.15 μm to 3 μm, the fusion metal layers 26 and 27 are reliably formed at the boundary face between the ceramics substrate 11 and the metal plates 22 and 23, and it is possible to connect the ceramics substrate 11 to the metal plates 22 and 23.

In addition, it is possible to prevent reactants of Cu and Al from being excessively generated at the near joint interface 30, and it is possible to prevent cracks from being generated in the ceramics substrate 11 when the ceramics substrate 11 is subjected to a heat-load cycle.

Furthermore, since the Cu-layers 24 and 25 are formed on the first face and the second face of the ceramics substrate 11 (i.e., connection face, faces opposed to the metal plates 22 and 23), respectively, in the Cu-adhering step in which Cu is adhered thereto by a sputtering, it is possible to reliably stack the ceramics substrate 11 and the metal plates 22 and 23 in layers with the Cu-layers 24 and 25 interposed therebetween, the ceramics substrate 11 is reliably bonded to the metal plates 22 and 23, and it is thereby possible to manufacture the power module substrate 10 of the first embodiment.

As described above, the first embodiment of the present invention is described, the technical scope of the present invention is not limited to the above embodiment, and various modifications may be made without departing from the scope of the present invention.

In the first embodiment of the present invention, the manufacturing method is described having the Cu-adhering step in which Cu is adhered to a surface of the ceramics substrate, it is not limited to this method, Cu may be adhered to a face of the metal plate facing to the ceramics substrate 11 (connection face).

In addition, in the stacking step, the Cu-layer may be formed by inserting a copper foil between the ceramics substrate and the metal plate.

In addition, the method for forming the Cu-layer by a sputtering method is described, it is not limited to this method, Cu may be adhered thereto by an evaporation method, a plating method, a method of applying a paste, or the like.

Second Embodiment

Figure 8:
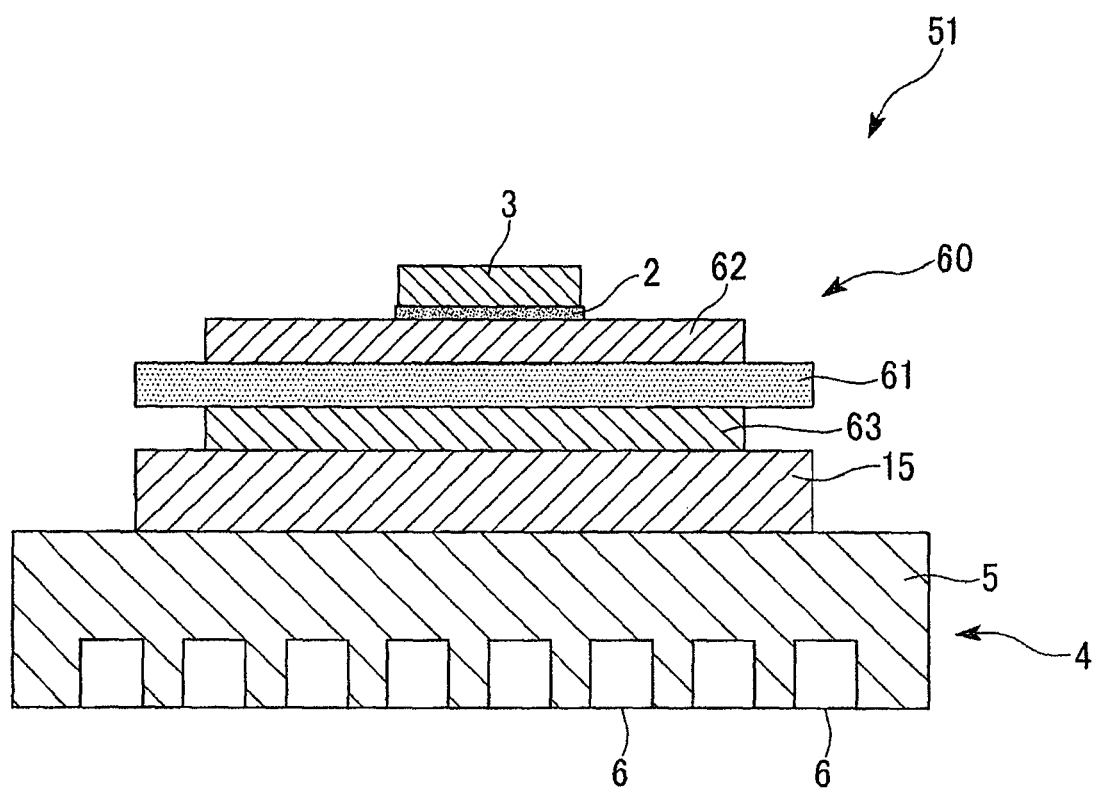
FIG. 8 is a schematic cross-sectional view showing a power module in which a power module substrate of a second embodiment of the present invention is employed.

FIG. 8 shows a power module substrate 60 and a power module 51 of a second embodiment of the present invention.

In the second embodiment, identical symbols are used for the elements which are identical to those of the first embodiment, and the explanations thereof are omitted or simplified.

The power module 51 includes a power module substrate 60 on which a circuit layer 62 is disposed, a semiconductor chip 3 which is bonded to a top face of the circuit layer 62 with a solder layer 2 interposed therebetween, and a heatsink 4.

The power module substrate 60 includes a ceramics substrate 61, the circuit layer 62 that is disposed on a first face of the ceramics substrate 61 (upper face in FIG. 8) and a metal layer 63 that is disposed on a second face of the ceramics substrate 61 (lower face in FIG. 8).

The ceramics substrate 61 is a substrate used for preventing an electrical connection between the circuit layer 62 and the metal layer 63, and is made of AlN (aluminum nitride) with a high level of insulation.

In addition, the thickness of the ceramics substrate 61 is in a range of 0.2 to 1.5 mm, and is 0.635 mm in the second embodiment.

By connecting a metal plate 72 having a conductive property to the first face of the ceramics substrate 61, the circuit layer 62 is formed.

In the second embodiment, by connecting the metal plate 72 constituted of a rolled plate composed of aluminum having a purity of 99.99% or more (a so-called 4N aluminum) to the ceramics substrate 61, the circuit layer 62 is formed thereon.

By connecting a metal plate 73 to the second face of the ceramics substrate 61, the metal layer 63 is formed.

In the second embodiment, due to connecting the metal plate 73 constituted of a rolled plate composed of aluminum having a purity of 99.99% or more (a so-called 4N aluminum) to the ceramics substrate 61, the metal layer 63 is formed in a manner similar to the circuit layer 62.

Figure 9:
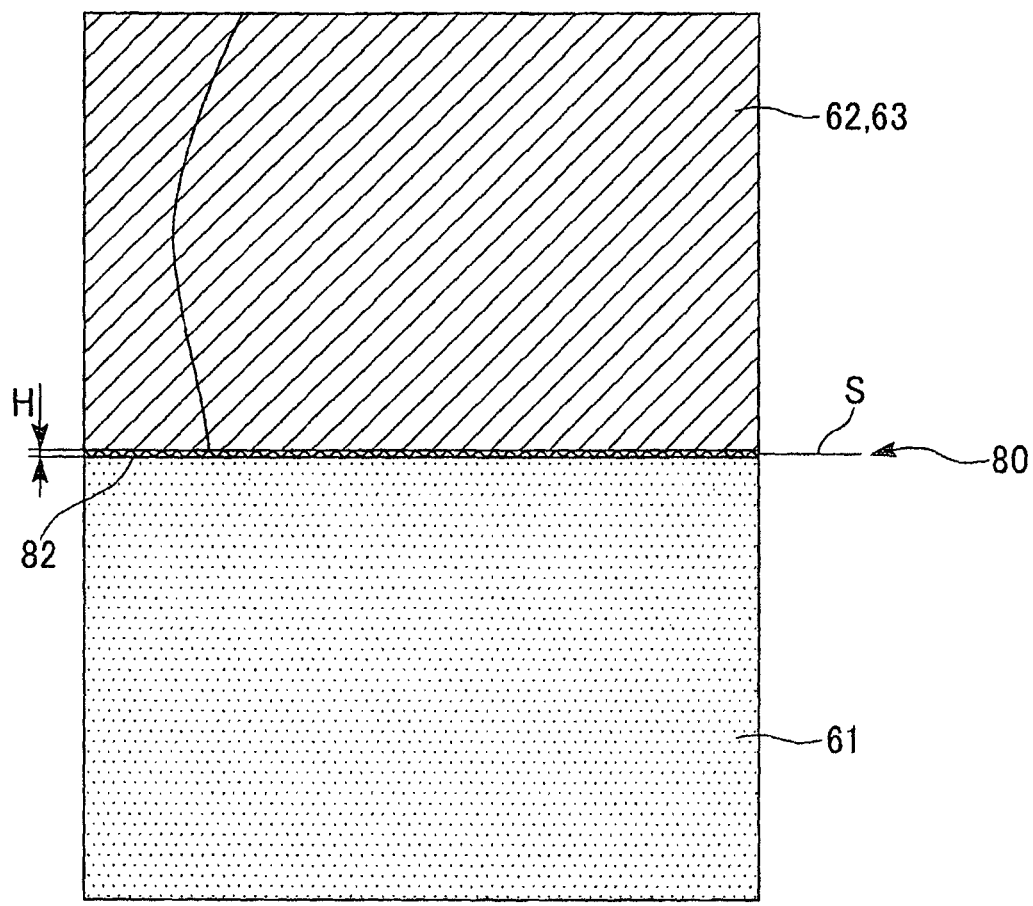
FIG. 9 is a schematic cross-sectional view showing the joint interface between a circuit layer, a metal layer (metal plate), and a ceramics substrate of the power module substrate of the second embodiment of the present invention.

Consequently, when the joint interface 80 between the ceramics substrate 61 and the circuit layer 62 (metal plate 72) and the joint interface 80 between the ceramics substrate 61 and the metal layer 63 (metal plate 73) are observed using a transmission electron microscope, a high-Cu concentration section 82 in which Cu is concentrated is formed at the joint interface 80 as shown in FIG. 9.

The Cu concentration in the high-Cu concentration section 82 is more than the Cu concentrations in the circuit layer 62 (metal plate 72) and in the metal layer 63 (metal plate 73).

Specifically, the Cu concentration in the joint interface 80 is more than twice the Cu concentrations in the circuit layer 62 and in the metal layer 63.

Here, in the second embodiment, the thickness H of the high-Cu concentration section 82 is less than or equal to 4 nm.

Furthermore, the oxygen concentration in the high-Cu concentration section 82 is greater than the oxygen concentrations in the circuit layer 62 and in the metal layer 63.

Here, in the joint interface 80 that is observed by a transmission electron microscope, the center between an end portion of the boundary face of the grid image of the circuit layer 62 (metal plate 72) and the metal layer 63 (metal plate 73), and an end portion of the boundary face of the grid image of the ceramics substrate 61, is defined as reference face S as shown in FIG. 9.

In addition, the Cu concentrations and the oxygen concentrations in the circuit layer 62 (metal plate 72) and in the metal layer 63 (metal plate 73) mean the Cu concentrations and the oxygen concentrations at the positions that are separated from the joint interface 80 by a predetermined distance (50 nm or more in the second embodiment) in the circuit layer 62 (metal plate 72) or the metal layer 63 (metal plate 73).

In addition, when the joint interface 80 is analyzed by energy dispersive X-ray spectroscopy (EDS), the mass ratio of Al, Cu, O, and N is in the range of Al:Cu:O:N=50 to 90 wt %:1 to 10 wt %:2 to 20 wt %:25 wt % or less.

In addition, when the analyzation is performed by the EDS, the diameter of the spot therefor is 1 to 4 nm, a plurality of points (for example, 100 points in the second embodiment) is measured at the joint interface 80, and the average value thereof is calculated.

In addition, the joint interface 80 between the crystalline grain of the metal plates 72 and 73 constituting the circuit layer 62 and the metal layer 63, and the ceramics substrate 61 is only measured, and the joint interface 80 between the crystalline grain boundary of the metal plates 72 and 73 constituting the circuit layer 62 and the metal layer 63, and the ceramics substrate 61 is not measured.

The foregoing power module substrate 60 is manufactured as described below.

Figure 10A:
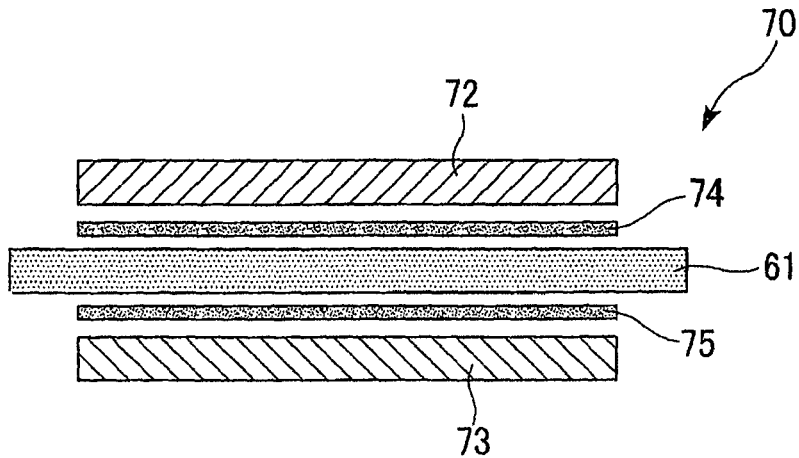
FIGS. 10A to 10C are cross-sectional views showing a method for manufacturing a power module substrate of the second embodiment of the present invention.
Figure 11A:
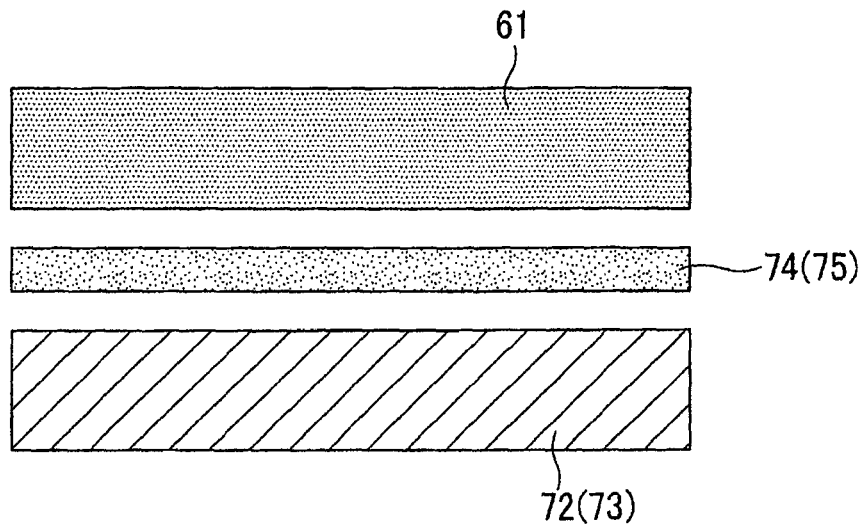
FIGS. 11A to 11C are cross-sectional views showing a near joint interface between the metal plate and the ceramics substrate in FIGS. 10A to 10C.

As shown in FIGS. 10A and 11A, the ceramics substrate 61 composed of AlN, a metal plate 72 (rolled plate made of 4N aluminum) that becomes a circuit layer 62, a copper foil 74 having a thickness of 0.15 μm to 3 μm (3 μm in the second embodiment), a metal plate 73 (rolled plate made of 4N aluminum) that becomes a metal layer 63, and a copper foil 75 having a thickness of 0.15 μm to 3 μm (3 μm in the second embodiment) are prepared.

Figure 10B:
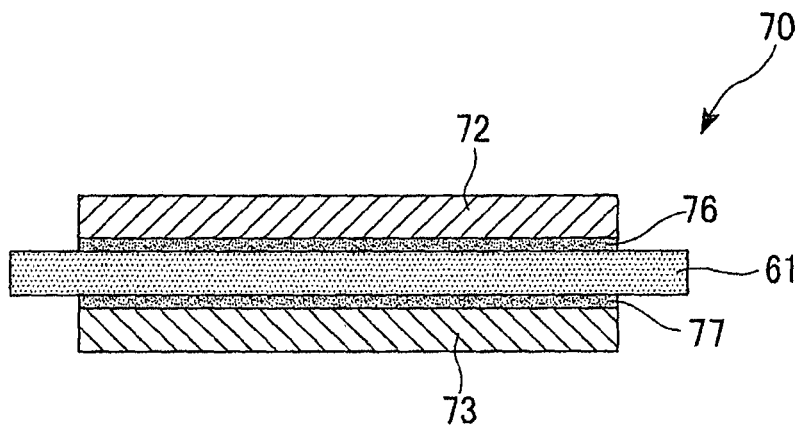
Figure 11B:
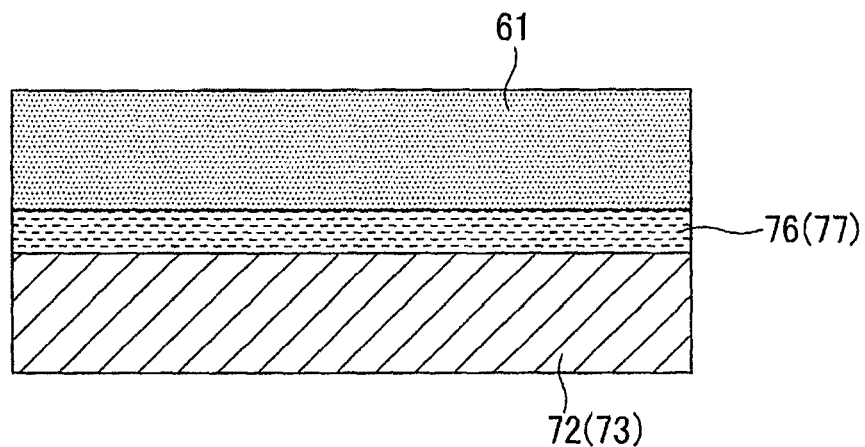

Next, as shown in FIGS. 10B and 11B, the metal plate 72 is stacked on a first face of the ceramics substrate 61 with the copper foil 74 interposed therebetween, and the metal plate 73 is stacked on a second face of the ceramics substrate 61 with the copper foil 75 interposed therebetween.

Consequently, a layered body 70 is formed.

Next, the layered body 70 is heated in a state where the layered body 70 is pressed in the stacked direction thereof (pressure is 1 to 5 kgf/cm$^2$) and is set inside a vacuum furnace (pressing-heating step).

Here, in the vacuum furnace, the degree of vacuum is $10^{-3}$ Pa to $10^{-5}$ Pa, and the heating temperature is 610° C. to 650° C.

Due to the pressing-heating step, as shown in FIG. 11B, the surface layers of metal plates 72 and 73 that become the circuit layer 62 and the metal layer 63 are melted with the copper foils 74 and 75, and fusion aluminum layers 76 and 77 are formed on the surface (the first face and the second face) of the ceramics substrate 61.

Figure 10C:
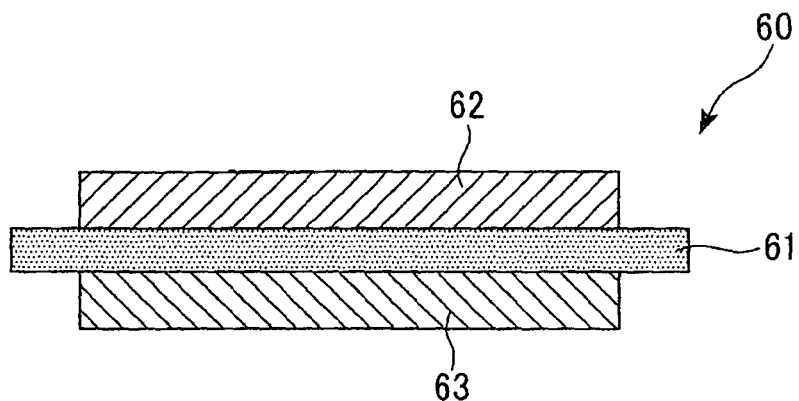
Figure 11C:
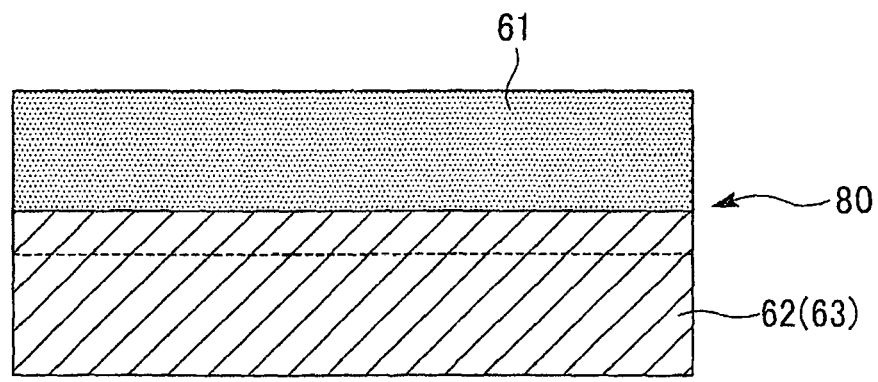

Subsequently, as shown in FIGS. 10C and 11C, by cooling the layered body 70, the fusion aluminum layers 76 and 77 are solidified (solidifying step).

Due to the pressing-heating step and the solidifying step, a high-Cu concentration section 82 having a Cu concentration and an oxygen concentration that are greater than the Cu concentrations and the oxygen concentrations in the metal plates 72 and 73 constituting the circuit layer 62 and the metal layer 63 is generated in the joint interface 80.

In the above-described manner, a power module substrate 60 of the second embodiment is manufactured.

In the power module substrate 60 and the power module 51 having the above-described structure in the second embodiment, the high-Cu concentration section 82 having a Cu concentration that is more than twice the Cu concentrations in the circuit layer 62 and in the metal layer 63 is formed at the joint interface 80 between the circuit layer 62, the metal layer 63, and the ceramics substrate 61; furthermore, the oxygen concentration in the high-Cu concentration section 82 is greater than the oxygen concentrations in the circuit layer 62 and in the metal layer 63.

Because of this, oxygen atom and Cu atom intervene in the joint interface 80, and it is possible to improve the joint strength between the ceramics substrate 61 composed of AlN and the circuit layer 62, and the joint strength between the ceramics substrate 61 and the metal layer 63.

Furthermore, in the second embodiment, when the joint interface 80 is analyzed by energy dispersive X-ray spectroscopy, the mass ratio of Al, Cu, O, and N is in the range of Al:Cu:O:N=50 to 90 wt %:1 to 10 wt %:2 to 20 wt %:25 wt % or less.

As a result, it is possible to prevent reactants of Cu and Al interfering the joint from being excessively generated in the joint interface 80, it is possible to sufficiently obtain the effect that the joint strength is improved due to a Cu atom.

In addition, the thickness of a portion in which the oxygen concentration is high is prevented from increasing in the joint interface 80, and it is possible to suppress cracks from being generated when a heat-load cycle is performed.

In addition, the metal plate 72 that becomes the circuit layer 62 is stacked on the first face of the ceramics substrate 61 composed of AlN with the copper foil 74 having a thickness of 0.15 μm to 3 μm (3 μm in the second embodiment) interposed therebetween, and the metal plate 73 (rolled plate made of 4N aluminum) that becomes the metal layer 63 is stacked on the second face of the ceramics substrate 61 with the copper foil 75 having a thickness of 0.15 μm to 3 μm (3 μm in the second embodiment) interposed therebetween, and the layered body is pressed and heated.

As a result, eutectic reaction of Cu of the copper foils 74 and 75 and Al of the metal plates 72 and 73 is generated, and the melting point of surface layer portions between the copper foils 74 and 75, and the metal plates 72 and 73 is lowered.

Consequently, even under relatively low-temperatures (610° C. to 650° C.), it is possible to form the fusion aluminum layers 76 and 77 at the boundary face between the ceramics substrate 61 and the metal plates 72 and 73, and it is possible to connect the ceramics substrate to the metal plate, and it is possible to connect the ceramics substrate 61 to the metal plates 72 and 73.

Third Embodiment

Next, a third embodiment of the present invention will be described.

Figure 12:
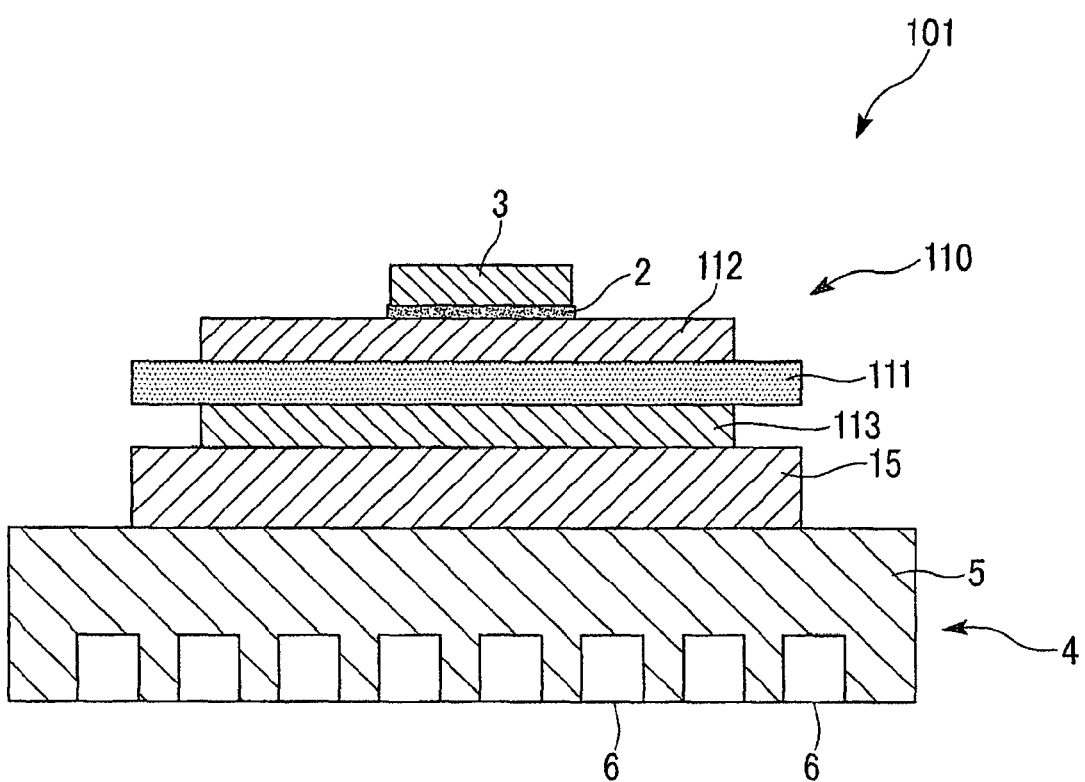
FIG. 12 is a schematic cross-sectional view showing a power module in which a power module substrate of a third embodiment of the present invention is employed.

FIG. 12 shows a power module substrate 110 and a power module 101 of a third embodiment of the present invention.

In the third embodiment, identical symbols are used for the elements which are identical to those of the first and the second embodiments, and the explanations thereof are omitted or simplified.

The power module substrate 110 includes a ceramics substrate 111, the circuit layer 112 that is disposed on a first face of the ceramics substrate 111 (upper face in FIG. 12) and a metal layer 113 that is disposed on a second face of the ceramics substrate 111 (lower face in FIG. 12).

The ceramics substrate 111 is a substrate used for preventing an electrical connection between the circuit layer 112 and the metal layer 113, and is made of $Si_3N_4$ (silicon nitride) with a high level of insulation.

In addition, the thickness of the ceramics substrate 111 is in a range of 0.2 to 1.5 mm, and is 0.32 mm in the third embodiment.

By connecting a metal plate 122 having a conductive property to the first face of the ceramics substrate 111, the circuit layer 112 is formed.

In the third embodiment, by connecting the metal plate 22 constituted of a rolled plate composed of aluminum having a purity of 99.99% or more (a so-called 4N aluminum) to the ceramics substrate 111, the circuit layer 112 is formed thereon.

By connecting a metal plate 123 to the second face of the ceramics substrate 111, the metal layer 113 is formed.

In the third embodiment, due to connecting the metal plate 123 constituted of a rolled plate composed of aluminum having a purity of 99.99% or more (a so-called 4N aluminum) to the ceramics substrate 111, the metal layer 113 is formed in a manner similar to the circuit layer 112.

Figure 13:
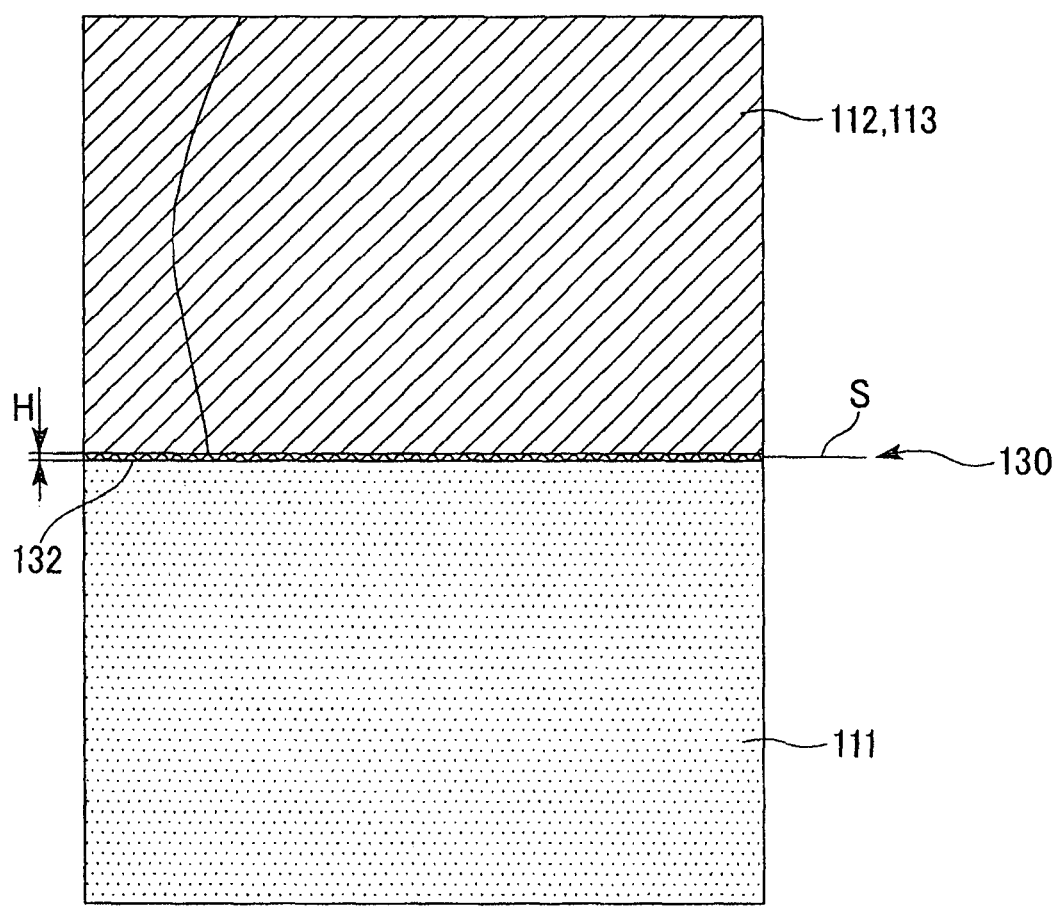
FIG. 13 is a schematic cross-sectional view showing the joint interface between a circuit layer, a metal layer (metal plate), and a ceramics substrate of the power module substrate of the third embodiment of the present invention.

Consequently, when the joint interface 130 between the ceramics substrate 111 and the circuit layer 112 (metal plate 122) and the joint interface 130 between the ceramics substrate 111 and the metal layer 113 (metal plate 123) are observed using a transmission electron microscope, a high-Cu concentration section 132 in which Cu is concentrated is formed at the joint interface 130 as shown in FIG. 13.

The Cu concentration in the high-Cu concentration section 132 is more than the Cu concentrations in the circuit layer 112 (metal plate 122) and in the metal layer 113 (metal plate 123).

Specifically, the Cu concentration in the joint interface 130 is more than twice the Cu concentrations in the circuit layer 112 and in the metal layer 113.

Here, in the third embodiment, the thickness H of the high-Cu concentration section 132 is less than or equal to 4 nm.

Furthermore, the oxygen concentration in the high-Cu concentration section 132 is greater than the oxygen concentrations in the circuit layer 112 and in the metal layer 113.

Here, in the joint interface 130 that is observed by a transmission electron microscope, the center between an end portion of the boundary face of the grid image of the circuit layer 112 (metal plate 122) and the metal layer 113 (metal plate 123), and an end portion of the boundary face of the grid image of the ceramics substrate 111, is defined as reference face S as shown in FIG. 13.

In addition, the Cu concentrations and the oxygen concentrations in the circuit layer 112 and in the metal layer 113 mean the Cu concentrations and the oxygen concentrations at the positions that are separated from the joint interface 130 by a predetermined distance (50 nm or more in the third embodiment) in the circuit layer 112 or the metal layer 13.

In addition, when the joint interface 130 is analyzed by energy dispersive X-ray spectroscopy (EDS), the mass ratio of Al, Si, Cu, O, and N is in the range of Al:Si:Cu:O:N=15 to 45 wt %:15 to 45 wt %:1 to 10 wt %:2 to 20 wt %:25 wt % or less.

In addition, when the analyzation is performed by the EDS, the diameter of the spot therefor is 1 to 4 nm, a plurality of points (for example, 100 points in the third embodiment) is measured at the joint interface 130, and the average value thereof is calculated.

In addition, the joint interface 130 between the crystalline grain of the metal plates 122 and 123 constituting the circuit layer 112 and the metal layer 113, and the ceramics substrate 111 is only measured, and the joint interface 130 between the crystalline grain boundary of the metal plates 122 and 123 constituting the circuit layer 112 and the metal layer 113, and the ceramics substrate 111 is not measured.

The foregoing power module substrate 110 is manufactured as described below.

Figure 14A:
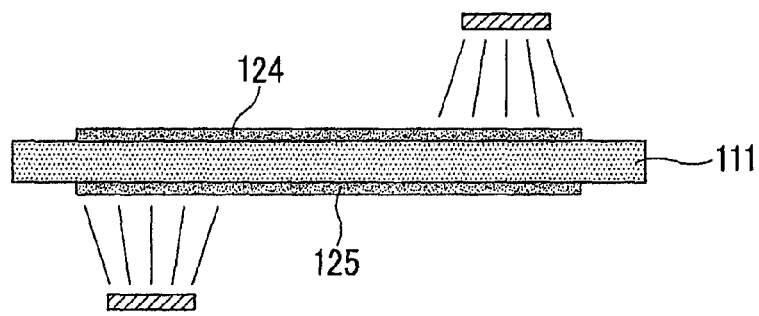
FIGS. 14A to 14D are cross-sectional views showing a method for manufacturing a power module substrate of the third embodiment of the present invention.
Figure 14B:
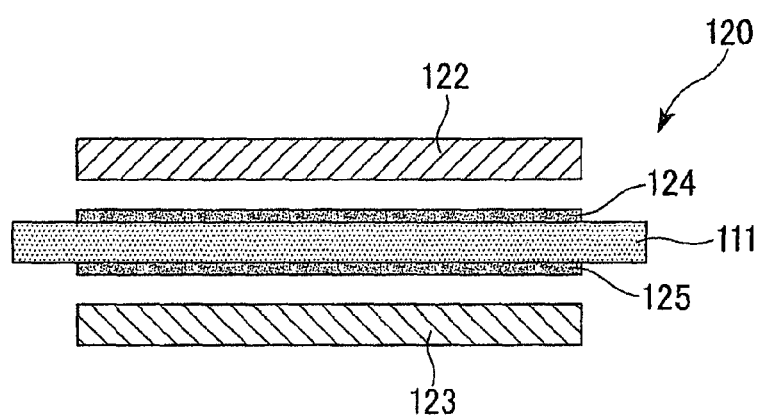
Figure 14C:
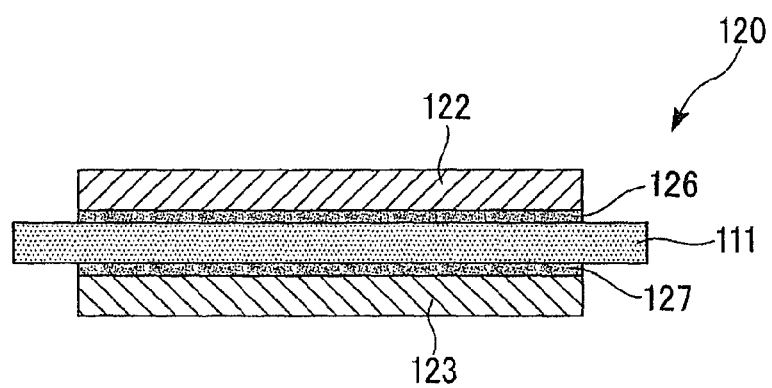

As shown in FIG. 14A, Cu is adhered to the both faces of the ceramics substrate 111 composed of $Si_3N_4$ by a vacuum deposition method, and Cu-adhesion layers 124 and 125 having a thickness of 0.15 μm to 3 μm are formed (Cu-adhering step).

Next, as shown in FIGS. 14B and 14C, and FIGS. 15A and 15B, the metal plate 122 (rolled plate made of 4N aluminum) that becomes the circuit layer 112 is stacked on the first face of the ceramics substrate 111 on which the Cu-adhesion layers 124 and 125 are formed, and the metal plate 123 (rolled plate made of 4N aluminum) that becomes the metal layer 113 is stacked on the second face of the ceramics substrate 111 (stacking step).

The layered body 120 that was formed in the above-described manner is heated in a state where the layered body 120 is pressed in the stacked direction thereof (pressure is 1 to 5 kgf/cm$^2$) and is set inside a vacuum furnace (pressing-heating step).

Here, in the vacuum furnace, the degree of vacuum is $10^{-3}$ Pa to $10^{-5}$ Pa, and the heating temperature is 610° C. to 650° C.

Due to the pressing-heating step, as shown in FIG. 15, the surface layers of metal plates 122 and 123 that become the circuit layer 112 and the metal layer 113 are melted with the Cu-adhesion layers 124 and 125, and fusion aluminum layers 126 and 127 are formed on the surface of the ceramics substrate 111.

Figure 14D:
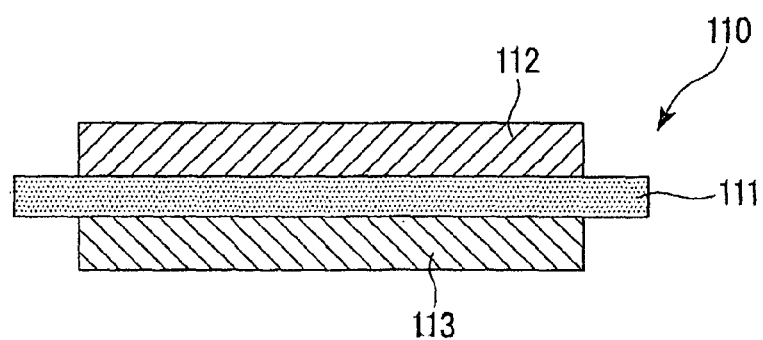
Figure 15A:
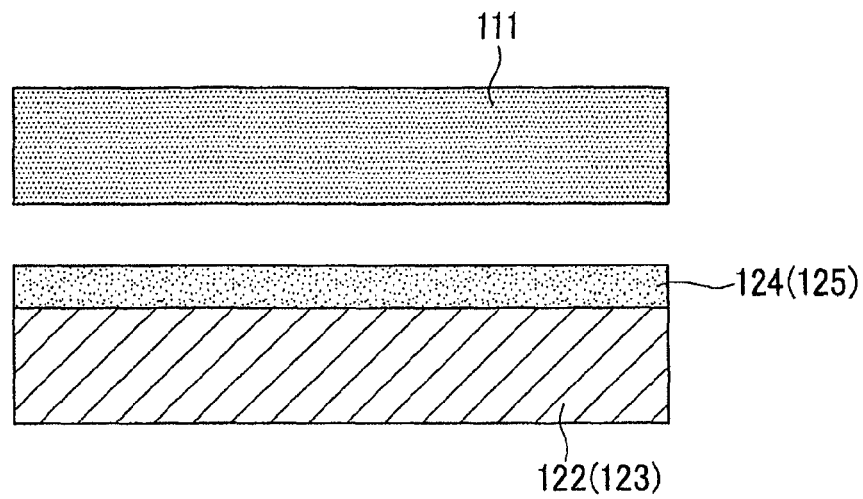
FIGS. 15A to 15C are cross-sectional views showing a near joint interface between the metal plate and the ceramics substrate in FIGS. 14A to 14D.
Figure 15B:
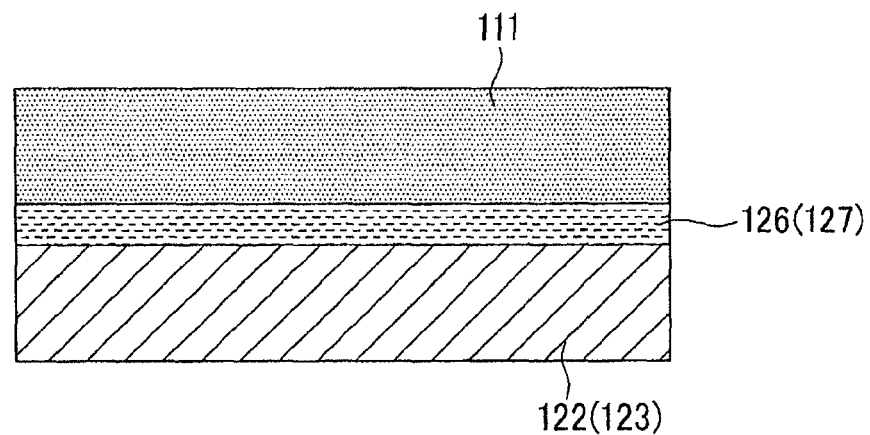
Figure 15C:
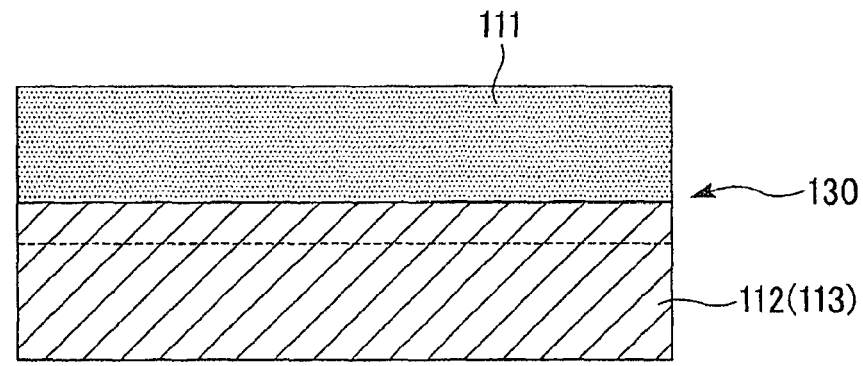

Subsequently, as shown in FIGS. 14D and 15C, by cooling the layered body 120, the fusion aluminum layers 126 and 127 are solidified (solidifying step).

Due to the pressing-heating step and the solidifying step, a high-Cu concentration section 132 having a Cu concentration and an oxygen concentration that are greater than the Cu concentrations and the oxygen concentrations in the metal plates 122 and 123 constituting the circuit layer 112 and the metal layer 113 is generated in the joint interface 130.

In the above-described manner, a power module substrate 110 of the third embodiment is manufactured.

In the power module substrate 110 having the above-described structure in the third embodiment, the high-Cu concentration section 132 having a Cu concentration that is more than twice the Cu concentrations in the circuit layer 112 and in the metal layer 113 is formed at the joint interface 130 between the circuit layer 112, the metal layer 113, and the ceramics substrate 111.

Furthermore, the oxygen concentration in the high-Cu concentration section 132 is greater than the oxygen concentrations in the circuit layer 112 and in the metal layer 113.

Because of this, oxygen atom and Cu atom intervene in the joint interface 130, and it is possible to improve the joint strength between the ceramics substrate 111 composed of $Si_3N_4$, the circuit layer 112, and the metal layer 113.

Furthermore, in the third embodiment, since the mass ratio of Al, Si, Cu, O, and N is in the range of Al:Si:Cu:O:N=15 to 45 wt %:15 to 45 wt %:1 to 10 wt %:2 to 20 wt %:25 wt % or less when the joint interface 130 is analyzed by energy dispersive X-ray spectroscopy (EDS), it is possible to prevent reactants of Cu and Al interfering the joint from being excessively generated in the joint interface 130, it is possible to sufficiently obtain the effect that the joint strength is improved due to a Cu atom.

In addition, the thickness of a portion in which the oxygen concentration is high is prevented from increasing in the joint interface 130, and it is possible to suppress cracks from being generated when a heat-load cycle is performed.

In addition, Cu is adhered to the both faces of the ceramics substrate 111 composed of $Si_3N_4$ by a vacuum deposition method, and the metal plate 122 (rolled plate made of 4N aluminum) that becomes the circuit layer 112 is stacked on the first face of the ceramics substrate 111 on which the Cu-adhesion layers 124 and 125 are formed, and the metal plate 123 (rolled plate made of 4N aluminum) that becomes the metal layer 113 is stacked on the second face of the ceramics substrate 111, and the layered body is pressed and heated.

As a result, due to the eutectic reaction of Cu of Cu-adhesion layers 124 and 125 and Al of the metal plates 122 and 123, the melting point of the surface layer portions of the metal plates 122 and 123 is lowered, even under relatively low-temperatures (610° C. to 650° C.), it is possible to form the fusion aluminum layers 126 and 127 at the boundary face between the ceramics substrate 111 and the metal plates 122 and 123, and it is possible to connect the ceramics substrate 111 to the metal plates 122 and 123.

As described above, the second and the third embodiments of the present invention are described, the technical scope of the present invention is not limited to the above embodiment, and various modifications may be made without departing from the scope of the present invention.

In the third embodiment, the manufacturing method is described for adhering Cu to the both-faces of the ceramics substrate, it is not limited to this method, Cu may be adhered to a face of the metal plate facing to the ceramics substrate 11 (connection face), and Cu may be adhered to both of the metal plate and the ceramics substrate.

In addition, the method for adhering Cu by a vacuum deposition method is described, it is not limited to this method, Cu may be adhered thereto by a sputtering method, a plating method, a method of applying a Cu-paste, or the like.

Fourth Embodiment

Figure 20:
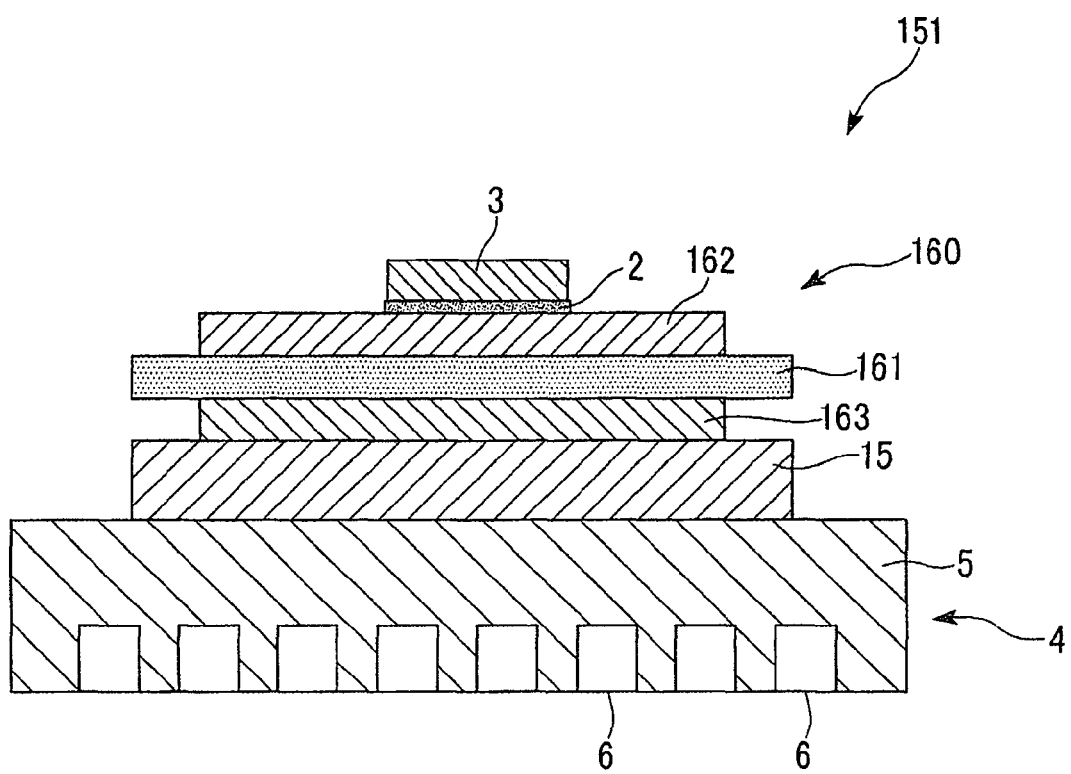
FIG. 20 is a schematic cross-sectional view showing a power module in which a power module substrate of a fourth embodiment of the present invention is employed.

FIG. 20 shows a power module substrate 160 and a power module 151 of a fourth embodiment of the present invention.

In the fourth embodiment, identical symbols are used for the elements which are identical to those of the first to the third embodiments, and the explanations thereof are omitted or simplified.

The power module 151 includes a power module substrate 160 on which a circuit layer 162 is disposed, a semiconductor chip 3 which is bonded to a top face of the circuit layer 162 with a solder layer 2 interposed therebetween, and a heatsink 4.

The power module substrate 160 includes a ceramics substrate 161, the circuit layer 162 that is disposed on a first face of the ceramics substrate 161 (upper face in FIG. 20) and a metal layer 163 that is disposed on a second face of the ceramics substrate 161 (lower face in FIG. 20).

The ceramics substrate 161 is a substrate used for preventing an electrical connection between the circuit layer 162 and the metal layer 163, and is made of $Al_2O_3$ (alumina) with a high level of insulation.

In addition, the thickness of the ceramics substrate 161 is in a range of 0.2 to 1.5 mm, and is 0.635 mm in the fourth embodiment.

By connecting a metal plate 172 having a conductive property to the first face of the ceramics substrate 161, the circuit layer 162 is formed.

In the fourth embodiment, by connecting the metal plate 172 constituted of a rolled plate composed of aluminum having a purity of 99.99% or more (a so-called 4N aluminum) to the ceramics substrate 161, the circuit layer 162 is formed thereon.

By connecting a metal plate 173 to the second face of the ceramics substrate 161, the metal layer 163 is formed.

In the fourth embodiment, due to connecting the metal plate 173 constituted of a rolled plate composed of aluminum having a purity of 99.99% or more (a so-called 4N aluminum) to the ceramics substrate 161, the metal layer 163 is formed in a manner similar to the circuit layer 162.

Figure 21:
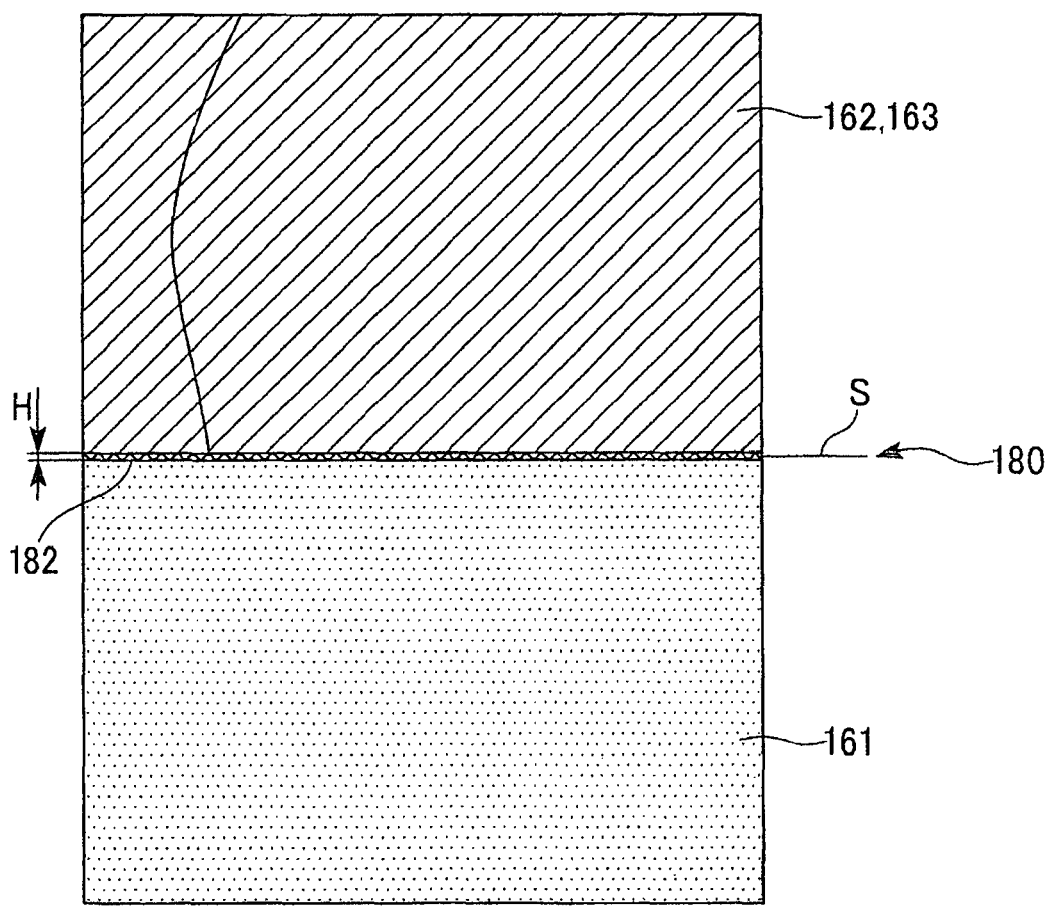
FIG. 21 is a schematic cross-sectional view showing the joint interface between a circuit layer, a metal layer (metal plate), and a ceramics substrate of the power module substrate of the fourth embodiment of the present invention.

Consequently, when the joint interface 180 between the ceramics substrate 161 and the circuit layer 162 (metal plate 172) and the joint interface 180 between the ceramics substrate 161 and the metal layer 163 (metal plate 173) are observed using a transmission electron microscope, a high-Cu concentration section 182 in which Cu is concentrated is formed at the joint interface 180 as shown in FIG. 21.

The Cu concentration in the high-Cu concentration section 182 is more than the Cu concentrations in the circuit layer 162 (metal plate 172) and in the metal layer 163 (metal plate 173).

Specifically, the Cu concentration in the joint interface 180 is more than twice the Cu concentrations in the circuit layer 162 and in the metal layer 163.

Here, in the fourth embodiment, the thickness H of the high-Cu concentration section 182 is less than or equal to 4 nm.

Here, in the joint interface 180 that is observed by a transmission electron microscope, the center between an end portion of the boundary face of the grid image of the circuit layer 162 (metal plate 172) and the metal layer 163 (metal plate 173), and an end portion of the boundary face of the grid image of the ceramics substrate 161, is defined as reference face S as shown in FIG. 21.

In addition, the Cu concentrations in the circuit layer 162 (metal plate 172) and in the metal layer 163 (metal plate 173) mean the Cu concentrations at the positions that are separated from the joint interface 180 by a predetermined distance (50 nm or more in the fourth embodiment) in the circuit layer 162 (metal plate 172) or the metal layer 163 (metal plate 173).

In addition, when the joint interface 180 is analyzed by energy dispersive X-ray spectroscopy (EDS), the mass ratio of Al, Cu, and O is in the range of Al:Cu:O=50 to 90 wt %:1 to 10 wt %:0 to 45 wt %.

In addition, when the analyzation is performed by the EDS, the diameter of the spot therefor is 1 to 4 nm, a plurality of points (for example, 100 points in the fourth embodiment) is measured at the joint interface 180, and the average value thereof is calculated.

In addition, the joint interface 180 between the crystalline grain of the metal plates 172 and 173 constituting the circuit layer 162 and the metal layer 163, and the ceramics substrate 161 is only measured, and the joint interface 180 between the crystalline grain boundary of the metal plates 172 and 173 constituting the circuit layer 162 and the metal layer 163, and the ceramics substrate 161 is not measured.

The foregoing power module substrate 160 is manufactured as described below.

Figure 22A:
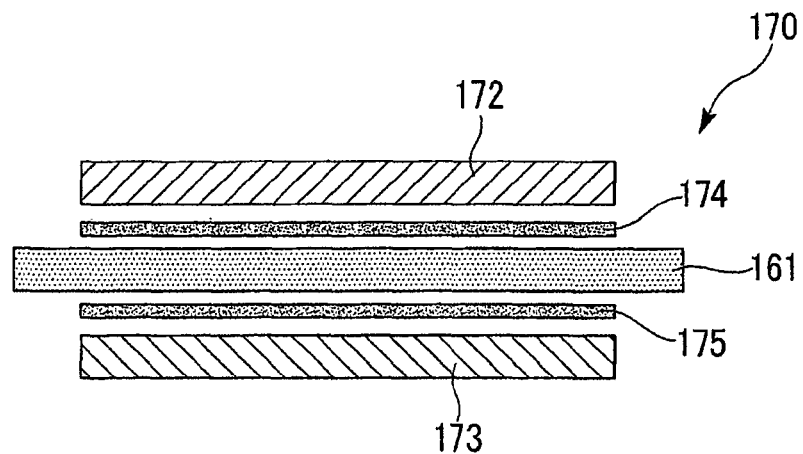
FIGS. 22A to 22C are cross-sectional views showing a method for manufacturing a power module substrate of the fourth embodiment of the present invention.
Figure 23A:
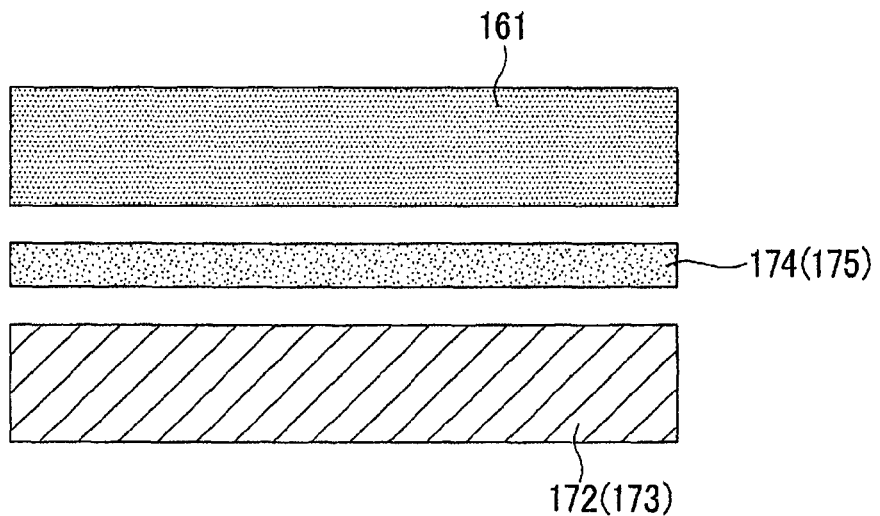
FIGS. 23A to 23C are cross-sectional views showing a near joint interface between the metal plate and the ceramics substrate in FIGS. 22A to 22C.

As shown in FIGS. 22A and 23A, the ceramics substrate 161 composed of $Al_2O_3$, a metal plate 172 (rolled plate made of 4N aluminum) that becomes a circuit layer 162, a copper foil 174 having a thickness of 0.15 μm to 3 μm (3 μm in the fourth embodiment), a metal plate 173 (rolled plate made of 4N aluminum) that becomes a metal layer 163, and a copper foil 175 having a thickness of 0.15 μm to 3 μm (3 μm in the fourth embodiment) are prepared.

Figure 22B:
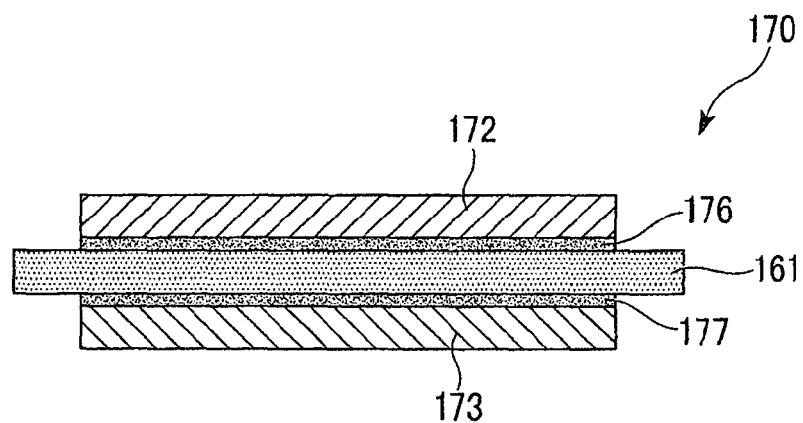
Figure 23B:
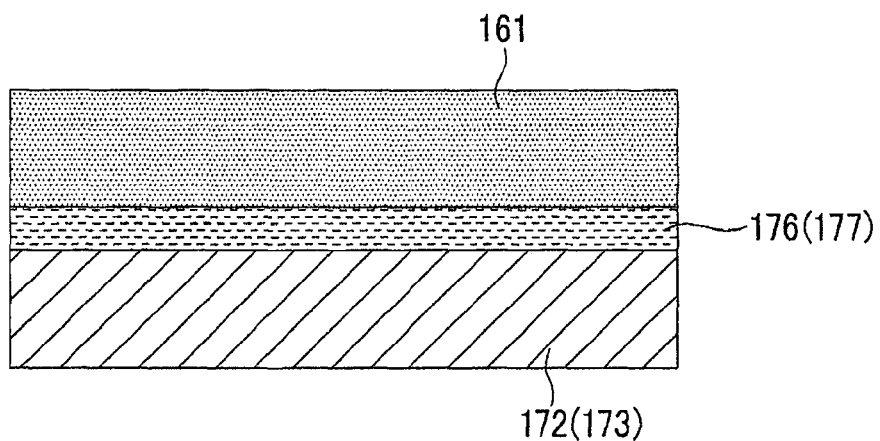

Next, as shown in FIGS. 22B and 23B, the metal plate 172 is stacked on a first face of the ceramics substrate 161 with the copper foil 174 interposed therebetween, and the metal plate 173 is stacked on a second face of the ceramics substrate 161 with the copper foil 175 interposed therebetween.

Consequently, a layered body 170 is formed.

Next, the layered body 170 is heated in a state where the layered body 170 is pressed in the stacked direction thereof (pressure is 1 to 5 kgf/cm²) and is set inside a vacuum furnace (pressing-heating step).

Here, in the vacuum furnace, the degree of vacuum is $10^{-3}$ Pa to $10^{-5}$ Pa, and the heating temperature is 610° C. to 650° C.

Due to the pressing-heating step, as shown in FIG. 23, the surface layers of metal plates 172 and 173 that become the circuit layer 162 and the metal layer 163 are melted with the copper foils 174 and 175, and fusion aluminum layers 176 and 177 are formed on the surface of the ceramics substrate 161.

Figure 22C:
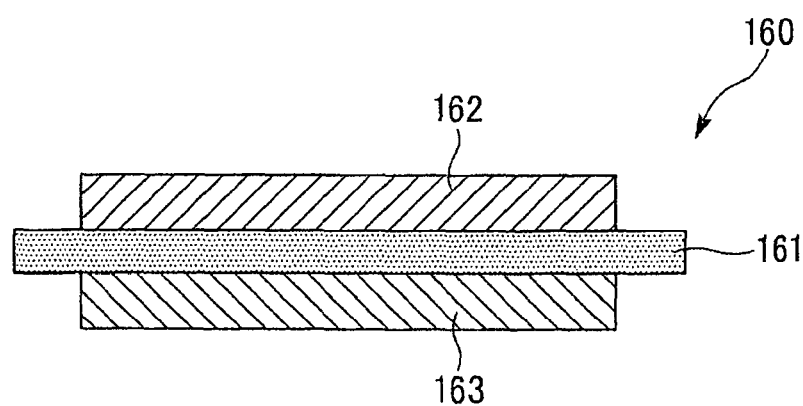
Figure 23C:
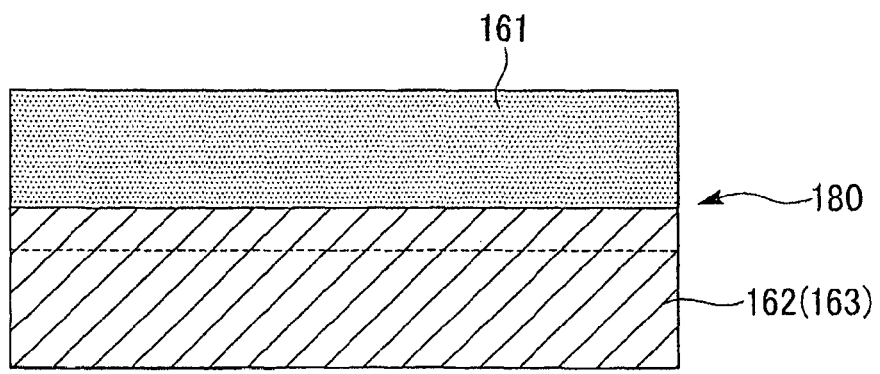

Subsequently, as shown in FIGS. 22C and 23C, by cooling the layered body 170, the fusion aluminum layers 176 and 177 are solidified (solidifying step).

Due to the pressing-heating step and the solidifying step, a high-Cu concentration section 182 having a Cu concentration that is greater than the Cu concentrations in the metal plates 172 and 173 constituting the circuit layer 162 and the metal layer 163 is generated in the joint interface 180.

In the above-described manner, a power module substrate 160 of the fourth embodiment is manufactured.

In the power module substrate 160 and the power module 151 having the above-described structure in the fourth embodiment, the high-Cu concentration section 182 having a Cu concentration that is more than twice the Cu concentrations in the circuit layer 162 and in the metal layer 163 is formed at the joint interface 180 between the circuit layer 162, the metal layer 163, and the ceramics substrate 161.

Because of this, Cu atom intervenes in the joint interface 180, and it is possible to improve the joint strength between the ceramics substrate 161 composed of $Al_2O_3$ and the circuit layer 162, and the joint strength between the ceramics substrate 161 and the metal layer 163.

Furthermore, in the fourth embodiment, when the joint interface 180 is analyzed by energy dispersive X-ray spectroscopy, the mass ratio of Al, Cu, and O is in the range of Al:Cu:O=50 to 90 wt %:1 to 10 wt %:0 to 45 wt %.

As a result, it is possible to prevent reactants of Cu and Al interfering the joint from being excessively generated in the joint interface 180, it is possible to sufficiently obtain the effect that the joint strength is improved due to a Cu atom.

In addition, the metal plate 172 that becomes the circuit layer 162 is stacked on the first face of the ceramics substrate 161 composed of $Al_2O_3$ with the copper foil 174 having a thickness of 0.15 μm to 3 μm (3 μm in the fourth embodiment) interposed therebetween, and the metal plate 173 (rolled plate made of 4N aluminum) that becomes the metal layer 163 is stacked on the second face of the ceramics substrate 161 with the copper foil 175 having a thickness of 0.15 μm to 3 μm (3 μm in the fourth embodiment) interposed therebetween, and the layered body is pressed and heated.

As a result, eutectic reaction of Cu of the copper foils 174 and 175 and Al of the metal plates 172 and 173 is generated, and the melting point of surface layer portions between the copper foils 174 and 175, and the metal plates 172 and 173 is lowered.

Consequently, even under relatively low-temperatures (610° C. to 650° C.), it is possible to form the fusion aluminum layers 176 and 177 at the boundary face between the ceramics substrate 161 and the metal plates 172 and 173, and it is possible to connect the ceramics substrate to the metal plate, and it is possible to connect the ceramics substrate 161 to the metal plates 172 and 173.

As described above, the fourth embodiment of the present invention is described, the technical scope of the present invention is not limited to the above embodiment, and various modifications may be made without departing from the scope of the present invention.

In the fourth embodiment of the present invention, the method for inserting the copper foil between the ceramics substrate and the metal plate in the stacking step, it is not limited to this method, before the stacking step, a Cu-layer may be formed by a Cu-adhering step for adhering Cu to at least one of a face of the metal plate (connection face) opposed to the ceramics substrate and a face of the ceramics substrate (connection face) opposed to the metal plate.

In addition, as a method for adhering Cu, for example, a vacuum deposition method, a sputtering method, a plating method, a method of applying a Cu-paste, or the like may be adopted.

Fifth Embodiment

Figure 26:
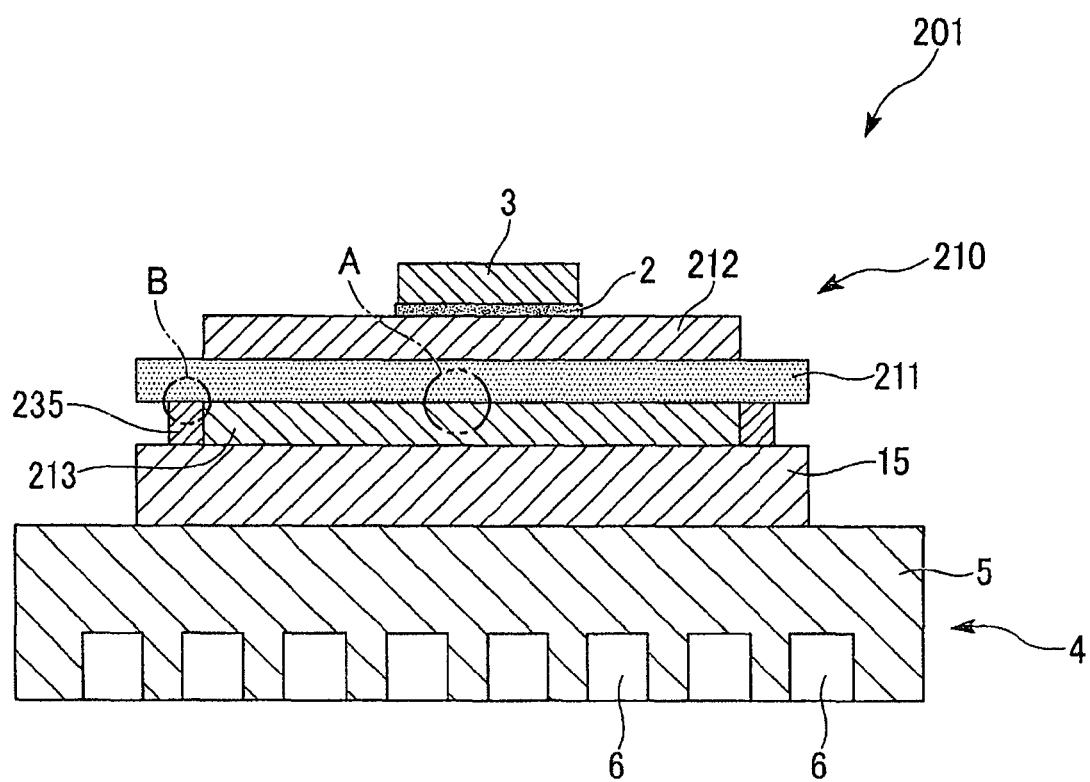
FIG. 26 is a schematic cross-sectional view showing a power module in which a power module substrate of a fifth embodiment of the present invention is employed.

FIG. 26 shows a power module substrate and a power module of a fifth embodiment of the present invention.

In the fifth embodiment, identical symbols are used for the elements which are identical to those of the first to the fourth embodiments, and the explanations thereof are omitted or simplified.

The power module 201 includes a power module substrate 210 on which a circuit layer 212 is disposed, a semiconductor chip 3 which is bonded to a top face of the circuit layer 212 with a solder layer 2 interposed therebetween, and a heatsink 4.

The power module substrate 210 includes a ceramics substrate 211, the circuit layer 212 that is disposed on a first face of the ceramics substrate 211 (upper face in FIG. 26) and a metal layer 213 that is disposed on a second face of the ceramics substrate 211 (lower face in FIG. 26).

The ceramics substrate 211 is a substrate used for preventing an electrical connection between the circuit layer 212 and the metal layer 213, and is made of AlN (aluminum nitride) with a high level of insulation.

In addition, the thickness of the ceramics substrate 211 is in a range of 0.2 to 1.5 mm, and is 0.635 mm in the fifth embodiment.

In addition, as shown in FIG. 26, the width of the ceramics substrate 211 is greater than the widths of the circuit layer 212 and the metal layer 213 in the fifth embodiment.

By connecting a metal plate 222 having a conductive property to the first face of the ceramics substrate 211, the circuit layer 212 is formed.

In the fifth embodiment, by connecting the metal plate 222 constituted of a rolled plate composed of aluminum having a purity of 99.99% or more (a so-called 4N aluminum) to the ceramics substrate 211, the circuit layer 212 is formed thereon.

Here, an Al—Si system brazing filler metal including Si that is a melting-point lowering element is used for connecting the ceramics substrate 211 to the metal plate 222.

By connecting a metal plate 223 to the second face of the ceramics substrate 211, the metal layer 213 is formed.

In the fifth embodiment, due to connecting the metal plate 223 constituted of a rolled plate composed of aluminum having a purity of 99.99% or more (a so-called 4N aluminum) to the ceramics substrate 211, the metal layer 213 is formed in a manner similar to the circuit layer 212.

Here, an Al—Si system brazing filler metal including Si that is a melting-point lowering element is used for connecting the ceramics substrate 211 to the metal plate 223.

Figure 27:
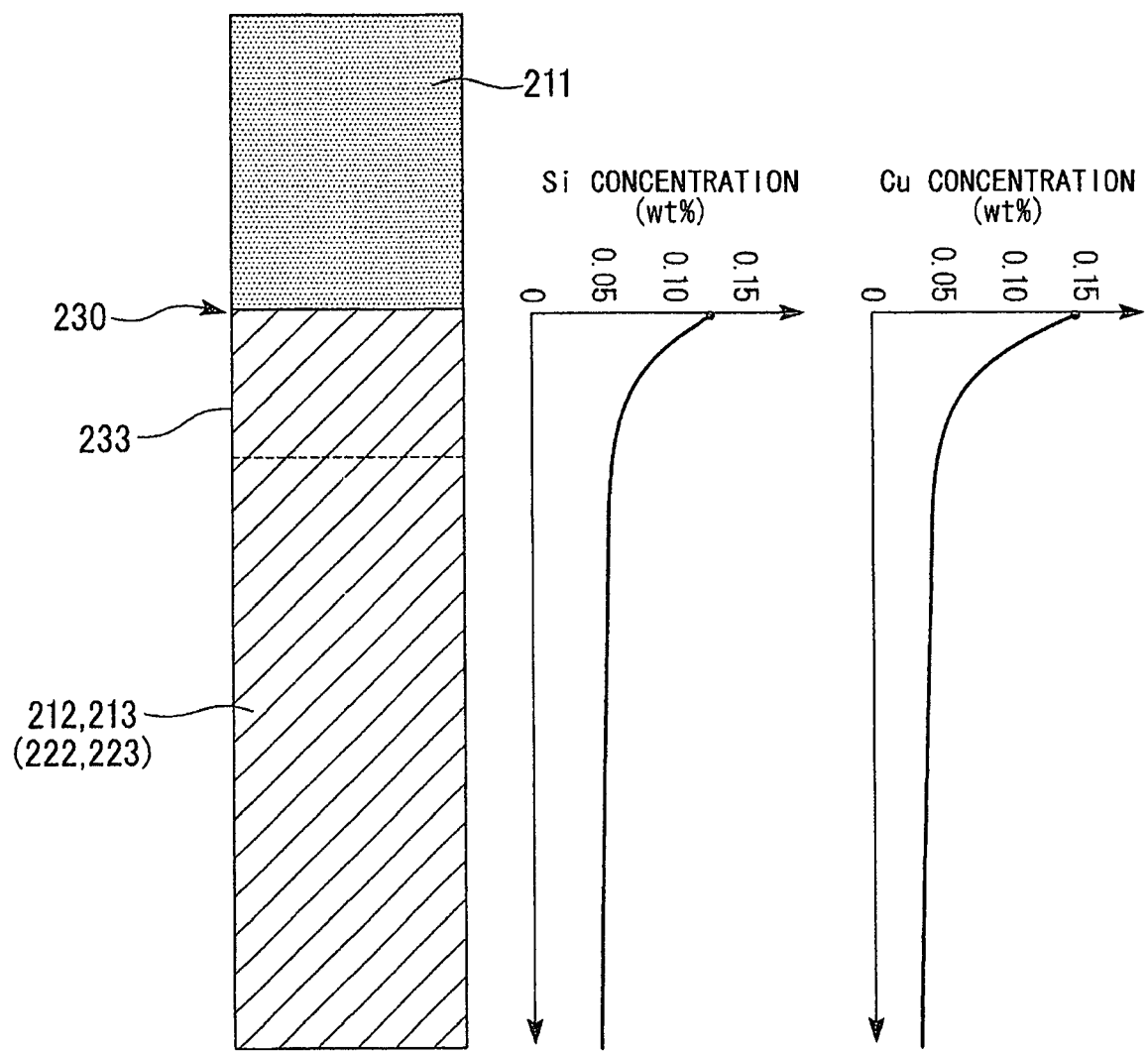
FIG. 27 is an explanatory diagram showing a Si concentration distribution and a Cu concentration distribution in a circuit layer and a metal layer of the power module substrate of the fifth embodiment of the present invention.

Consequently, as shown in FIG. 27, in the center portion in the width direction of the joint interface 230 between the ceramics substrate 211 and the circuit layer 212 (metal plate 222), and in the center portion (portion A in FIG. 26) in the width direction of the joint interface 230 between the ceramics substrate 211 and the metal layer 213 (metal plate 223), Si and Cu are diffused in the circuit layer 212 (metal plate 222) and in the metal layer 213 (metal plate 223), and a concentration-gradient layer 233 is formed in which the Si concentration and the Cu concentration gradually decrease with increasing the distance from the joint interface 230 in a stacked direction.

Here, in the portion which is close to the joint interface 230 of the concentration-gradient layer 233, the Si concentration is in the range of 0.05 to 0.5 wt % wt %, and the Cu concentration is in the range of 0.05 to 1.0 wt %.

In addition, the Si concentration and the Cu concentration in the portion which is close to the joint interface 230 of the concentration-gradient layer 233 is the average value of five points which are measured in the range from the joint interface 230 to 50 μm by use of an EPMA analyzation (diameter of spot is 30 μm).

Figure 28:
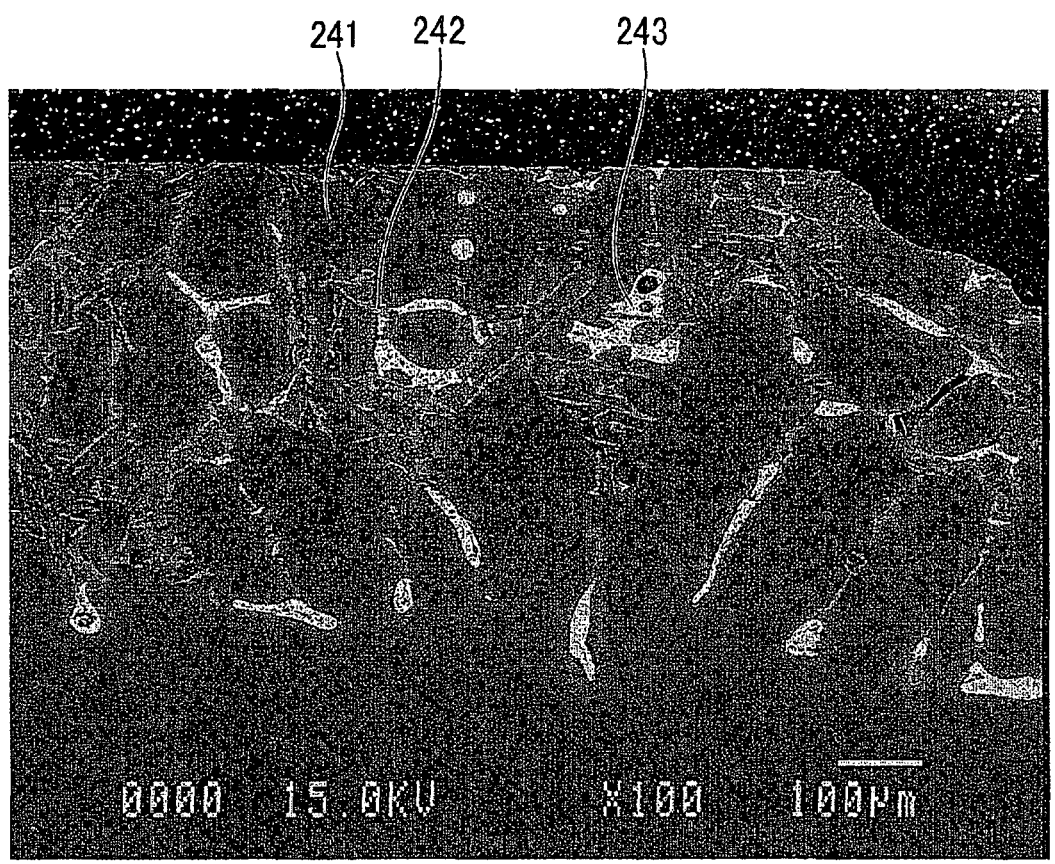
FIG. 28 is an explanatory diagram showing an end portion in a width direction of the joint interface between the circuit layer, the metal layer (metal plate), and the ceramics substrate of the power module substrate of the fifth embodiment of the present invention.

In addition, in the end portion 235 in the width direction of the joint interface 230 between the ceramics substrate 211 and the circuit layer 212 (metal plate 222), and in the end portion 235 (portion B in FIG. 26) in the width direction of the joint interface 230 between the ceramics substrate 211 and the metal layer 213 (metal plate 223), as shown in FIG. 28, an aluminum phase 241 in which Si and Cu are diffused in aluminum in a solid-solution state, a Si phase 242 in which the content rate of Si is greater than or equal to 98 wt %, and an eutectic phase 243 composed of a ternary eutectic structure including Al, Cu, and Si are formed.

In addition, precipitate particles composed of a compound including Cu (for example, $CuAl_2$) precipitate in the eutectic phase 243.

Figure 29:
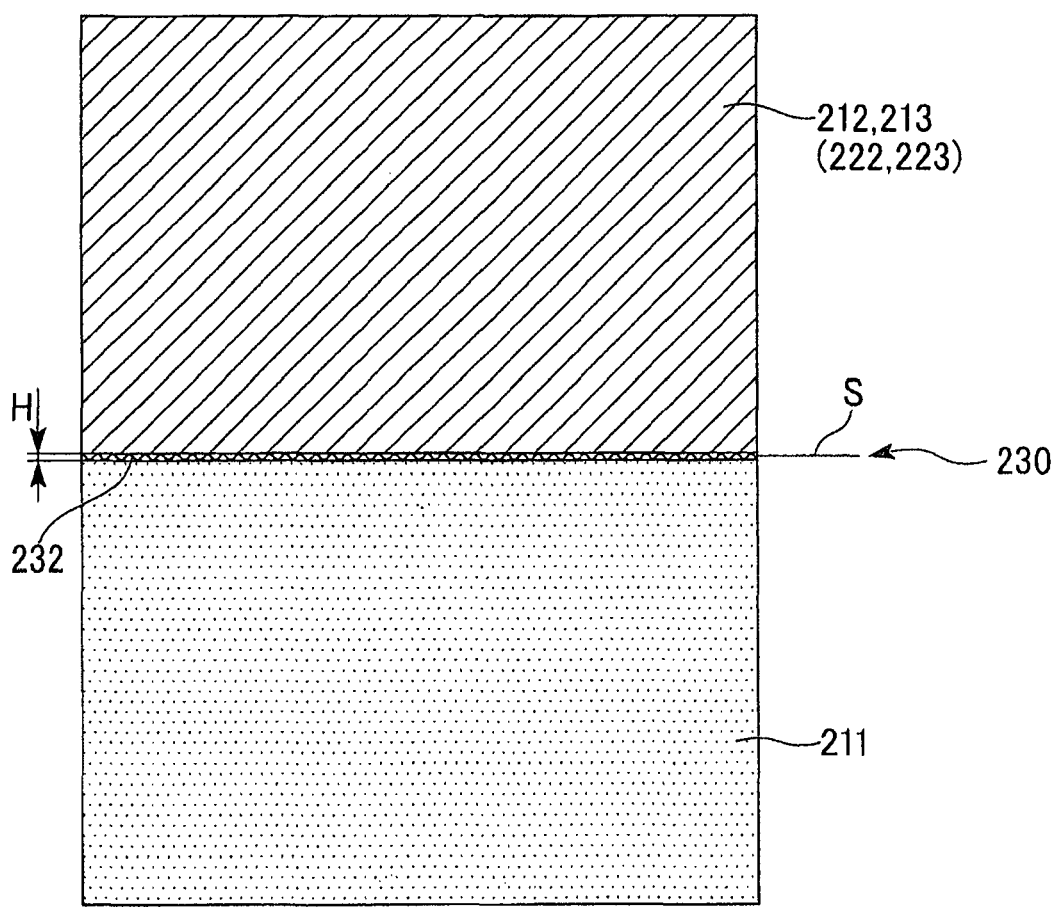
FIG. 29 is a schematic cross-sectional view showing the joint interface between a circuit layer, a metal layer (metal plate), and a ceramics substrate of the power module substrate of the fifth embodiment of the present invention.

In addition, when the joint interface 230 between the ceramics substrate 211 and the circuit layer 212 (metal plate 222) and the joint interface 230 between the ceramics substrate 211 and the metal layer 213 (metal plate 223) are observed using a transmission electron microscope, a high-Si concentration section 232 in which Si is concentrated is formed at the joint interface 230 as shown in FIG. 29.

The Si concentration in the high-Si concentration section 232 is more than five times the Si concentrations in the circuit layer 212 (metal plate 222) and in the metal layer 213 (metal plate 223).

In addition, the thickness H of the high-Si concentration section 232 is less than or equal to 4 nm.

Here, in the joint interface 230 that is observed by a transmission electron microscope, the center between an end portion of the boundary face of the grid image of the circuit layer 212 (metal plate 222) and the metal layer 213 (metal plate 223), and an end portion of the boundary face of the grid image of the ceramics substrate 211, is defined as reference face S as shown in FIG. 29.

The foregoing power module substrate 210 is manufactured as described below.

At first, Cu is adhered to the both faces of the ceramics substrate 211 composed of AlN by a sputtering method (Cu-adhering step).

Figure 30A:
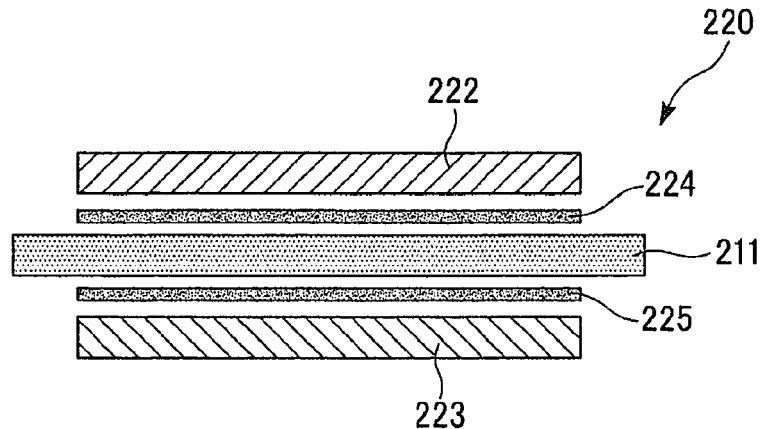
FIGS. 30A to 30C are cross-sectional views showing a method for manufacturing a power module substrate of the fifth embodiment of the present invention.
Figure 31A:
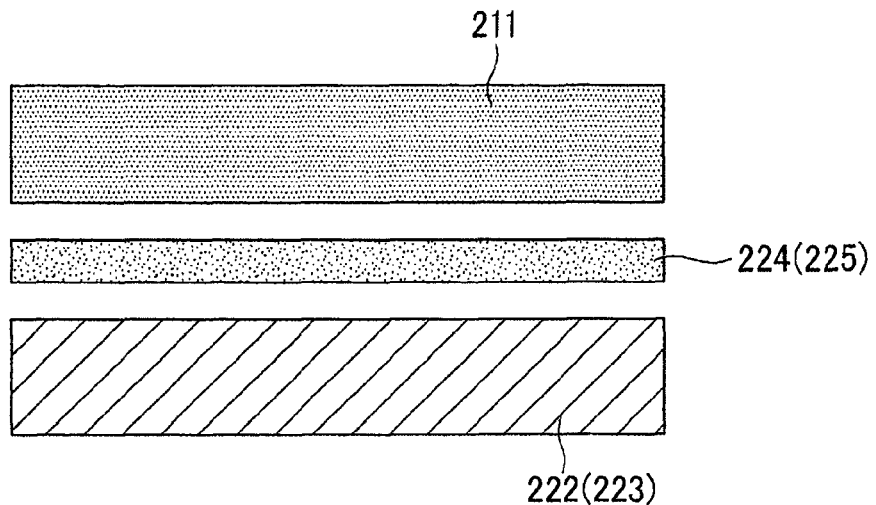
FIGS. 31A to 31C are cross-sectional views showing a near joint interface between the metal plate and the ceramics substrate in FIG. 29.

Subsequently, as shown in FIGS. 30A and 31A, the ceramics substrate 211 composed of AlN to which was Cu was adhered, a metal plate 222 (rolled plate made of 4N aluminum) that becomes a circuit layer 212, a brazing filler metal foil 224 having a thickness of 10 to 30 μm (20 μm in the fifth embodiment), a metal plate 223 (rolled plate made of 4N aluminum) that becomes a metal layer 213, and a brazing filler metal foil 225 having a thickness of 10 to 30 μm (20 μm in the fifth embodiment) are prepared.

Figure 30B:
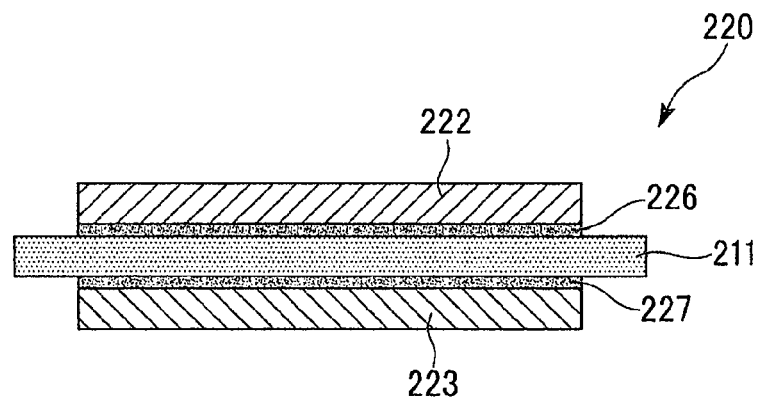
Figure 31B:
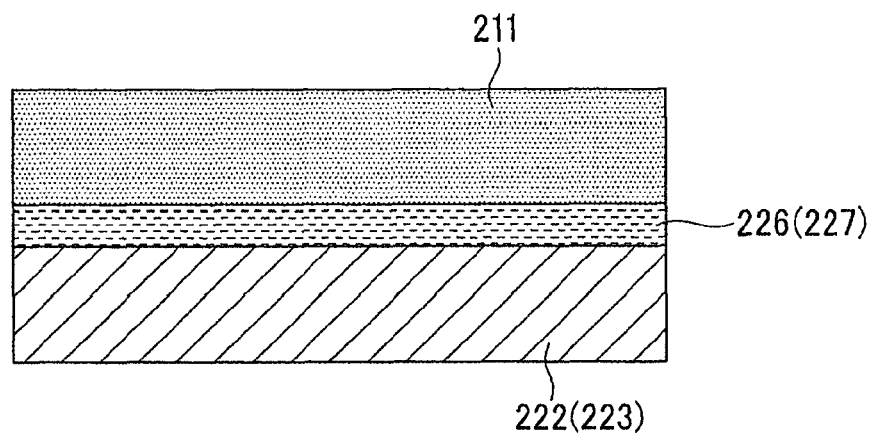

Next, as shown in FIGS. 30B and 31B, the metal plate 222 is stacked on a first face of the ceramics substrate 211 with the brazing filler metal foil 224 interposed therebetween, and the metal plate 223 is stacked on a second face of the ceramics substrate 211 with the brazing filler metal foil 225 interposed therebetween (stacking step).

Therefore, a layered body 220 is formed.

Next, the layered body 220 is heated in a state where the layered body 220 is pressed in the stacked direction thereof (pressure is 1 to 5 kgf/cm$^2$) and is set inside a vacuum furnace, and the brazing filler metal foils 224 and 225 are melted (melting step).

Here, the degree of vacuum is 10$^{-3}$ Pa to 10$^{-5}$ Pa in the vacuum furnace.

Due to the melting step, as shown in FIG. 31B, a part of the metal plates 222 and 223, which become the circuit layer 212 and the metal layer 213, and the brazing filler metal foils 224 and 225 are melted, and fusion aluminum layers 226 and 227 are formed on the surface of the ceramics substrate 211.

Figure 30C:
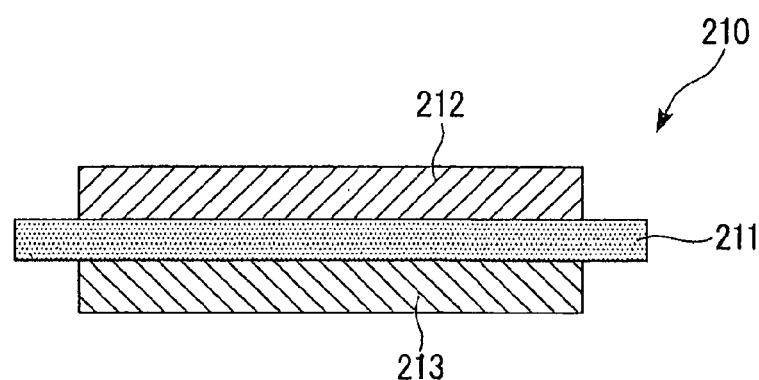
Figure 31C:
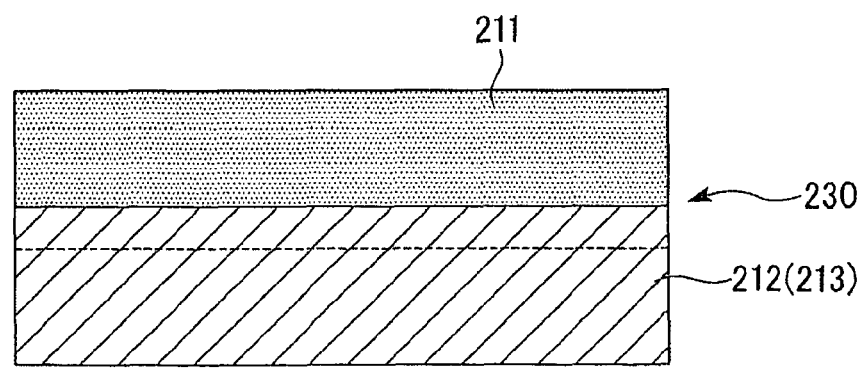

Subsequently, as shown in Figures. FIGS. 30C and 31C, by cooling the layered body 220, the fusion metal layers 226 and 227 are solidified (solidifying step).

In the above-described manner, the metal plates 222 and 223 that become the circuit layer 212 and the metal layer 213 are connected to the ceramics substrate 211, and the power module substrate 210 of the fifth embodiment is manufactured.

In the power module substrate 210 and the power module 201 of the fifth embodiment having the above-described structure, the circuit layer 212 (metal plate 222) and the metal layer 213 (metal plate 223) are connected to the ceramics substrate 211 by use of the Al—Si system brazing filler metal, and Cu is introduced into the joint interface 230 between the circuit layer 212 (metal plate 222), the metal layer 213 (metal plate 223), and the ceramics substrate 211.

Consequently, Cu and Al existing at the joint interface 230 are melted and reacted, even if the connecting is performed under the junction condition where a temperature is relatively low in a short time, it is possible to tightly connect the ceramics substrate 211 to the circuit layer 212 (metal plate 222) and the metal layer 213 (metal plate 223), and it is possible to considerably improve junction reliability.

In addition, in the center portion in the width direction of the joint interface 230 between the ceramics substrate 211 and the circuit layer 212 (metal plate 222), and in the center portion (portion A in FIG. 26) in the width direction of the joint interface 230 between the ceramics substrate 211 and the metal layer 213 (metal plate 223), Si and Cu are diffused in the circuit layer 212 (metal plate 222) and in the metal layer 213 (metal plate 223), and a concentration-gradient layer 233 is formed in which the Si concentration and the Cu concentration gradually decrease with increasing the distance from the joint interface 230 in a stacked direction.

In addition, since the Cu concentration in the portion of the concentration-gradient layer 233 which is close to the joint interface 230 is in the range of 0.05 to 1.0 wt %, the portions of the circuit layer 212 (metal plate 222) and the metal layer 213 (metal plate 223) which are close to the joint interface 230 are solid-solution strengthened, it is possible to prevent fractures from being generated at the circuit layer 212 (metal plate 222) and the metal layer 213 (metal plate 223).

In addition, since the Si concentration in the portion of the concentration-gradient layer 233 which is close to the joint interface 230 is in the range of 0.05 to 0.5 wt %, Si is sufficiently diffused in the circuit layer 212 (metal plate 222) and the metal layer 213 (metal plate 223).

For this reason, since the brazing filler metal is reliably melted and solidified, it is possible to tightly connect the ceramics substrate 211 to the circuit layer 212 (metal plate 222), and connect the ceramics substrate 211 to the metal layer 213 (metal plate 223).

Furthermore, the width of the ceramics substrate 211 is greater than the widths of the circuit layer 212 (metal plate 222) and the metal layer 213 (metal plate 223); the aluminum phase 241 in which Si and Cu are diffused in aluminum, the Si phase 242 in which the content rate of Si is greater than or equal to 98 wt %, and the eutectic phase 243 composed of a ternary eutectic structure including Al, Cu, and Si are formed at the end portion 235 in the width direction of the circuit layer 212 (metal plate 222) and the metal layer 213 (metal plate 223).

Consequently, the strength of the end portion 235 in the width direction of the circuit layer 212 (metal plate 222) and the metal layer 213 (metal plate 223) is improved.

Furthermore, since precipitate particles composed of a compound including Cu (for example, CuAl$_2$) precipitate in the eutectic phase 243, it is possible to further realize precipitation strengthening of the end portion 235 in the width direction.

As a result, it is possible to prevent fractures from being generated at the end portion 235 in the width direction of the circuit layer 212 (metal plate 222) and the metal layer 213 (metal plate 223).

In addition, in the fifth embodiment, the ceramics substrate 211 is composed of AlN, and the high-Si concentration section 232 having the Si concentration that is more than five times the Si concentrations in the circuit layer 212 (metal plate 222) and in the metal layer 213 (metal plate 223) is formed at the joint interface 230 between the metal plates 222 and 223 and the ceramics substrate 211.

Because of this, due to Si existing at the joint interface 230, it is possible to improve the joint strength between the ceramics substrate 211 and the metal plates 222 and 223.

Sixth Embodiment

Figure 32:
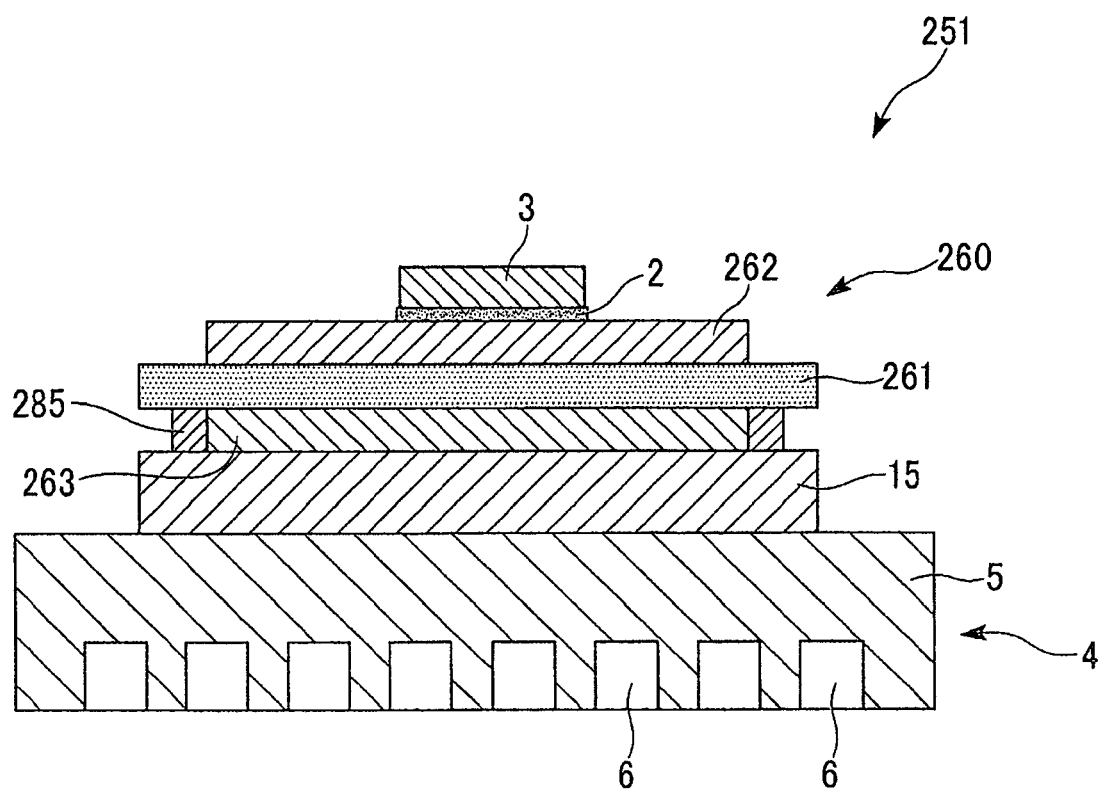
FIG. 32 is a schematic cross-sectional view showing a power module in which a power module substrate of a sixth embodiment of the present invention is employed.

Next, a sixth embodiment of the present invention will be described with reference to FIGS. 32 and 33.

In the sixth embodiment, identical symbols are used for the elements which are identical to those of the first to the fifth embodiments, and the explanations thereof are omitted or simplified.

The power module substrate 260 of the sixth embodiment is different from the fifth embodiment in terms of the ceramics substrate 261 being composed of Si$_3$N$_4$.

Figure 33:
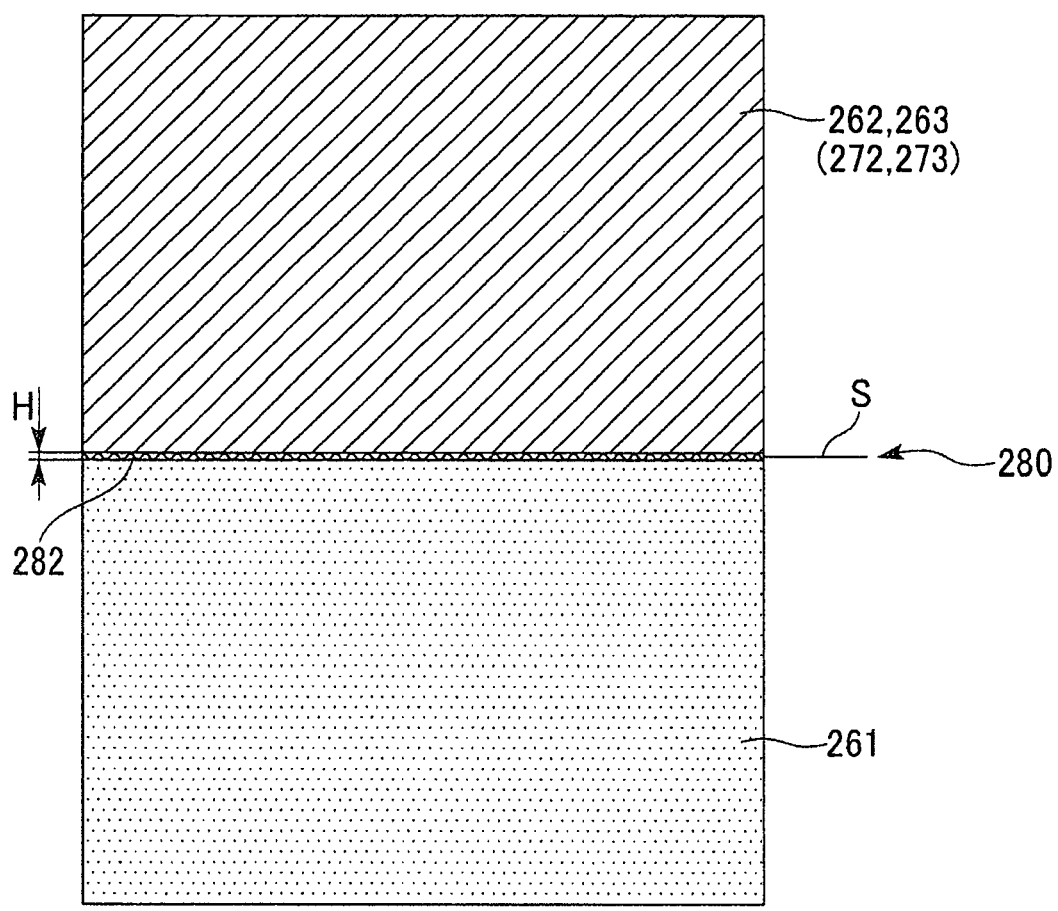
FIG. 33 is a schematic cross-sectional view showing the joint interface between a circuit layer, a metal layer (metal plate), and a ceramics substrate of the power module substrate of the sixth embodiment of the present invention.

Here, when the joint interface 280 between the ceramics substrate 261 and the circuit layer 262 (metal plate 272) and the joint interface 280 between the ceramics substrate 261 and the metal layer 263 (metal plate 273) are observed using a transmission electron microscope, a high-oxygen concentration section 282 in which oxygen is concentrated is formed at the joint interface 280 is observed as shown in FIG. 33.

The oxygen concentration in the high-oxygen concentration section 282 is greater than the oxygen concentrations in the circuit layer 262 (metal plate 272) and in the metal layer 263 (metal plate 273).

In addition, the thickness H of the high-oxygen concentration section 282 is less than or equal to 4 nm.

Here, in the joint interface 280 that is observed by a transmission electron microscope, the center between an end portion of the boundary face of the grid image of the circuit layer 262 (metal plate 272) and the metal layer 263 (metal plate 273), and an end portion of the joint boundary face of the grid image of the ceramics substrate 261, is defined as reference face S as shown in FIG. 33.

In the power module substrate 260 of the sixth embodiment having the above-described structure, since the high-oxygen concentration section 282 in which the oxygen concentration thereof is greater than the oxygen concentrations in the metal plates 272 and 273 that constitute the circuit layer 262 and the metal layer 263 is formed in the joint interface 280 between the ceramics substrate 261 and the metal plates 272 and 273 that become the circuit layer 262 and the metal layer 263, due to oxygen, it is possible to improve the joint strength between the ceramics substrate 261 and the metal plates 272 and 273.

In addition, since the thickness of the high-oxygen concentration section 282 is less than or equal to 4 nm, generation of crack is suppressed in the high-oxygen concentration section 282 due to the stress when a heat-load cycle is performed.

As described above, the first to the sixth embodiments of the present invention are described, the technical scope of the present invention is not limited to the above embodiment, and various modifications may be made without departing from the scope of the present invention.

For example, the case where a rolled plate composed of aluminum having a purity of 99.99% is adopted as a metal plate constituting the circuit layer and the metal layer is described, however, it is not limited to this method, and aluminum having a purity of 99% (2N aluminum) may be used.

In addition, the case where the buffer layer composed of aluminum, an aluminum alloy, or a combination of materials including aluminum (for example, AlSiC or the like) is provided between the top panel section of the heatsink and the metal layer is described, however, it is not necessary to provide the buffer layer.

Moreover, the structure in which the heatsink is formed of aluminum is described, however, a structure in which the heatsink is formed of an aluminum alloy, a composite material including aluminum, copper, a copper alloy or the like may be employed.

Furthermore, the structure having the flow passage of cooling medium as a heatsink is described, however, the structure of the heatsink is not limited.

In addition, in the fifth embodiment, the case where the ceramics substrate composed of AlN is used is described, it is not limited to this structure, and a ceramics composed of $Al_2O_3$ or the like may be used.

In addition, the manufacturing method is described having the Cu-adhering step in which Cu is adhered to a surface of the ceramics substrate, it is not limited to this method, and Cu may be adhered to a surface of a brazing filler metal foil.

In addition, not only a sputtering method, but also Cu may be adhered thereto by an evaporation method, a plating method, or the like.

In addition, Cu may be introduced into an Al—Si system brazing filler metal.

EXAMPLES

Next, the results of confirmatory experiments which were performed in order to confirm the effectivity of the power module substrate (power module) of the above-described first to sixth embodiments are described.

Example 1

In the example 1 described below, with reference to FIGS. 6 and 7, the results of confirmatory experiments which were performed in order to confirm the effectivity of the power module substrate of the first embodiment are described.

Firstly, as the power module substrate used for the experiment, a power module substrate was manufactured by the following method of manufacturing.

Specifically, a ceramics substrate composed of AlN having 40 mm square and a thickness of 0.635 mm, and two metal plates composed of aluminum 4N having a thickness of 0.6 mm were prepared.

Thereafter, Cu was adhered to the both faces of the ceramics substrate by a vacuum deposition, and a layered body was formed by stacking the metal plates on both faces of the ceramics substrate.

The layered body was heated in a vacuum furnace (the degree of vacuum is $10^{-3}$ Pa to $10^{-5}$ Pa) in a state where a pressure of 1 to 5 $kgf/cm^2$ was applied thereto in a stacked direction, and a power module substrate provided with a ceramics substrate, a circuit layer, and a metal layer was manufactured.

In a way similar to the above-described manner, a ceramics substrate composed of AlN having 40 mm of square and a thickness of 0.635 mm, and two metal plates composed of aluminum 4N having a thickness of 0.6 mm were prepared.

Thereafter, Cu was adhered to one of the faces of each metal plate by a vacuum deposition, the metal plate was stacked on the both faces of the ceramics substrate so that the face of the metal plate on which the evaporation is performed faces the ceramics substrate, and thereby a layered body is formed.

The layered body was heated in a vacuum furnace (the degree of vacuum is $10^{-3}$ Pa to $10^{-5}$ Pa) in a state where a pressure of 1 to 5 $kgf/cm^2$ was applied thereto in a stacked direction, and a power module substrate provided with a ceramics substrate, a circuit layer, and a metal layer was manufactured.

As described above, in the example 1, two kinds of power module substrates were employed.

Here, adherence amounts of the adhered Cu (thickness of Cu) by vacuum deposition were different from each other by five parameters (five levels), and were 0.1 μm, 0.5 μm, 1.0 μm, 2.0 μm, and 3.0 μm.

In addition, the heating temperatures were different from each other by three parameters (three levels), and were 610° C., 630° C., and 650° C.

Consequently, a total of thirty kinds of power module substrates were prepared.

An aluminum plate (A6063) was connected to the metal layer of the power module substrate that were formed in this manner with a buffer layer composed of AlSiC and having a thickness of 0.9 mm interposed therebetween, the aluminum plate corresponding to a top panel of a heatsink, and having lengths of 50 mm and 60 mm and a thickness of 5 mm.

Consequently, a total of thirty kinds of test pieces were prepared.

Subsequently, before the thirty kinds of test pieces being subjected to a heat-load cycle test, the percentage of connected-surface area (junction rate) in the joint interface between the ceramics substrate and the metal plate was determined.

Specifically, by use of an ultrasonic imaging device (frequency of transducer is 15 MHz), the joint interface between the ceramics substrate and the metal plate was captured, the data that has been obtained by the capturing was binarized, the junction rate was calculated by obtaining the surface area of a bonded portion of the entirety of the joint interface.

In addition, the junction rate between a ceramics substrate and a metal plate was 100%, before a heat-load cycle test is performed.

Subsequently, a total of thirty kinds of test pieces were subjected to heat-load cycles of −40° C. to 105° C. by 3000 times under load.

Thereafter, by the same method as the above-described method in which the ultrasonic imaging device was used, the junction rate between a ceramics substrate and a metal plate, that is, the junction rate after the 3000 heat-load cycles were performed, was determined.

As a result, evaluation results of the power module substrate were obtained.

Figure 6:
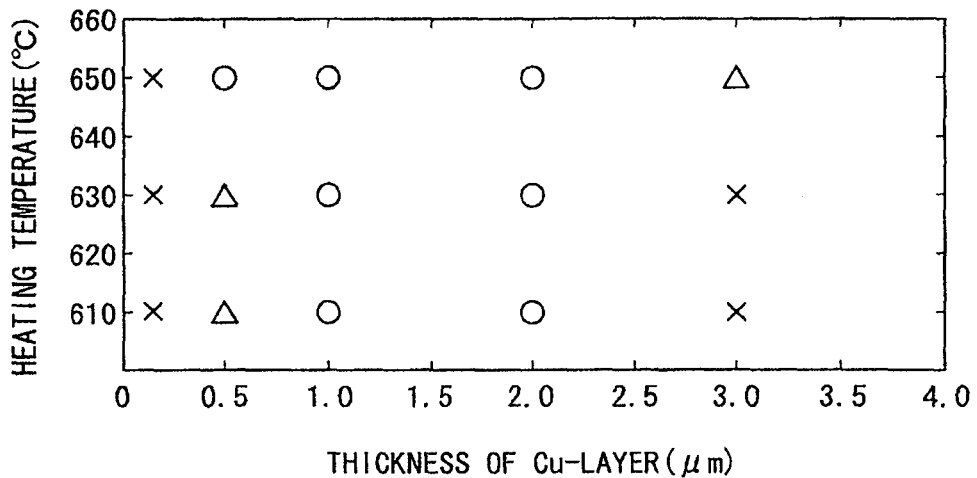
FIG. 6 is a diagram showing an evaluation result of junction reliability in a first example.

An evaluation result of the power module substrate that is obtained by evaporating and adhering Cu to the ceramics substrate is shown in FIG. 6.

Figure 7:
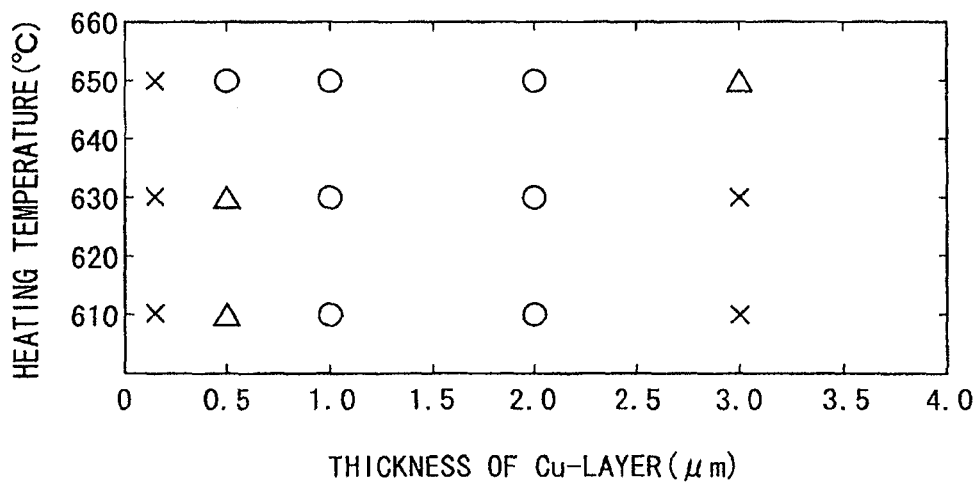
FIG. 7 is a diagram showing an evaluation result of junction reliability in the first example.

In addition, an evaluation result of the power module substrate that is obtained by evaporating and adhering Cu to the metal plate is shown in FIG. 7.

In addition, in FIGS. 6 and 7, the power module substrate is represented by the symbol "◯", in which the junction rate was 85% or more after the power module substrate is subjected to a 3000 cyclical thermal load; the power module substrate is represented by the symbol "Δ", in which the junction rate was greater than or equal to 70% and less than 85% after the power module substrate is subjected to a 3000 cyclical thermal load; and the power module substrate is represented by the symbol "X", in which the junction rate was less than 70% after the power module substrate is subjected to a 3000 cyclical thermal load.

As shown in FIGS. 6 and 7, it was confirmed that, as the heating temperature increases, the junction reliability was improved.

In addition, in the case where the thickness of the Cu-layer is approximately 1.0 μm to 2.0 μm, even if the heating temperature is low, it was confirmed that the junction reliability was improved.

Furthermore, FIGS. 6 and 7 shows the same tendency, it was not confirmed that the difference between the case where Cu was adhered to the ceramics substrate and the case where Cu was adhered to the metal plate.

Example 2

In the example 2 described below, with reference to FIGS. 16A, 16B, 17A, and 17B, the results of confirmatory experiments which were performed in order to confirm the effectivity of the power module substrate of the second embodiment are described.

Firstly, as the power module substrate used for the experiment, a power module substrate was manufactured by the following method of manufacturing.

Specifically, a ceramics substrate composed of AlN having 40 mm square and a thickness of 0.635 mm, and two metal plates composed of aluminum 4N having a thickness of 0.6 mm were prepared.

Thereafter, Cu was adhered to the both faces of the ceramics substrate by a vacuum deposition, and a layered body was formed by stacking the metal plates on both faces of the ceramics substrate.

The layered body was heated in a vacuum furnace (the degree of vacuum is $10^{-3}$ Pa to $10^{-5}$ Pa) in a state where a pressure of 1 to 5 kgf/cm² was applied thereto in a stacked direction, and a power module substrate provided with a ceramics substrate, a circuit layer, and a metal layer was manufactured.

In a way similar to the above-described manner, a ceramics substrate composed of AlN having 40 mm of square and a thickness of 0.635 mm, and two metal plates composed of aluminum 4N having a thickness of 0.6 mm were prepared.

Thereafter, Cu was adhered to one of the faces of each metal plate by a vacuum deposition, the metal plate was stacked on the both faces of the ceramics substrate so that the face of the metal plate on which the evaporation is performed faces the ceramics substrate, and thereby a layered body is formed.

The layered body was heated in a vacuum furnace (the degree of vacuum is $10^{-3}$ Pa to $10^{-5}$ Pa) in a state where a pressure of 1 to 5 kgf/cm² was applied thereto in a stacked direction, and a power module substrate provided with a ceramics substrate, a circuit layer, and a metal layer was manufactured.

As described above, in the example 2, two kinds of power module substrates were employed.

Here, adherence amounts of the adhered Cu (thickness of Cu) by vacuum deposition were different from each other by five parameters (five levels), and were 0.1 μm, 0.5 μm, 1.0 μm, 2.0 μm, and 3.0 μm.

In addition, the heating temperatures were different from each other by three parameters (three levels), and were 610° C., 630° C., and 650° C.

Consequently, a total of thirty kinds of power module substrates were formed.

An aluminum plate (A6063) was connected to the metal layer of the power module substrate that were formed in this manner with a buffer layer composed of 4N aluminum and having a thickness of 0.9 mm interposed therebetween, the aluminum plate corresponding to a top panel of a heatsink, and having lengths of 50 mm and 60 mm and a thickness of 5 mm.

Consequently, a total of thirty kinds of test pieces were prepared.

Subsequently, before the thirty kinds of test pieces being subjected to a heat-load cycle test, the percentage of connected-surface area (junction rate) in the joint interface between the ceramics substrate and the metal plate was determined.

As a method for calculating the junction rate, the method for calculating the junction rate by use of an ultrasonic imaging device (frequency of transducer is 15 MHz) was adopted as described in Example 1.

In addition, the junction rate between a ceramics substrate and a metal plate was 100%, before a heat-load cycle test is performed.

Subsequently, a total of thirty kinds of test pieces were subjected to heat-load cycles of –40° C. to 105° C. by 3000 times under load, and the presence or absence of cracks in the ceramics substrate was confirmed.

In addition, in this experiment, two sets of thirty kinds of test pieces were prepared, and the presence or absence of cracks in the ceramics substrate was confirmed.

Figure 16A:
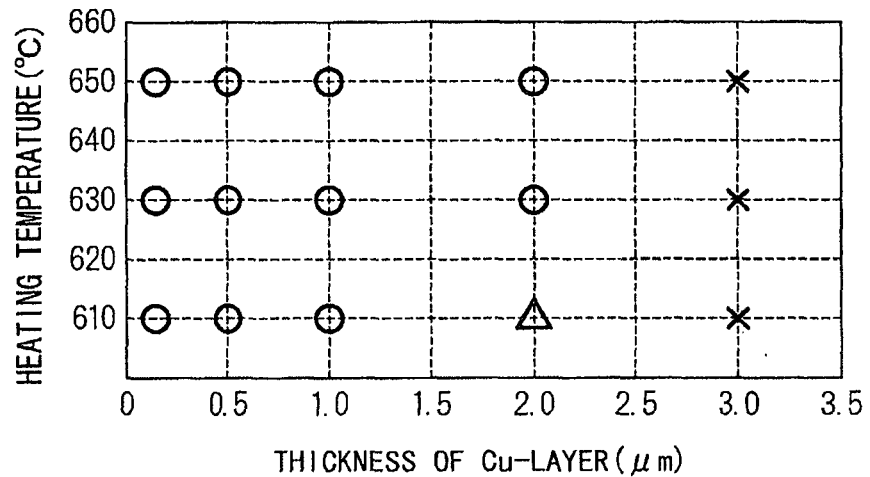
FIGS. 16A and 16B are diagrams showing an evaluation result of cracking in a ceramics substrate in a second example.
Figure 16B:
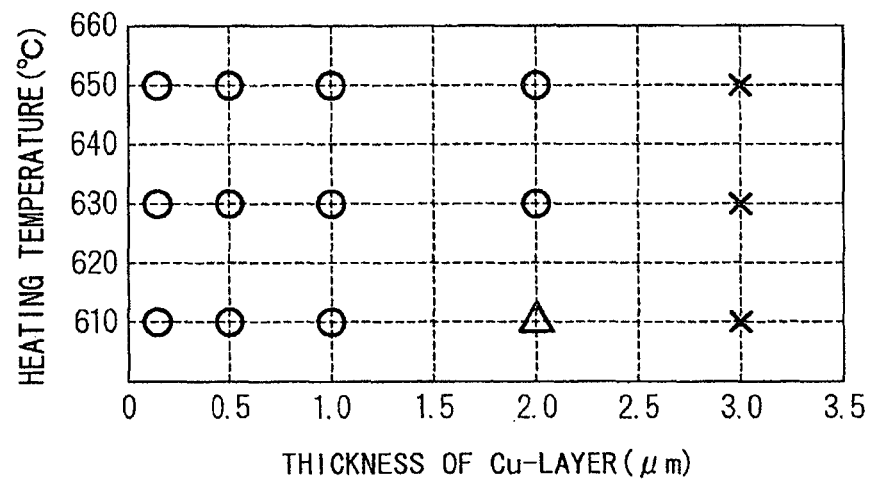

The results were shown in FIGS. 16A and 16B.

An evaluation result of the power module substrate that is obtained by evaporating and adhering Cu to the ceramics substrate is shown in FIG. 16A.

In addition, an evaluation result of the power module substrate that is obtained by evaporating and adhering Cu to the metal plate is shown in FIG. 16B.

In addition, the power module substrate is represented by the symbol "◯", in which cracks were not generated in the ceramics substrate in both two test pieces, the power module substrate is presented by the symbol "Δ", in which cracks were generated in the ceramics substrate in one of two test pieces, and the power module substrate is represented by the symbol "X", in which cracks were generated in the ceramics substrate in both two test pieces.

In addition, the junction rate of a total of thirty kinds of test pieces was determined after the 3000 heat-load cycles described above were performed.

Specifically, by the same method as the above-described method in which the ultrasonic imaging device was used, the junction rate between a ceramics substrate and a metal plate, that is, the junction rate after the 3000 heat-load cycles were performed, was determined.

As a result, evaluation results of the power module substrate were obtained.

Figure 17A:
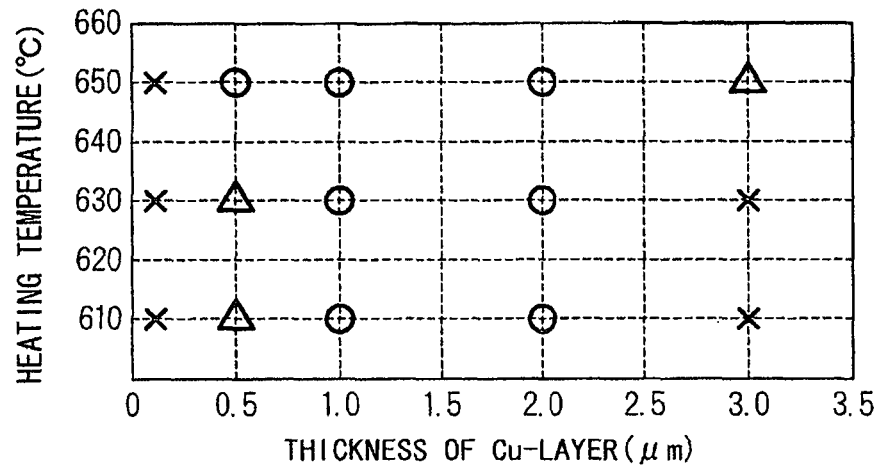
FIGS. 17A and 17B are diagrams showing an evaluation result of junction reliability in the second example.

An evaluation result of the power module substrate that is obtained by evaporating and adhering Cu to the ceramics substrate is shown in FIG. 17A.

Figure 17B:
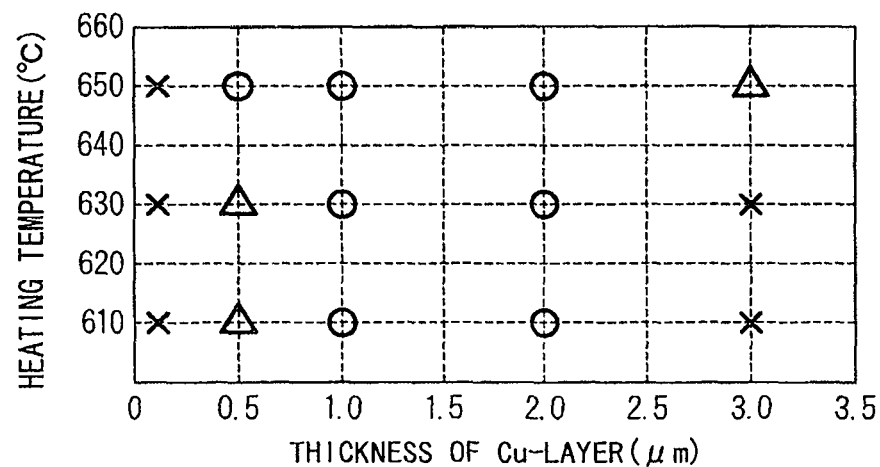

In addition, an evaluation result of the power module substrate that is obtained by evaporating and adhering Cu to the metal plate is shown in FIG. 17B.

In addition, in FIGS. 17A and 17B, the power module substrate is represented by the symbol "○", in which the junction rate is 85% or more after the power module substrate is subjected to a 3000 cyclical thermal load; the power module substrate is represented by the symbol "Δ", in which the junction rate is greater than or equal to 70% and less than 85% after the power module substrate is subjected to a 3000 cyclical thermal load; and the power module substrate is represented by the symbol "X", in which the junction rate is less than 70% after the power module substrate is subjected to a 3000 cyclical thermal load.

As shown in FIGS. 16A and 16B, it was confirmed that, as the thickness of Cu formed in a Cu-adhering step increases, cracks in the ceramics substrate composed of AlN are easily generated.

In addition, in the test piece in which the thickness of Cu is 2 μm, it was confirmed that, as the heating temperature increases, cracks in the ceramics are suppressed more.

In addition, as shown in FIGS. 17A and 17B, it was confirmed that, as the heating temperature increases, the junction reliability was improved.

In addition, in the case where the thickness of Cu is approximately 2 μm, even if the heating temperature is low, it was confirmed that the junction reliability was improved.

According to the test result, in the ceramics substrate composed of AlN, it is confirmed that the thickness of Cu existing at the boundary face between the metal plate and the ceramics substrate is preferably less than or equal to 2.5 μm at the time of connecting.

Example 3

In the example 3 described below, with reference to FIGS. 18A and 18B, and FIGS. 19A and 19B, the results of confirmatory experiments which were performed in order to confirm the effectivity of the power module substrate of the third embodiment are described.

Firstly, as the power module substrate used for the experiment, a power module substrate was manufactured by the following method of manufacturing.

Specifically, a ceramics substrate composed of $Si_3N_4$ having 40 mm square and a thickness of 0.32 mm, and two metal plates composed of aluminum 4N having a thickness of 0.6 mm were prepared.

Thereafter, Cu was adhered to the both faces of the ceramics substrate by a vacuum deposition, and a layered body was formed by stacking the metal plates on both faces of the ceramics substrate.

The layered body was heated in a vacuum furnace (the degree of vacuum is $10^{-3}$ Pa to $10^{-5}$ Pa) in a state where a pressure of 1 to 5 $kgf/cm^2$ was applied thereto in a stacked direction, and a power module substrate provided with a ceramics substrate, a circuit layer, and a metal layer was manufactured.

In a way similar to the above-described manner, a ceramics substrate composed of $Si_3N_4$ having 40 mm of square and a thickness of 0.32 mm, and two metal plates composed of aluminum 4N having a thickness of 0.6 mm were prepared.

Thereafter, Cu was adhered to one of the faces of each metal plate by a vacuum deposition, the metal plate was stacked on the both faces of the ceramics substrate so that the face of the metal plate on which the evaporation is performed faces the ceramics substrate, and thereby a layered body is formed.

The layered body was heated in a vacuum furnace (the degree of vacuum is $10^{-3}$ Pa to $10^{-5}$ Pa) in a state where a pressure of 1 to 5 $kgf/cm^2$ was applied thereto in a stacked direction, and a power module substrate provided with a ceramics substrate, a circuit layer, and a metal layer was manufactured.

As described above, in the example 3, two kinds of power module substrates were employed.

Here, adherence amounts of the adhered Cu (thickness of Cu) by vacuum deposition were different from each other by five parameters (five levels), and were 0.1 μm, 0.5 μm, 1.0 μm, 2.0 μm, and 3.0 μm.

In addition, the heating temperatures were different from each other by three parameters (three levels), and were 610° C., 630° C., and 650° C.

Consequently, a total of thirty kinds of power module substrates were formed.

An aluminum plate (A6063) was connected to the metal layer of the power module substrate that were formed in this manner with a buffer layer composed of 4N aluminum and having a thickness of 0.9 mm interposed therebetween, the aluminum plate corresponding to a top panel of a heatsink, and having lengths of 50 mm and 60 mm and a thickness of 5 mm.

Consequently, a total of thirty kinds of test pieces were prepared.

Subsequently, before the thirty kinds of test pieces being subjected to a heat-load cycle test, the percentage of connected-surface area (junction rate) in the joint interface between the ceramics substrate and the metal plate was determined.

As a method for calculating the junction rate, the method for calculating the junction rate by use of an ultrasonic imaging device (frequency of transducer is 15 MHz) was adopted as described in Example 1.

In addition, the junction rate between a ceramics substrate and a metal plate was 100%, before a heat-load cycle test is performed.

Subsequently, a total of thirty kinds of test pieces were subjected to heat-load cycles of −40° C. to 105° C. by 3000 times under load, and the presence or absence of cracks in the ceramics substrate was confirmed.

In addition, in this experiment, two sets of thirty kinds of test pieces were prepared, and the presence or absence of cracks in the ceramics substrate was confirmed.

Figure 18A:
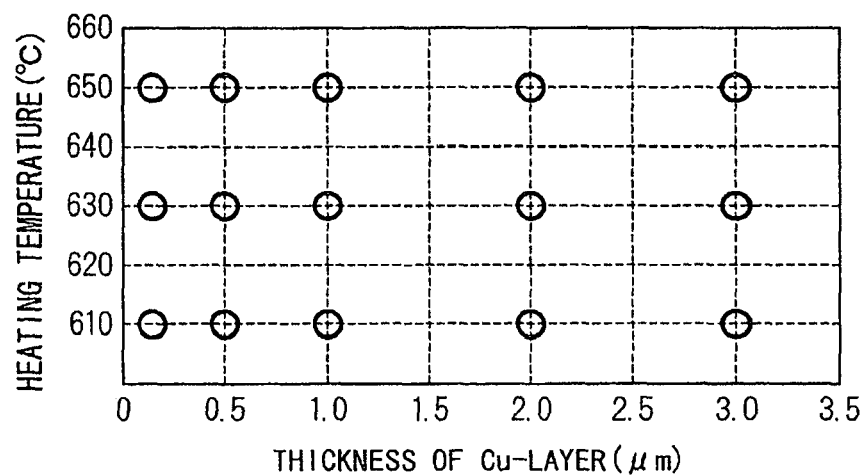
FIGS. 18A and 18B are diagrams showing an evaluation result of cracking in a ceramics substrate in a third example.
Figure 18B:
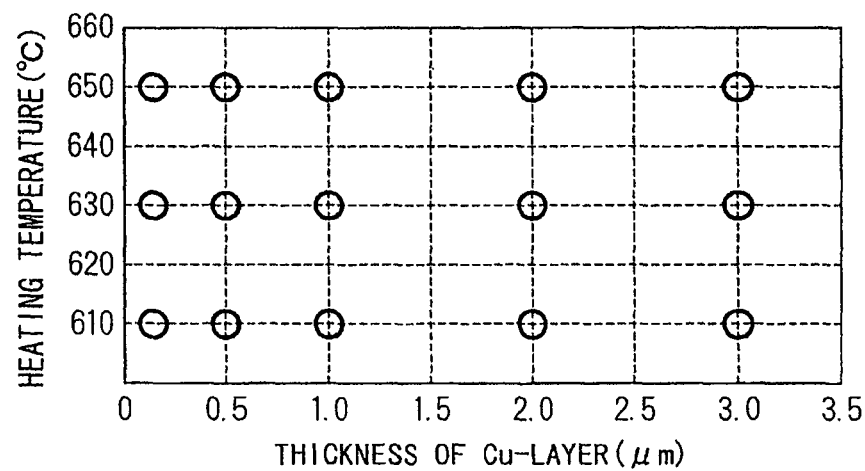

The results were shown in FIGS. 18A and 18B.

An evaluation result of the power module substrate that is obtained by evaporating and adhering Cu to the ceramics substrate is shown in FIG. 18A.

In addition, an evaluation result of the power module substrate that is obtained by evaporating and adhering Cu to the metal plate is shown in FIG. 18B.

In addition, the power module substrate is represented by the symbol "○", in which cracks were not generated in the ceramics substrate in both two test pieces, the power module substrate is presented by the symbol "Δ", in which cracks were generated in the ceramics substrate in one of two test pieces, and the power module substrate is represented by the symbol "X", in which cracks were generated in the ceramics substrate in both two test pieces.

In addition, the junction rate of a total of thirty kinds of test pieces was determined after the 3000 heat-load cycles described above were performed.

Specifically, by the same method as the above-described method in which the ultrasonic imaging device was used, the junction rate between a ceramics substrate and a metal plate, that is, the junction rate after the 3000 heat-load cycles were performed, was determined.

As a result, evaluation results of the power module substrate were obtained.

Figure 19A:
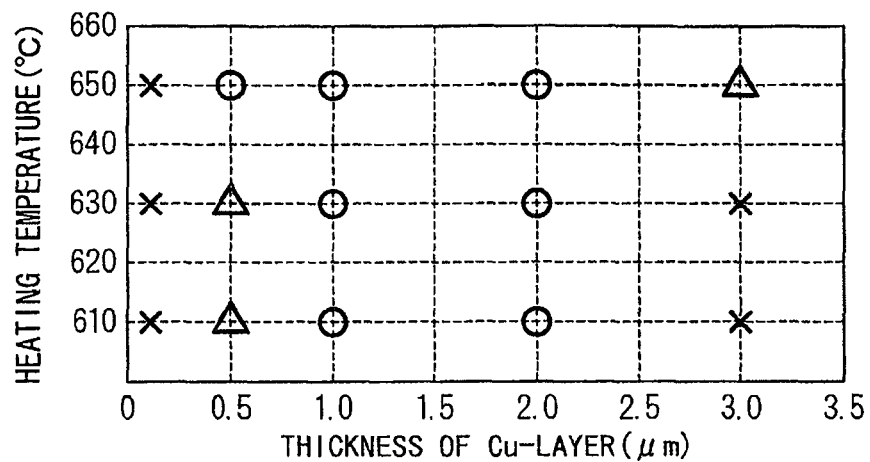
FIGS. 19A and 19B are diagrams showing an evaluation result of junction reliability in the third example.

An evaluation result of the power module substrate that is obtained by evaporating and adhering Cu to the ceramics substrate is shown in FIG. 19A.

Figure 19B:
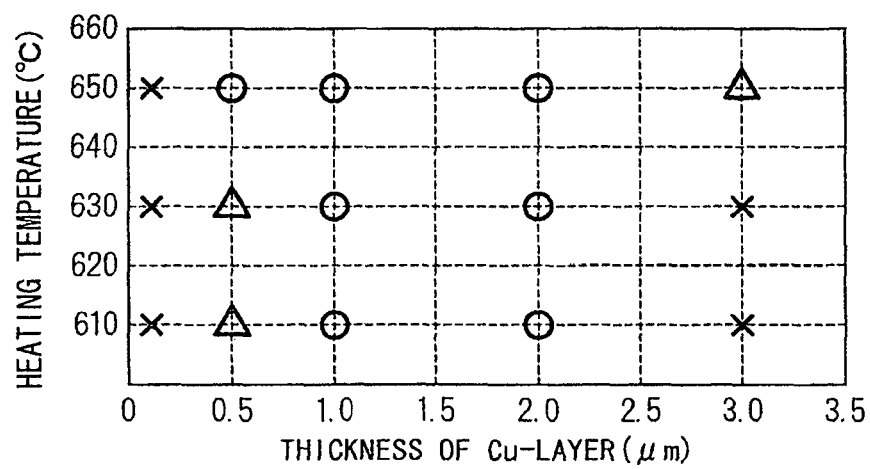

In addition, an evaluation result of the power module substrate that is obtained by evaporating and adhering Cu to the metal plate is shown in FIG. 19B.

In addition, in FIGS. 19A and 19B, the power module substrate is represented by the symbol "○", in which the junction rate is 85% or more after the power module substrate is subjected to a 3000 cyclical thermal load; the power module substrate is represented by the symbol "Δ", in which the junction rate is greater than or equal to 70% and less than 85% after the power module substrate is subjected to a 3000 cyclical thermal load; and the power module substrate is represented by the symbol "X", in which the junction rate is less than 70% after the power module substrate is subjected to a 3000 cyclical thermal load.

As shown in FIGS. 18A and 18B, in the ceramics substrate composed of $Si_3N_4$, cracks in the ceramics substrate were not confirmed under the condition of the present experiment.

In addition, as shown in FIGS. 19A and 19B, it was confirmed that, as the heating temperature increases, the junction reliability was improved.

In addition, in the case where the thickness of Cu is approximately 2.0 μm, even if the heating temperature is low, it was confirmed that the junction reliability was improved.

According to the test result, in the ceramics substrate composed of $Si_3N_4$, it is confirmed that the thickness of Cu existing at the boundary face between the metal plate and the ceramics substrate is preferably 0.15 μm to 3 μm at the time of connecting.

Example 4

In the example 4 described below, with reference to FIGS. 24A, 24B, 25A, and 25B, the results of confirmatory experiments which were performed in order to confirm the effectivity of the power module substrate of the fourth embodiment are described.

Firstly, as the power module substrate used for the experiment, a power module substrate was manufactured by the following method of manufacturing.

Specifically, a ceramics substrate composed of $Al_2O_3$ having 40 mm square and a thickness of 0.635 mm, and two metal plates composed of aluminum 4N having a thickness of 0.6 mm were prepared.

Thereafter, Cu was adhered to the both faces of the ceramics substrate by a vacuum deposition, and a layered body was formed by stacking the metal plates on both faces of the ceramics substrate.

The layered body was heated in a vacuum furnace (the degree of vacuum is $10^{-3}$ Pa to $10^{-5}$ Pa) in a state where a pressure of 1 to 5 kgf/$cm^2$ was applied thereto in a stacked direction, and a power module substrate provided with a ceramics substrate, a circuit layer, and a metal layer was manufactured.

In a way similar to the above-described manner, a ceramics substrate composed of $Al_2O_3$ having 40 mm of square and a thickness of 0.635 mm, and two metal plates composed of aluminum 4N having a thickness of 0.6 mm were prepared.

Thereafter, Cu was adhered to one of the faces of each metal plate by a vacuum deposition, the metal plate was stacked on the both faces of the ceramics substrate so that the face of the metal plate on which the evaporation is performed faces the ceramics substrate, and thereby a layered body is formed.

The layered body was heated in a vacuum furnace (the degree of vacuum is $10^{-3}$ Pa to $10^{-5}$ Pa) in a state where a pressure of 1 to 5 kgf/$cm^2$ was applied thereto in a stacked direction, and a power module substrate provided with a ceramics substrate, a circuit layer, and a metal layer was manufactured.

As described above, in the example 4, two kinds of power module substrates were employed.

Here, adherence amounts of the adhered Cu (thickness of Cu) by vacuum deposition were different from each other by five parameters (five levels), and were 0.1 μm, 0.5 μm, 1.0 μm, 2.0 μm, and 3.0 μm.

In addition, the heating temperatures were different from each other by three parameters (three levels), and were 610° C., 630° C., and 650° C.

Consequently, a total of thirty kinds of power module substrates were formed.

An aluminum plate (A6063) was connected to the metal layer of the power module substrate that were formed in this manner with a buffer layer composed of 4N aluminum and having a thickness of 0.9 mm interposed therebetween, the aluminum plate corresponding to a top panel of a heatsink, and having lengths of 50 mm and 60 mm and a thickness of 5 mm.

Consequently, a total of thirty kinds of test pieces were prepared.

Subsequently, before the thirty kinds of test pieces being subjected to a heat-load cycle test, the percentage of connected-surface area (junction rate) in the joint interface between the ceramics substrate and the metal plate was determined.

As a method for calculating the junction rate, the method for calculating the junction rate by use of an ultrasonic imaging device (frequency of transducer is 15 MHz) was adopted as described in Example 1.

In addition, the junction rate between a ceramics substrate and a metal plate was 100%, before a heat-load cycle test is performed.

Subsequently, a total of thirty kinds of test pieces were subjected to heat-load cycles of −40° C. to 105° C. by 3000 times under load, and the presence or absence of cracks in the ceramics substrate was confirmed.

In addition, in this experiment, two sets of thirty kinds of test pieces were prepared, and the presence or absence of cracks in the ceramics substrate was confirmed.

Figure 24A:
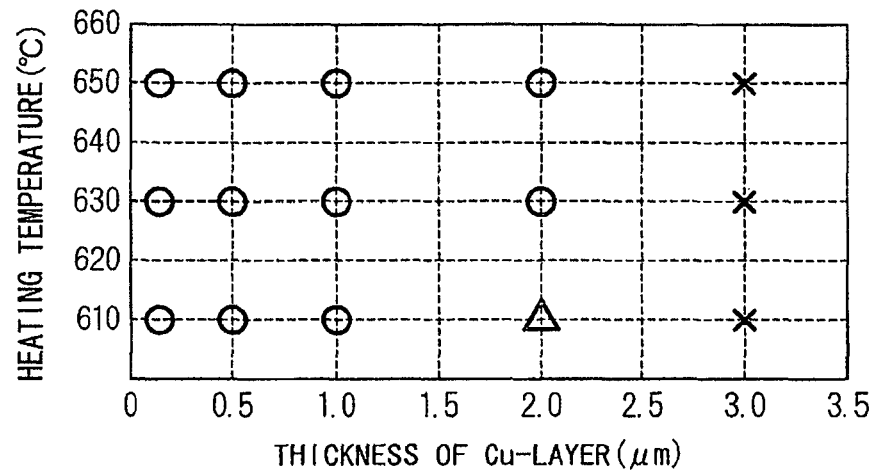
FIGS. 24A and 24B are diagrams showing an evaluation result of cracking in a ceramics substrate in a fourth example.

An evaluation result of the power module substrate that is obtained by evaporating and adhering Cu to the ceramics substrate is shown in FIG. 24A.

Figure 24B:
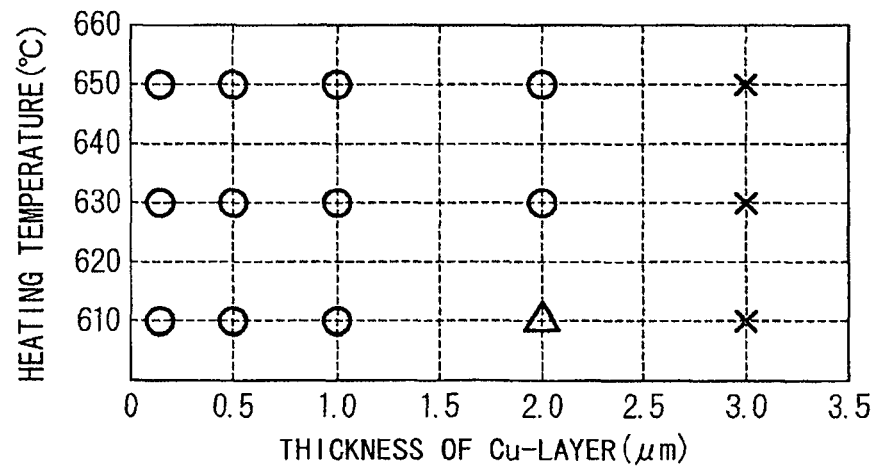

In addition, an evaluation result of the power module substrate that is obtained by evaporating and adhering Cu to the metal plate is shown in FIG. 24B.

In addition, the power module substrate is represented by the symbol "○", in which cracks were not generated in the ceramics substrate in both two test pieces, the power module substrate is presented by the symbol "Δ", in which cracks were generated in the ceramics substrate in one of two test pieces, and the power module substrate is represented by the symbol "X", in which cracks were generated in the ceramics substrate in both two test pieces.

In addition, the junction rate of a total of thirty kinds of test pieces was determined after the 3000 heat-load cycles described above were performed.

Specifically, by the same method as the above-described method in which the ultrasonic imaging device was used, the junction rate between a ceramics substrate and a metal plate, that is, the junction rate after the 3000 heat-load cycles were performed, was determined.

As a result, evaluation results of the power module substrate were obtained.

Figure 25A:
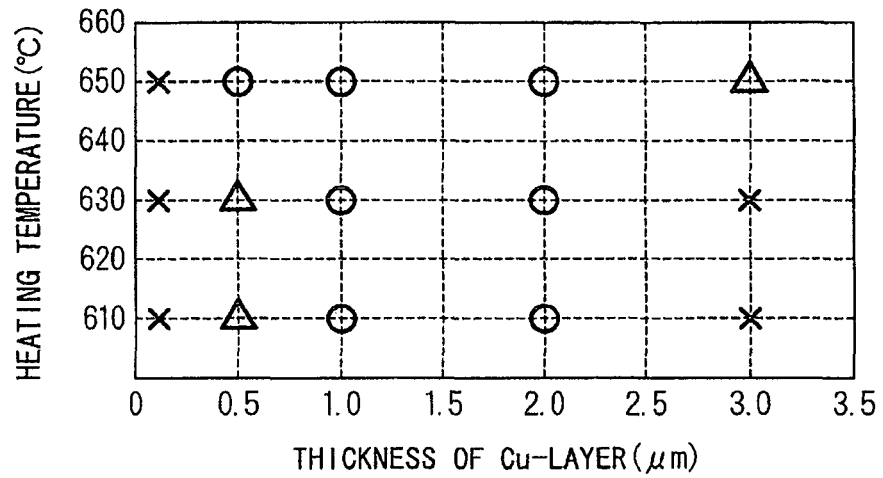
FIGS. 25A and 25B are diagrams showing an evaluation result of junction reliability in the fourth example.

An evaluation result of the power module substrate that is obtained by evaporating and adhering Cu to the ceramics substrate is shown in FIG. 25A.

Figure 25B:
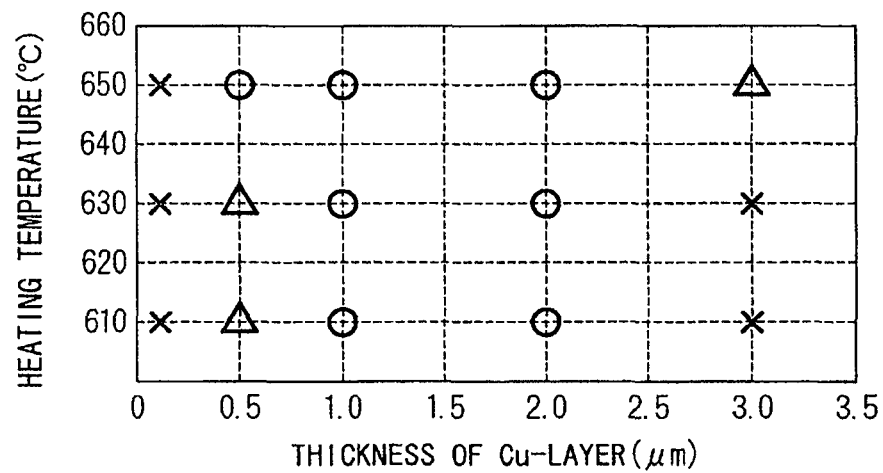

In addition, an evaluation result of the power module substrate that is obtained by evaporating and adhering Cu to the metal plate is shown in FIG. 25B.

In addition, in FIG. 25B, the power module substrate is represented by the symbol "○", in which the junction rate is 85% or more after the power module substrate is subjected to a 3000 cyclical thermal load; the power module substrate is represented by the symbol "Δ", in which the junction rate is greater than or equal to 70% and less than 85% after the power module substrate is subjected to a 3000 cyclical thermal load; and the power module substrate is represented by the symbol "X", in which the junction rate is less than 70% after the power module substrate is subjected to a 3000 cyclical thermal load.

As shown in FIGS. 25A and 25B, it was confirmed that, as the thickness of Cu formed in a Cu-adhering step increases, cracks in the ceramics substrate composed of $Al_2O_3$ are easily generated.

In addition, in the test piece in which the thickness of Cu is 2 μm, it was confirmed that, as the heating temperature increases, cracks in the ceramics are suppressed more.

In addition, as shown in FIGS. 25A and 25B, it was confirmed that, as the heating temperature increases, the junction reliability was improved.

In addition, in the case where the thickness of Cu is approximately 1 μm, even if the heating temperature is low, it was confirmed that the junction reliability was improved.

According to the test result, in the ceramics substrate composed of $Al_2O_3$, it is confirmed that the thickness of Cu existing at the boundary face between the metal plate and the ceramics substrate is preferably less than or equal to 2.5 μm at the time of connecting.

Example 5

In the examples 5 and 6 described below, with reference to FIG. 34 and Table 1, the results of confirmatory experiments which were performed in order to confirm the effectivity of the power module substrate of the fifth and sixth embodiments are described.

Figure 34:
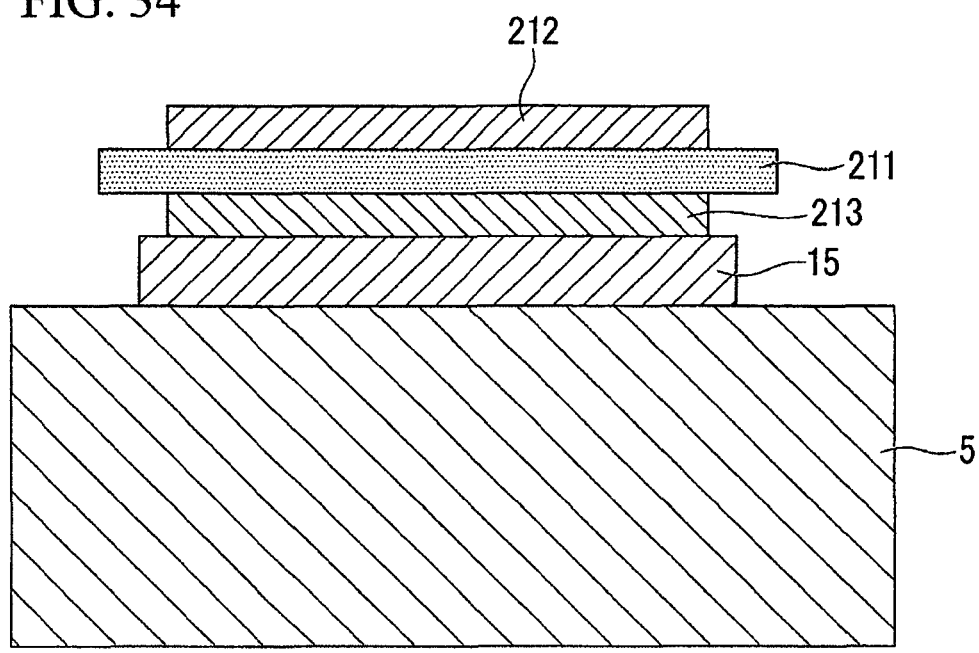
FIG. 34 is a cross-sectional view showing a power module substrate used for a comparison experiment.

As shown in FIG. 34, confirmatory experiment was performed by use of a power module substrate having: a ceramics substrate 211 composed of AlN having a thickness of 0.635 mm; a circuit layer 212 composed of 4N aluminum having a thickness of 0.6 mm; a metal layer 213 composed of 4N aluminum having a thickness of 0.6 mm; a top panel section 5 composed of an aluminum alloy (A6063) having a thickness of 5 mm; and a buffer layer 15 composed of 4N aluminum having a thickness of 1.0 mm, as common power module substrates in the comparative example and example 5.

In example 5, metal plates that become the circuit layer 212 and the metal layer 213 were connected to the ceramics substrate 211 by use of an Al—Si system brazing filler metal, after Cu was adhered to the surface of the ceramics substrate 211 by a sputtering.

In contrast, in the comparative example, Cu was not introduced into the joint interfaces between the ceramics substrate 211 and the metal plates, and the metal plates that become the circuit layer 212 and the metal layer 213 were connected to the ceramics substrate 211 by use of an Al—Si system brazing filler metal.

Consequently, a test piece of example 5 and a test piece of the comparative example were prepared.

Subsequently, before the test pieces being subjected to a heat-load cycle test, the percentage of connected-surface area (junction rate) in the joint interface between the ceramics substrate and the metal plate was determined.

As a method for calculating the junction rate, the method for calculating the junction rate by use of an ultrasonic imaging device (frequency of transducer is 15 MHz) was adopted as described in Example 1.

In addition, before a heat-load cycle test is performed, the junction rate between a ceramics substrate and a metal plate of the test piece of example 5 was 100%, and the junction rate between a ceramics substrate and a metal plate of the test piece of the comparative example was 99.8%.

Next, evaluation of the junction reliability by use of the test pieces was performed.

In the evaluation of the junction reliability, regarding the junction rate at which after heat-load cycles (−45° C. to 125° C.) were repeatedly performed, the comparative example was compared to example 5.

Specifically, by the same method as the above-described method in which the ultrasonic imaging device was used, junction rate between the ceramics substrate and the metal plate in the comparative example and example 5 was determined.

Furthermore, the junction rates were determined after each of heat-load cycles of 1000 times, 2000 times, and 3000 times is performed.

Consequently, the evaluation result of the power module substrate was obtained.

The evaluation result was shown in Table 1.

TABLE 1

| | INTRODUCING OF Cu INTO JOINT INTERFACE | JUNCTION RATE AFTER BEING SUBJECTED TO HEAT-LOAD CYCLE | | |
|---|---|---|---|---|
| | | 1000 TIMES | 2000 TIMES | 3000 TIMES |
| EXAMPLE 5 | PRESENCE | 100% | 100% | 99.2% |
| COMPARATIVE EXAMPLE | ABSENCE | 99.8% | 94.2% | 91.5% |

In the comparative example, in which connection is performed by use of an Al—Si system brazing filler metal without introducing Cu into the joint interface, the junction rate was near 100% (99.8%) after 1000 heat-load cycles.

However, it was confirmed that the junction rate decreases after 2000 heat-load cycles (94.2%), and the junction rate decreased to 91.5% after the 3000 heat-load cycles.

On the other hand, in example 5, in which Cu was introduced into the joint interface, even if the heat-load cycles were performed 2000 times, the junction rate did not decrease.

The junction rate was 99.2% after the 3000 heat-load cycles.

According to the confirmatory experiment, it was confirmed that the heat-load cycle reliability is improved by introducing Cu into the joint interface.

Example 6

Subsequently, assay result of component of the metal layer in the power module substrates of the fifth and sixth embodiments is described.

The circuit layer 212 composed of 4N aluminum having a thickness of 0.6 mm and the metal layer 213 composed of 4N aluminum having a thickness of 0.6 mm were connected to the ceramics substrate 211 composed of AlN having a thickness of 0.635 mm, and the power module substrate was manufactured.

Here, in examples 6A to 6C, a Cu-layer having a thickness of 1.5 μm was formed on the surface of a brazing filler metal having Si including Al-7.5 wt %, and the circuit layer 212 and the metal layer 213 were connected to the ceramics substrate 211 by use of the brazing filler metal having Si including Al-7.5 wt %.

In addition, the connection temperatures were different from each other by three parameters (3 levels), and were 610° C., 630° C., and 650° C.

Here, in examples 6D to 6F, a Cu-layer having a thickness of 1.5 μm was formed on the surface of the ceramics substrate 211, and the circuit layer 212 and the metal layer 213 were connected to the ceramics substrate 211 by use of a brazing filler metal having Si including Al-7.5 wt %.

In addition, the connection temperatures were different from each other by three parameters (3 levels), and were 610° C., 630° C., and 650° C.

Regarding the examples 6A to 6F, quantitative analysis was performed for the Cu concentration and the Si concentration by use of EPMA, at a center portion in a width direction of the boundary face between the metal layer and the ceramics substrate, and at the end portion in the width direction of the boundary face.

The result was shown in Table 2.

According to the result of quantitative analysis, in the case where the Cu-layer was formed and the ceramics substrate was connected to the metal plate by use of an Al—Si system brazing filler metal, it was confirmed that the Si concentration of the portion which is close to the joint interface is 0.05 to 0.5 wt % and the Cu concentration thereof was in the range of 0.05 to 1.0 wt % at the center portion of the width direction.

In addition, it is confirmed that Si and Cu exist at the end portion in the width direction with a high level of concentration.

What is claimed is:

1. A power module substrate comprising:
a ceramics substrate composed of AlN or $Si_3N_4$, having a surface;
a metal plate connected to the surface of the ceramics substrate, composed of pure aluminum; and
a high-Cu concentration section formed at a joint interface between the metal plate and the ceramics substrate, having a Cu concentration that is more than twice the Cu concentration in the metal plate.

2. The power module substrate according to claim 1, wherein
an oxygen concentration in the high-Cu concentration section is greater than oxygen concentrations in the metal plate and the ceramics substrate.

3. The power module substrate according to claim 1, wherein
the ceramics substrate is composed of AlN; and
a mass ratio of Al, Cu, O, and N is Al:Cu:O:N=50 to 90 wt %:1 to 10 wt %:2 to 20 wt %:25 wt % or less when the joint interface including the high-Cu concentration section is analyzed by an energy dispersive X-ray spectroscopy.

4. The power module substrate according to claim 1, wherein
the ceramics substrate is composed of $Si_3N_4$; and
a mass ratio of Al, Si, Cu, O, and N is Al:Si:Cu:O:N=15 to 45 wt %:15 to 45 wt %:1 to 10 wt %:2 to 20 wt %:25 wt % or less when the joint interface including the high-Cu concentration section is analyzed by an energy dispersive X-ray spectroscopy.

5. A power module comprising:
a power module substrate according to claim 1; and
an electronic component mounted on the power module substrate.

6. A method for manufacturing a power module substrate, comprising:
preparing a ceramics substrate composed of AlN, a metal plate composed of pure aluminum, and a Cu-layer having a thickness of 0.15 μm to 3 μm;

TABLE 2

|  | | Si (wt %) | | Cu (wt %) | |
| --- | --- | --- | --- | --- | --- |
|  | CONNECTION TEMPERATURE (° C.) | CENTER PORTION | END PORTION | CENTER PORTION | END PORTION |
| EXAMPLE 6A | 610 | 0.084 | 1.091 | 0.481 | 0.943 |
| EXAMPLE 6B | 630 | 0.113 | 1.455 | 0.457 | 0.854 |
| EXAMPLE 6C | 650 | 0.106 | 1.243 | 0.418 | 0.933 |
| EXAMPLE 6D | 610 | 0.102 | 1.314 | 0.634 | 1.066 |
| EXAMPLE 6E | 630 | 0.108 | 1.257 | 0.370 | 1.043 |
| EXAMPLE 6F | 650 | 0.087 | 1.066 | 0.355 | 1.320 | stacking the ceramics substrate and the metal plate in layers with the Cu-layer interposed therebetween;

pressing the ceramics substrate, the Cu-layer, and the metal plate which were stacked in layers in a stacked direction, and heating the ceramics substrate, the Cu-layer, and the metal plate;

forming a fusion aluminum layer at a boundary face between the ceramics substrate and the metal plate;

solidifying the fusion aluminum layer by cooling the fusion aluminum layer; and forming a high-Cu concentration section at a joint interface between the ceramics substrate and the metal plate, the high-Cu concentration section having a Cu concentration that is more than twice the Cu concentration in the metal plate.

7. The method for manufacturing a power module substrate according to claim 6, wherein
when stacking the ceramics substrate and the metal plate in layers with the Cu-layer interposed therebetween, the Cu-layer is disposed by inserting a copper foil between the ceramics substrate and the metal plate.

8. The method for manufacturing a power module substrate according to claim 6, wherein
the Cu-layer is adhered to at least one of the ceramics substrate and the metal plate before stacking the ceramics substrate, the Cu-layer, and the metal plate in layers.

9. The method for manufacturing a power module substrate according to claim 8, wherein
when the Cu is adhered to at least one of the ceramics substrate and the metal plate, Cu is adhered to at least one of the ceramics substrate and the metal plate, by a method selected from the group consisting of an evaporation method, a sputtering method, a plating method, and a method of applying a Cu-paste.

10. A method for manufacturing a power module substrate, comprising:
preparing a ceramics substrate composed of $Si_3N_4$, a metal plate composed of pure aluminum, and a Cu-layer having a thickness of 0.15 μm to 3 μm;

stacking the ceramics substrate and the metal plate in layers with the Cu-layer interposed therebetween;

pressing the ceramics substrate, the Cu-layer, and the metal plate which were stacked in layers in a stacked direction, and heating the ceramics substrate, the Cu-layer, and the metal plate;

forming a fusion aluminum layer at a boundary face between the ceramics substrate and the metal plate;

solidifying the fusion aluminum layer by cooling the fusion aluminum layer; and forming a high-Cu concentration section at a joint interface between the ceramics substrate and the metal plate, the high-Cu concentration section having a Cu concentration that is more than twice the Cu concentration in the metal plate.

11. The method for manufacturing a power module substrate according to claim 10, wherein
when stacking the ceramics substrate and the metal plate in layers with the Cu-layer interposed therebetween, the Cu-layer is disposed by inserting a copper foil between the ceramics substrate and the metal plate.

12. The method for manufacturing a power module substrate according to claim 10, wherein
the Cu-layer is adhered to at least one of the ceramics substrate and the metal plate before stacking the ceramics substrate, the Cu-layer, and the metal plate in layers.

13. The method for manufacturing a power module substrate according to claim 12, wherein
when the Cu is adhered to at least one of the ceramics substrate and the metal plate, Cu is adhered to at least one of the ceramics substrate and the metal plate, by a method selected from the group consisting of an evaporation method, a sputtering method, a plating method, and a method of applying a Cu-paste.

14. A power module substrate comprising:
a ceramics substrate composed of $Al_2O_3$, having a surface;
a metal plate connected to the surface of the ceramics substrate, composed of pure aluminum; and
a high-Cu concentration section formed at a joint interface between the metal plate and the ceramics substrate, having a Cu concentration that is more than twice the Cu concentration in the metal plate.

15. The power module substrate according to claim 14, wherein
a mass ratio of Al, Cu, and O is Al:Cu:O=50 to 90 wt %:1 to 10 wt %:0 to 45 wt % when the joint interface including the high-Cu concentration section is analyzed by an energy dispersive X-ray spectroscopy.

16. A power module comprising:
a power module substrate according to claim 14; and
an electronic component mounted on the power module substrate.

17. A method for manufacturing a power module substrate, comprising:
preparing a ceramics substrate composed of $Al_2O_3$, a metal plate composed of pure aluminum, and a Cu-layer having a thickness of 0.15 μm to 3 μm;

stacking the ceramics substrate and the metal plate in layers with the Cu-layer interposed therebetween;

pressing the ceramics substrate, the Cu-layer, and the metal plate which were stacked in layers in a stacked direction, and heating the ceramics substrate, the Cu-layer, and the metal plate;

forming a fusion aluminum layer at a boundary face between the ceramics substrate and the metal plate;

solidifying the fusion aluminum layer by cooling the fusion aluminum layer; and forming a high-Cu concentration section at a joint interface between the ceramics substrate and the metal plate, the high-Cu concentration section having a Cu concentration that is more than twice the Cu concentration in the metal plate.

18. The method for manufacturing a power module substrate according to claim 17, wherein
when stacking the ceramics substrate and the metal plate in layers with the Cu-layer interposed therebetween, the Cu-layer is disposed by inserting a copper foil between the ceramics substrate and the metal plate.

19. The method for manufacturing a power module substrate according to claim 17, wherein
the Cu-layer is adhered to at least one of the ceramics substrate and the metal plate before stacking the ceramics substrate, the Cu-layer, and the metal plate in layers.

20. The method for manufacturing a power module substrate according to claim 19, wherein
when the Cu is adhered to at least one of the ceramics substrate and the metal plate, Cu is adhered to at least one of the ceramics substrate and the metal plate, by a method selected from the group consisting of an evaporation method, a sputtering method, a plating method, and a method of applying a Cu-paste.

* * * * *